(12) United States Patent
Kodama et al.

(10) Patent No.: US 7,674,987 B2
(45) Date of Patent: Mar. 9, 2010

(54) MULTILAYER PRINTED CIRCUIT BOARD

(75) Inventors: Hiroaki Kodama, Ibi-gun (JP);
Kazuhito Yamada, Ibi-gun (JP)

(73) Assignee: Ibiden Co., Ltd., Ogaki-shi (JP)

( * ) Notice: Subject to any disclaimer, the term of this patent is extended or adjusted under 35 U.S.C. 154(b) by 228 days.

(21) Appl. No.: 11/693,188

(22) Filed: Mar. 29, 2007

(65) Prior Publication Data

US 2008/0236876 A1    Oct. 2, 2008

(51) Int. Cl.
H05K 1/16    (2006.01)
(52) U.S. Cl. ..................... 174/260; 361/760
(58) Field of Classification Search ........... 174/260; 385/14; 361/760, 793
See application file for complete search history.

(56) References Cited

U.S. PATENT DOCUMENTS

| | | | |
|---|---|---|---|
| 6,330,377 B1 * | 12/2001 | Kosemura | 385/14 |
| 6,661,939 B2 * | 12/2003 | Kaneko et al. | 385/14 |
| 6,788,874 B1 * | 9/2004 | Ishikawa et al. | 385/141 |
| 7,070,207 B2 | 7/2006 | Asai | |
| 2004/0118602 A1 * | 6/2004 | Lee et al. | 174/260 |
| 2005/0185880 A1 | 8/2005 | Asai | |
| 2006/0012967 A1 * | 1/2006 | Asai et al. | 361/764 |
| 2006/0263003 A1 | 11/2006 | Asai et al. | |

FOREIGN PATENT DOCUMENTS

| | | |
|---|---|---|
| JP | 2002-329891 | 11/2002 |
| JP | 20022331532 | * 11/2002 |
| JP | 2006-93618 | 4/2006 |

OTHER PUBLICATIONS

U.S. Appl. No. 11/623,923, filed Jan. 17, 2007, Kodama et al.
U.S. Appl. No. 11/696,436, filed Apr. 4, 2007, Kodama et al.
U.S. Appl. No. 11/696,434, filed Apr. 4, 2007, Kodama et al.
U.S. Appl. No. 11/733,361, filed Apr. 10, 2007, Asai et al.
U.S. Appl. No. 11/737,792, filed Apr. 20, 2007, Asai et al.
U.S. Appl. No. 11/750,625, filed May 18, 2007, Yamada et al.
U.S. Appl. No. 11/763,670, filed Jun. 15, 2007, Kodama et al.

* cited by examiner

*Primary Examiner*—Jinhee J Lee
*Assistant Examiner*—Yuriy Semenenko
(74) *Attorney, Agent, or Firm*—Oblon, Spivak, McClelland, Maier & Neustadt, L.L.P.

(57) ABSTRACT

The multilayer printed circuit board according to the present invention is a multilayer printed circuit board, in which conductor circuits and insulating layers are formed and layered, an optical path for transmitting an optical signal comprising a resin composite is formed, and conductor circuits are formed on an outermost insulating layer. Herein, an end portion of the above described optical path for transmitting an optical signal protrudes from the surface of the outermost insulating layer.

36 Claims, 23 Drawing Sheets

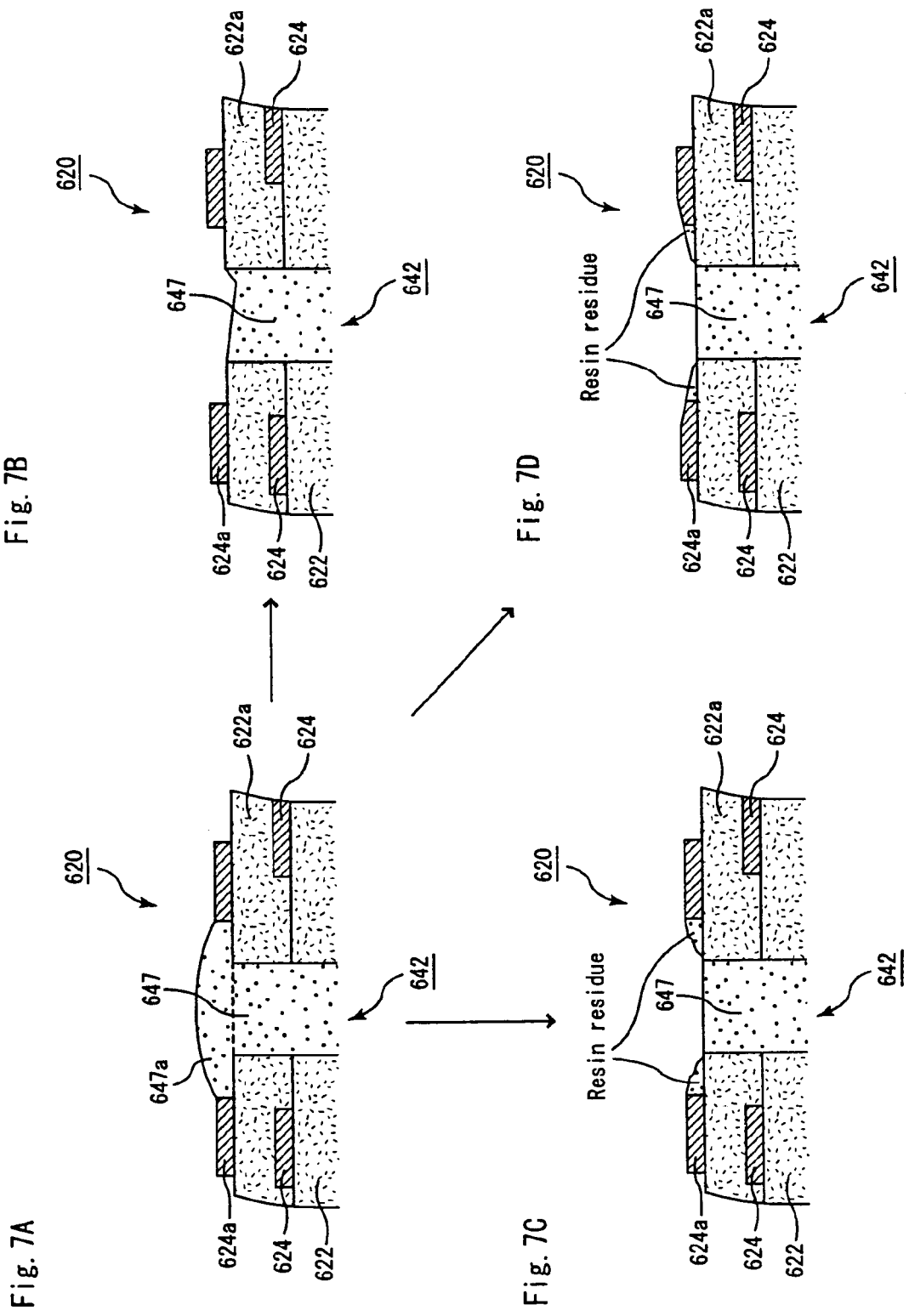

Fig. 22A
Fig. 22B
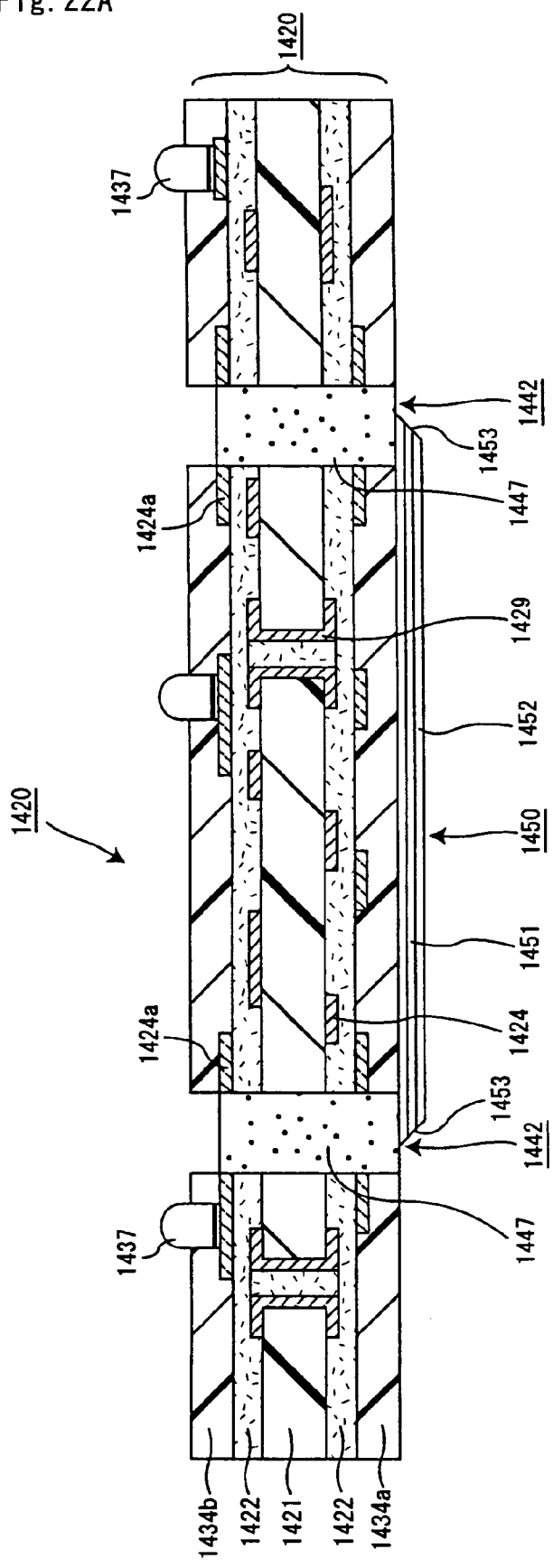
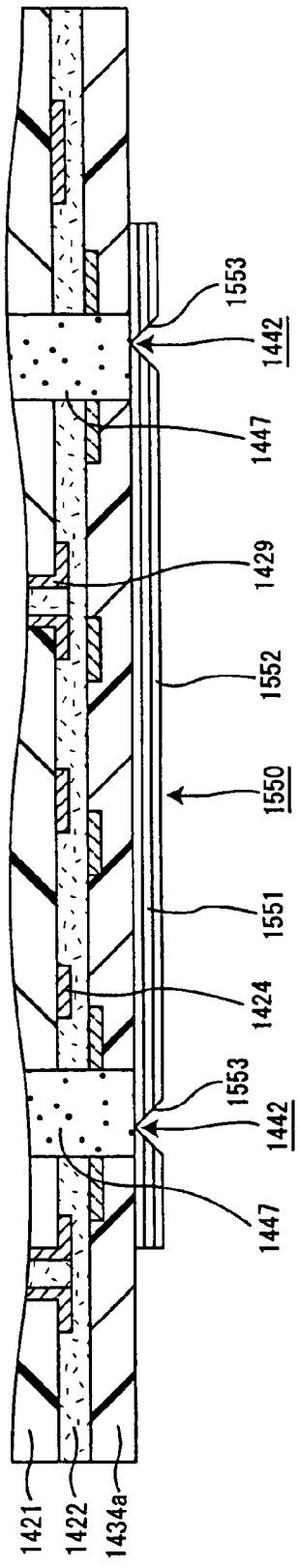

MULTILAYER PRINTED CIRCUIT BOARD

CROSS-REFERENCE TO RELATED APPLICATIONS

This application relates to JP-A 2006-93618 published on Apr. 6, 2006. The contents of this application are incorporated herein by reference in their entirety.

BACKGROUND OF THE INVENTION

1. Field of the Invention

The present invention relates to a multilayer printed circuit board.

2. Discussion of the Background

In recent years, optical fibers have been drawing attention as the center of the field of communications. In particular, communication technology using optical fibers has become necessary in the field of IT (information technology), for the development of high-speed Internet networks.

Then, it has been proposed for such network communication, including the Internet, that optical communication using optical fibers be used for communication between a basic network and terminal apparatuses (personal computers, mobile apparatuses, games and the like) and communication between terminal apparatuses, in addition to communication in a basic network.

The present applicant has previously proposed a substrate for mounting an IC chip where conductor circuits and insulating layers are formed and layered on both sides of a substrate, solder resist layers are formed as outermost layers, an optical element is mounted, and an optical path for transmitting an optical signal is formed so as to penetrate through this substrate for mounting an IC chip as a substrate for mounting an IC chip that can be used in a terminal apparatus for an optical transmitter receiver system as that described above (see for example JP-A 2002-329891).

The contents of JP-A 2002-329891 are incorporated herein by reference in their entirety.

SUMMARY OF THE INVENTION

The multilayer printed circuit board according to the first aspect of the present invention is a multilayer printed circuit board, where conductor circuits and insulating layers are formed and layered, an optical path for transmitting an optical signal comprising a resin composite is formed, and furthermore, a conductor circuit is formed on an outermost insulating layer, wherein an end portion of the above described optical path for transmitting an optical signal protrudes from the surface of the outermost insulating layer.

In a multilayer printed circuit board according to the first aspect of the present invention, at least part of the conductor circuits which are formed on the above described outermost insulating layer are desirably formed in the vicinity of the above described optical path for transmitting an optical signal.

In addition, in the above described multilayer printed circuit board, portions of sides of the conductor circuits which are formed in the vicinity of the above described optical path for transmitting an optical signal desirably make contact with the portion where the above described optical path for transmitting an optical signal protrudes from the surface of the above described outermost insulating layer.

In addition, in this case, conductor layers are desirably formed on the wall surface of the above described optical path for transmitting an optical signal, and the above described conductor layers and conductor circuits which are formed in the vicinity of the above described optical path for transmitting an optical signal are desirably connected electrically.

In addition, in a multilayer printed circuit board according to the first aspect of the present invention, the conductor circuit which is formed on the above described outermost insulating layer desirably has the same height as the portion where the above described optical path for transmitting an optical signal protrudes from the surface of the above described outermost insulating layer. The above described optical path for transmitting an optical signal and the above described conductor circuit are desirably formed in such a position that sides of both do not make contact with each other.

The distance between the above described optical path for transmitting an optical signal and the above described conductor circuit is desirably at least about 25 µm and at most about 50 µm, and a conductor circuit which is formed on the above described outermost insulating layer desirably has the same height as the portion which protrudes from the surface of the above described outermost insulating layer.

In the multilayer printed circuit board according to the first aspect of present invention, a conductor circuit which is formed on the above described outermost insulating layer desirably comprises two metal layers, and the lower layer side of the above described two metal layers desirably has the same height as the portion where the above described optical path for transmitting an optical signal protrudes from the surface of the above described outermost insulating layer.

In the multilayer printed circuit board according to the first aspect of present invention, a conductor circuit which is formed on the above described outermost insulating layer and in the vicinity of the above described optical path for transmitting an optical signal is desirably part of a power supply pattern or a ground pattern.

In the multilayer printed circuit board according to the second aspect of the present invention, conductor circuits and insulating layers are formed and layered, an optical path for transmitting an optical signal comprising a resin composite is formed, and furthermore, a conductor circuit is formed on an outermost insulating layer.

Wherein a solder resist layer is formed as an outermost layer, and an end portion of the above described optical path for transmitting an optical signal protrudes from the surface of an outermost insulating layer.

In the multilayer printed circuit board according to the second aspect of the present invention, the transmittance of light having a wavelength for communication in the above described solder resist layer with a thickness of 30 µm is desirably about 60% or more, and the index of refraction of the above described solder resist layer is desirably approximately the same as the index of refraction of a resin composite which forms an optical path for transmitting an optical signal.

In the multilayer printed circuit board according to the second aspect of the present invention, the above described solder resist layer desirably has a thickness of at least about 10 µm and at most 40 µm, and an end portion of the above described optical path for transmitting an optical signal and the surface of the above described solder resist layer are desirably made in the same plane, and a conductor circuit made of a dummy conductor circuit is desirably formed in the vicinity of the above described optical path for transmitting an optical signal.

In the multilayer printed circuit board according to the second aspect of the present invention, a conductive circuit is desirably formed in the vicinity of the above described optical path for transmitting an optical signal, and an electrode pad for mounting an optical element on part thereof is desirably formed.

In the multilayer printed circuit board according to the second aspect of the present invention, the above described optical path for transmitting an optical signal desirably has a collective through hole structure or an individual through hole structure, and the above described multilayer printed circuit board desirably functions as a package substrate and as a substrate for a motherboard.

In the multilayer printed circuit board according to the third aspect of the present invention, conductor circuits and insulating layers are formed and layered, an optical path for transmitting an optical signal comprising a resin composite is formed, and furthermore, a conductor circuit is formed on an outermost insulating layer, wherein an end portion of the above described optical path for transmitting an optical signal protrudes from the surface of an outermost insulating layer, and a micro lens is provided on the above described solder resist layer.

In the multilayer printed circuit board according to the third aspect of the present invention, the above described optical path for transmitting an optical signal is desirably formed so as to penetrate through the above described substrate and the above described insulating layer, and a solder resist layer is desirably formed on the above described outermost insulating layer, and the above described micro lens is desirably provided on the above described solder resist layer.

In the multilayer printed circuit board according to the third aspect of the present invention, a solder resist layer is desirably formed on the above described outermost insulating layer, an optical path is desirably provided on the above described solder resist layer, and the above described micro lens is desirably provided inside openings for optical paths.

In the multilayer printed circuit board according to the third aspect of the present invention, the transmittance of light having a wavelength for communication in the above described micro lens with a thickness of 1 mm is desirably about 70% or more, and particles are desirably mixed into the above described micro lens.

In the multilayer printed circuit board according to the third aspect of the present invention, the particle diameter of the above described particles is desirably at least about 0.01 µm and at most about 0.8 µm, and the amount of particles mixed in is desirably at least about 5% by weight and at most about 60% by weight, and the above described micro lens is desirably provided directly or by interposing an optical adhesive.

In the multilayer printed circuit board according to the third aspect of the present invention, a surface treatment is desirably carried out on the region where the above described micro lens is provided, and the above described micro lens is desirably provided by using a lens marker.

In the multilayer printed circuit board according to the fourth aspect of the present invention, conductor circuits and insulating layers are formed and layered, an optical path for transmitting an optical signal comprising a resin composite is formed, and furthermore, a conductor circuit is formed on an outermost insulating layer, wherein an end portion of the above described optical path for transmitting an optical signal protrudes from the surface of an outermost insulating layer, and an optical waveguide is formed thereon, and the multi-player printed circuit board is used as a substrate for a motherboard.

In the multilayer printed circuit board according to the fourth aspect of the present invention, the above described optical waveguide is desirably an organic-based optical waveguide, and particles are desirably mixed into the above described organic-based optical waveguide.

In the multilayer printed circuit board according to the fourth aspect of the present invention, the particle diameter of the above described particles is desirably at least about 0.01 µm and at most about 0.8 µm, and the amount of particles mixed in is desirably at least about 10% by weight and at most about 80% by weight.

In the multilayer printed circuit board according to the fourth aspect of the present invention, the above described optical waveguide is desirably formed of a core portion and a clad portion, and particles are desirably mixed into only the above described clad portion, and an optical conversion mirror is desirably formed in the above described optical waveguide.

In the multilayer printed circuit board according to the fourth aspect of the present invention, the above described optical waveguide is desirably formed on the entirety or part of the above described insulating layer, and a solder resist layer is desirably formed as an outermost layer, and the above described optical waveguide is desirably formed on the entirety or part of the above described solder resist layer.

The multilayer printed circuit board according to the second to fourth aspects of the present invention further limits the multilayer printed circuit board according to the first aspect of the present invention, and these four inventions are essentially one invention; thus, hereinafter, the multilayer printed circuit board is described without distinguishing the first to fourth aspects of the present inventions.

BRIEF DESCRIPTION OF THE DRAWINGS

FIGS. 7A to 7D are partial cross sectional views schematically illustrating the vicinity of an end portion of the optical path for transmitting an optical signal which is formed in the conventional substrate for mounting an IC chip (multilayer printed circuit board).

FIGS. 22A and 22B are cross-sectional views schematically illustrating another example of a multilayer printed circuit board according to one embodiment functioning as a substrate for a motherboard;

DESCRIPTION OF THE EMBODIMENTS

A multilayer printed circuit board according to the embodiments of the present invention is a multilayer printed circuit board, where conductor circuits and insulating layers are formed and layered, an optical path for transmitting an optical signal comprising a resin composite is formed, and furthermore, a conductor circuit is formed on an outermost insulating layer, wherein an end portion of the optical path for transmitting an optical signal protrudes from the surface of the outermost insulating layer.

In a multilayer printed circuit board according to the embodiments of the present invention, since an optical path for transmitting an optical signal comprising a resin composite is formed and an end portion of this optical path for transmitting an optical signal protrudes from the surface of an outermost insulating layer, the transmission performance of an optical signal is excellent, resulting in excellent electric reliability.

In addition, in the multilayer printed circuit board of according to the embodiments of the present invention, it is necessary for conductor circuits and insulating layers to be formed, the invention can be implemented in a printed circuit board with a base substrate and a (coreless) printed circuit board without a base substrate, and it is not always necessary for conductor circuits and insulating layers to be formed on both sides of a substrate. In the following description, focusing on the embodiment in which conductor circuits and insulating layers are formed on both sides of a substrate, a multilayer printed circuit board according to the embodiments of the present invention is described.

Furthermore, in the multilayer printed circuit board according to the embodiments of the present invention, a solder resist layer does not always need to be formed, but since a solder resist layer is normally formed as an outermost layer on the multilayer printed circuit board, the multilayer printed circuit board according to the embodiments of the present invention is described in the following description focusing on the embodiment in which a solder resist layer is formed.

In the following, a multilayer printed circuit board according to the embodiments of the present invention is described in reference to the drawings.

FIGS. 1A to 1I are partial cross-sectional views schematically illustrating part of an example of a portion of a multilayer printed circuit board according to one embodiment of the present invention.

Figure 1A:
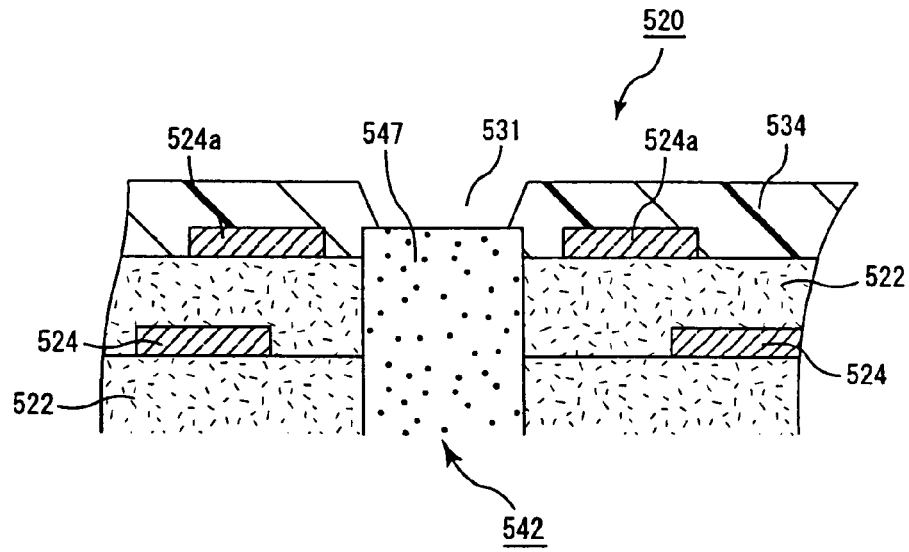
FIGS. 1A to 1I are partial cross-sectional views schematically illustrating part of a multilayer printed circuit board according to one embodiment of the present invention.

As illustrated in FIG. 1A, in a multilayer printed circuit board 520 of the present invention, an optical path for transmitting an optical signal 542 comprising a resin composite 547 is formed so as to penetrate through a substrate (not shown) and insulating layers 522, and at the same time, openings for optical paths 531 functioning as an optical path for transmitting an optical signal are formed in a solder resist layer 534. Here, the optical path for transmitting an optical signal 542 comprising a resin composite 547 is formed so that an end portion thereof protrudes from the surface of the outermost insulating layer 522.

That makes it unnecessary to eliminate the resin composite 547; the resin composite 547 and the insulating layer 522 tend not to be polished too much; scratches tend not to be created thereon; conductor circuits 524 tend not to be polished too much in the vicinity of a optical path for transmitting an optical signal 542; and the resin composite 547 tends not to remain on the insulating layer 522 and a conductor circuit 524a. In the multilayer printed circuit board 520, optical signals and electrical signals are more likely to be transmitted without fail.

Furthermore, waviness tends not to occur on the surface of the solder resist layer 534, the distance from the outermost insulating layer 522 to the surface of the solder resist layer 534 tends to be approximately the same on the entirety of the solder resist layer. One of the reasons is that an end portion of the optical path for transmitting an optical signal 542 protrudes from the surface of the outermost insulating layer 522, and another reason is that a conductor circuit of an outermost layer (hereinafter, simply referred to as an outermost conductor circuit) 524a is formed in the vicinity of the optical path for transmitting an optical signal 542.

In addition, openings for optical paths 531 which are formed on the solder resist layer 534 are, as illustrated in FIG. 1A, symmetrical in longitudinal section, and have a desired shape with no resin residue at its bottom. The reason why openings for optical paths in such a shape may be formed more easily is that no waviness is created in the solder resist layer.

In addition, separations (peeling) tend not to occur between the solder resist layer 534 and the conductor circuit 524a or the solder resist layer 534 and the insulating layer 522. This is because extra resin composite that may reduce the adhesive force between the solder resist layer 534 and the conductor circuit 524a or the solder resist layer 534 and the insulating layer 522 tends not to remain.

Figure 1B:
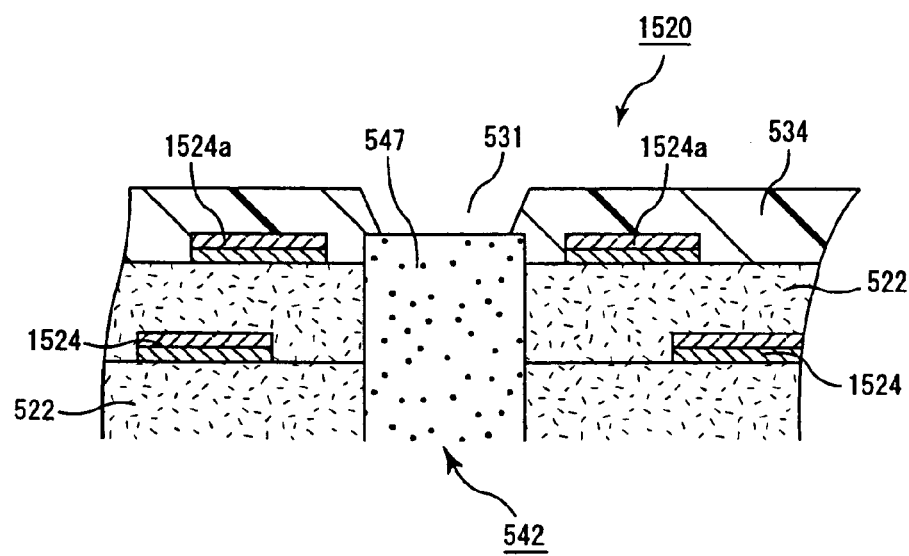

In addition, a multilayer printed circuit board 1520 illustrated in FIG. 1B has the same configuration as a multilayer printed circuit board 520 illustrated in FIG. 1A, except that the shape of conductor circuits 1524 (including an outermost conductor circuit 1524a) is different.

In the multilayer printed circuit board 1520, the conductor circuits 1524 (including outermost conductor circuits 1524a) comprising two metal layers are formed. In addition, an optical path for transmitting an optical signal 1542 is formed so as to protrude by the same height as the conductor circuits 1524a comprising two metal layers.

Also in a multilayer printed circuit board 1520 of this kind, the same effects that the multilayer printed circuit board 520 has, as illustrated in FIG. 1A, tend to be enjoyed.

Figure 1C:
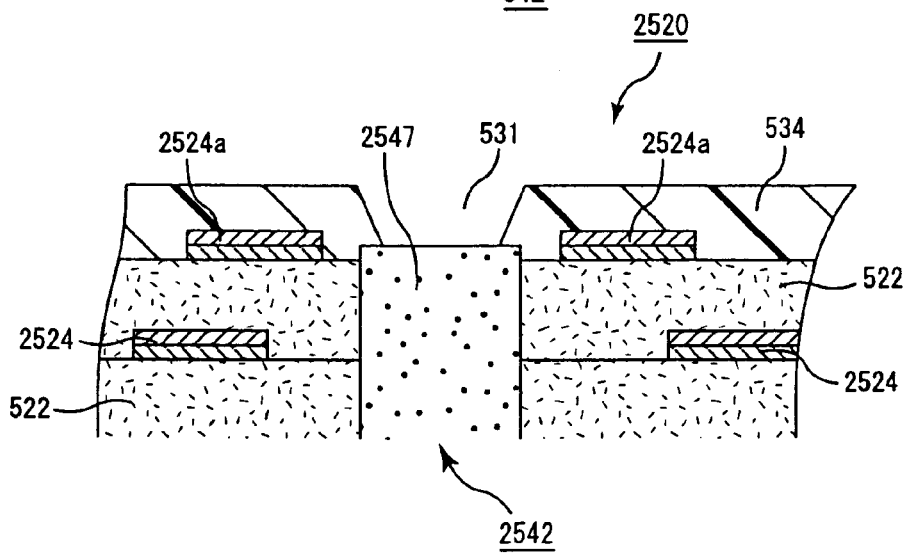

In addition, a multilayer printed circuit board 2520 illustrated in FIG. 1C has the same configuration as a multilayer printed circuit board 1520 illustrated in FIG. 1B, except that the shape of an optical path for transmitting an optical signal 2542 is different.

In the multilayer printed circuit board 2520, an end portion of the optical path for transmitting an optical signal 2542 (resin composite 2547) is formed so as to protrude from the surface of an outermost insulating layer 522 and so that the protruded portion of the optical path for transmitting an optical signal 2542 has the same height as the lower layer of conductor circuits 2524a comprising two metal layers.

Also in a multilayer printed circuit board 2520 of this kind, the same effects that a multilayer printed circuit board 520 has, as illustrated in FIG. 1A, tend to be enjoyed.

Figure 1D:
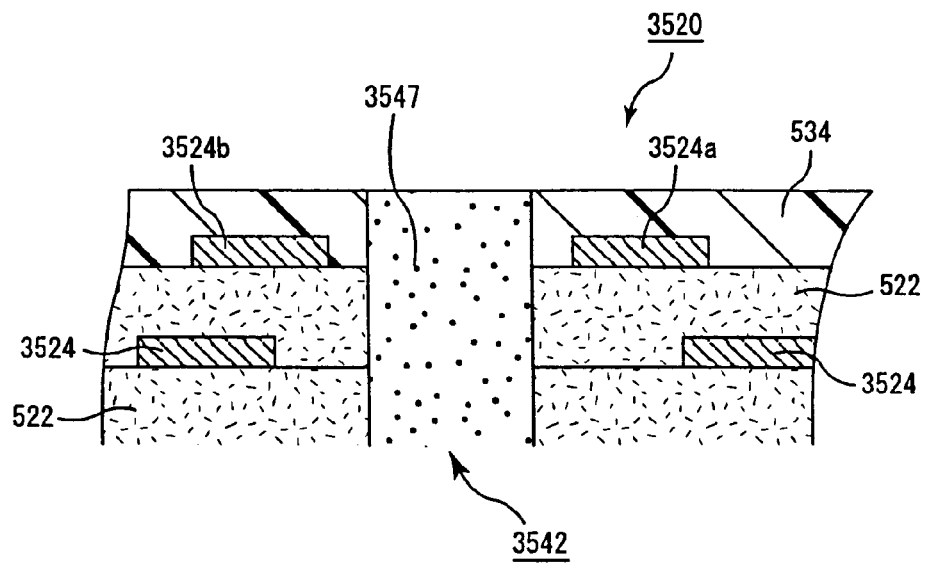

In addition, a multilayer printed circuit board 3520 illustrated in FIG. 1D has the same configuration as a multilayer printed circuit board 520 illustrated in FIG. 1A, except that the shape of an optical path for transmitting an optical signal 3542 is different.

With regard to the multilayer printed circuit board 3520, openings for optical paths are not formed in a solder resist layer 534, and an end portion of the optical path for transmitting an optical signal 3542 (resin composite 3547) and the surface of the solder resist layer 534 are made in the same plane.

Also in a multilayer printed circuit board 3520 of this kind, the same effects that a multilayer printed circuit board 520 has, as illustrated in FIG. 1A, tend to be enjoyed.

Figure 1E:
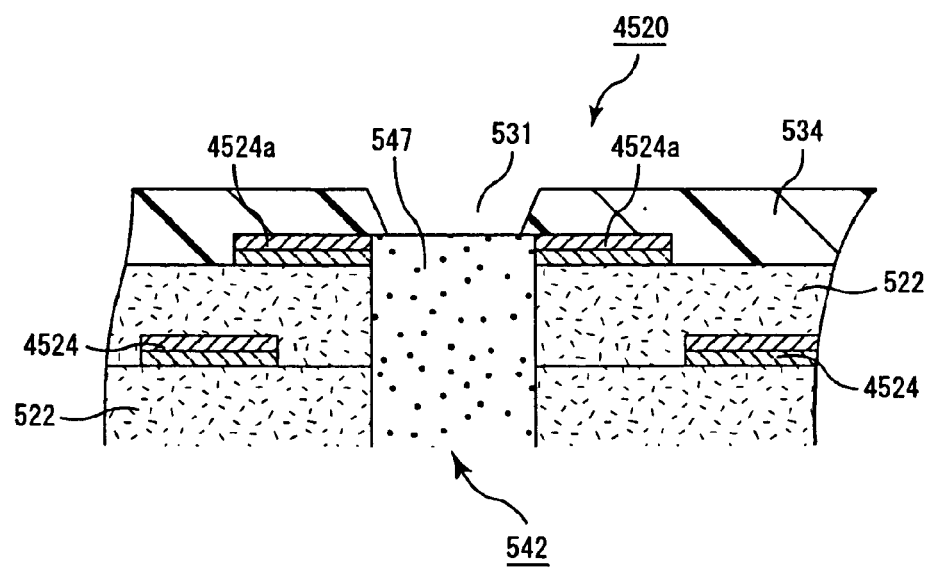

In addition, a multilayer printed circuit board 4520 illustrated in FIG. 1E has the same configuration as a multilayer printed circuit board 520 illustrated in FIG. 1A, except that the location for formation of the conductor circuits 4524a is different.

In the multilayer printed circuit board 4520, outermost conductor circuits 4524a are formed so that sides of the portion where an optical path for transmitting an optical signal 542 (resin composite 547) protrudes from an outermost insulating layer 522 make contact with sides of the conductor circuits 4524a.

Also in a multilayer printed circuit board 4520 of this kind, the same effects that a multilayer printed circuit board 520 has, as illustrated in FIG. 1A, tend to be enjoyed.

Figure 1F:
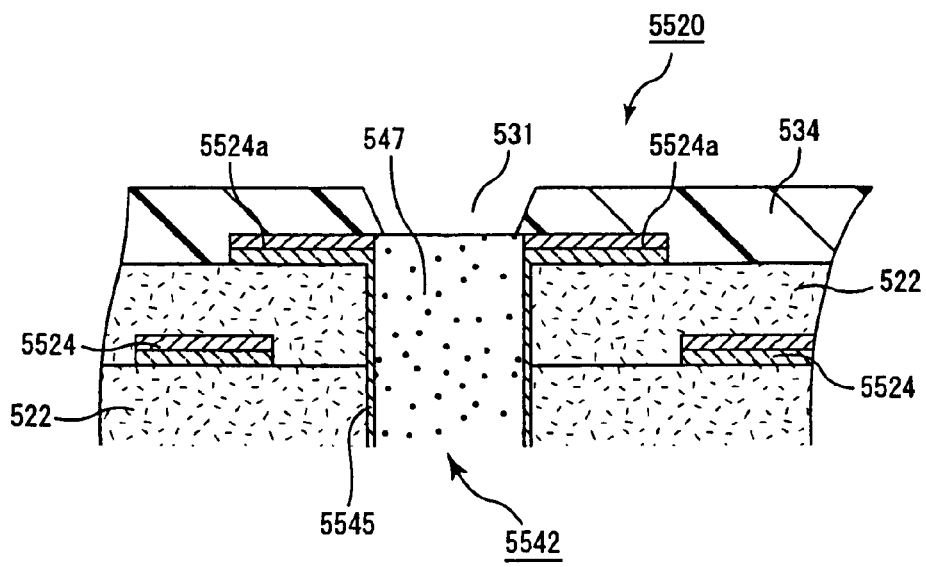

In addition, a multilayer printed circuit board 5520 illustrated in FIG. 1F has the same configuration as a multilayer printed circuit board 4520 illustrated in FIG. 1E, except that the shape of an optical path for transmitting an optical signal 5542 is different.

In the multilayer printed circuit board 5520, a conductor layer 5545 is formed on the wall surface of the optical path for transmitting an optical signal 5542, and the conductor layers 5545 are electrically connected to outermost conductor circuits 5524a.

Also in a multilayer printed circuit board 5520 of this kind, the same effects that a multilayer printed circuit board 520 has, as illustrated in FIG. 1A, tend to be enjoyed.

On top of that, the optical path for transmitting an optical signal is more likely to function as a through hole which electrically connect conductor circuits which sandwich a substrate and an insulating layer.

Figure 1G:
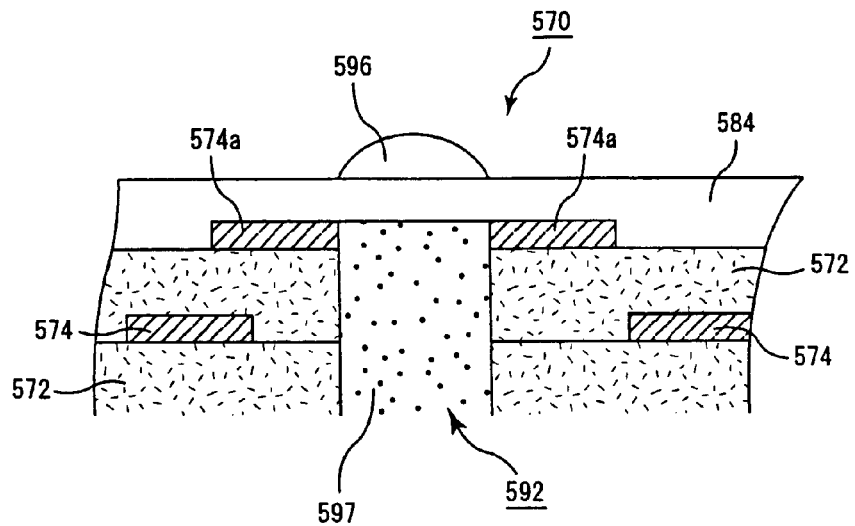

In addition, in a multilayer printed circuit board 570 of the present invention illustrated in FIG. 1G, an optical path for transmitting an optical signal 592 comprising a resin composite 597 is formed so as to penetrate through a substrate (not shown) and insulating layers 572, and a transparent solder resist layer 584 is formed as an outermost layer. In addition, a micro lens 596 is provided on top of the transparent solder resist layer 584. Here, the optical path for transmitting an optical signal 592 comprising the resin composite 597 is formed so that an end portion thereof penetrates from the surface of outermost insulating layers 572.

In addition, as shown in the multilayer printed circuit board 520 in FIG. 1A, the resin composite 597 and the insulating layer 572 tend not to be polished too much, scratches tend not to be created thereon, conductor circuits 574a tend not to be polished too much in the vicinity of the optical path for transmitting an optical signal 592, and the resin composite 597 tends not to remain on the insulating layer 572 and conductor circuits 574a. In the multilayer printed circuit board 570, optical signals and electrical signals are more likely to be transmitted.

Furthermore, waviness tends not to be created on the surface of this solder resist layer 584, the distance from the outermost insulating layer 572 to the surface of the solder resist layer 584 is approximately the same on the entirety of the solder resist layer. One of the reasons is that an end portion of the optical path for transmitting an optical signal 592 protrudes from the surface of an outermost insulating layer 572, and another reason is that outermost conductor circuits 574a are formed in the vicinity of the optical path for transmitting an optical signal 592.

In addition, a micro lens 596 which is provided on a solder resist layer 584 may be more easily provided on a predetermined portion without tilting. The reason why a micro lens of this kind tends to be provided is that waviness tends not to be created in a solder resist layer.

In addition, separations (peeling) tend not to occur between the solder resist layer 584 and the conductor circuits 574a or the insulating layer 572. This is because extra resin composite that reduces the adhesive force between the solder resist layer 584 and the conductor circuits 574a or the solder resist layer 584 and the insulating layer 572 tends not to remain.

Therefore, in a multilayer printed circuit board according to the embodiments of the present invention, in the case where an outermost solder resist layer is a transparent solder resist layer, when a micro lens is provided on top of a solder resist layer, for example, waviness tends not to be created on the solder resist layer, and thereby micro lenses tend not to tilt and optical signals may be transmitted more easily, resulting in an excellent transmission performance of an optical signal.

Figure 1H:
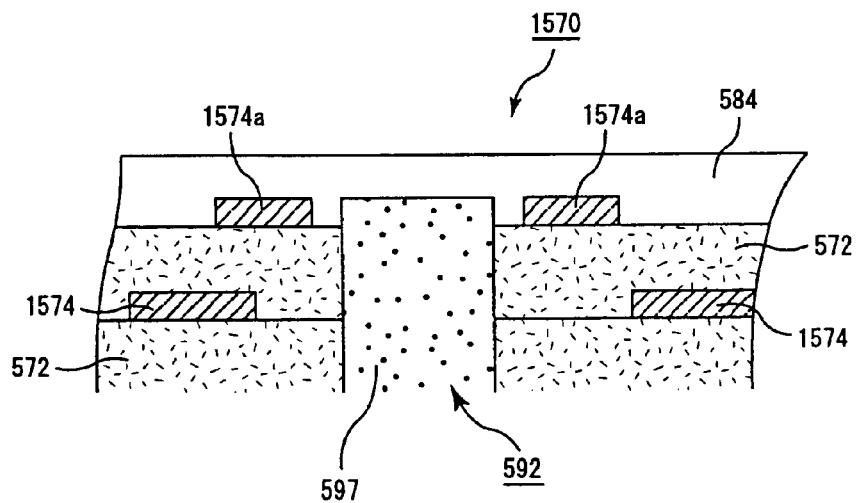

In addition, a multilayer printed circuit board 1570 illustrated in FIG. 1H has the same configuration as a multilayer printed circuit board 570 illustrated in FIG. 1G, except that outermost conductor circuits 1574a are formed in different locations, and a multilayer printed circuit board 570 has a micro lens while the multilayer printed circuit board 1570 does not.

In the multilayer printed circuit board 1570, outermost conductor circuits 1574a are formed in the vicinity of an optical path for transmitting an optical signal 592, but are formed in such a position so as not to make contact with the sides of each other. In addition, a micro lens is not provided in the multilayer printed circuit board 1570.

Also in a multilayer printed circuit board 1570 of this kind, the same effects that a multilayer printed circuit board 570 has, as illustrated in FIG. 1G, tend to be enjoyed apart from the effect that a micro lens is provided.

Figure 1I:
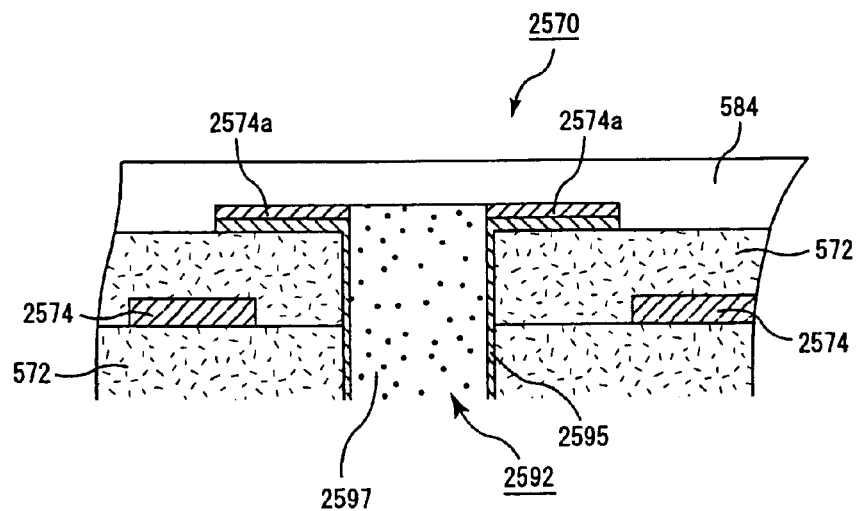

In addition, a multilayer printed circuit board 2570 illustrated in FIG. 1I has the same configuration as a multilayer printed circuit board 570 illustrated in FIG. 1G, except that the configurations of conductor circuits 2574 (including outermost conductor circuits 2574a) and an optical path for transmitting an optical signal 2592 are different.

In the multilayer printed circuit board 2570, the conductor circuits 2574 (outermost conductor circuits 2574a) comprise two layers, and furthermore, conductor layers 2595 are formed on the wall surface of the optical path for transmitting an optical signal 2592.

Also in a multilayer printed circuit board 2570 of this kind, the same effects that the multilayer printed circuit board 570 has, as illustrated in FIG. 1G, tend to be enjoyed apart from the effect that a micro lens is provided.

On top of that, an optical path for transmitting an optical signal is more likely to function as a through hole that can electrically connect conductor circuits which sandwich a substrate and an insulating layer.

In addition, as illustrated in FIGS. 1A to 1I, because of the configuration that an end portion of the optical path for transmitting an optical signal protrudes from the surface of an outermost insulating layer, an end portion of the optical path for transmitting an optical signal does not become diagonal, and a resin composite tends not to remain on unnecessary portions. Therefore, in the case where a micro lens (lens marker) and an optical waveguide are formed on an end portion of the optical path for transmitting an optical signal, the inconveniences that on an end portion of the optical path for transmitting an optical signal a refraction angle of light changes and the portion through which light cannot transmit tend not to occur, and transmission loss of light tends to be small.

Of course, it is only necessary for the above described micro lens and the above described optical waveguide to be formed on an end portion of the optical path for transmitting an optical signal if necessary, and in addition, transmission loss can be made small sufficiently without the formation of a micro lens.

In a multilayer printed circuit board according to the embodiments of the present invention, it is desirable for part of an outermost conductor circuit to be formed in the vicinity of an optical path for transmitting an optical signal comprising the resin composite. Here, although whether or not the outermost conductor circuit is formed in the vicinity of the optical path for transmitting an optical signal cannot be generally determined because it depends on the applications and size of the multilayer printed circuit board, the thickness of a solder resist layer, the height of the conductor circuit, and the like, it is desirable for the outermost conductor circuit to be formed in such a position that the distance from the optical path for transmitting an optical signal is about 50 μm or less when the above described multilayer printed circuit board functions as a package substrate, for example. In addition, it is desirable for the above described outermost conductor circuit to be formed so as to make contact with the sides of the portion which protrude from the above described optical path for transmitting an optical signal, or to be formed in such a position that the distance from the above described optical path for transmitting an optical signal is at least about 25 μm and at most about 50 μm.

If the distance between the optical path for transmitting an optical signal and the outermost conductor circuit is at least about 25 μm and at most about 50 μm, the above described flatness is secured, and at the same time, an etching process can be carried out well when the outermost conductor circuit is formed.

Here, in the case where a solder resist layer is formed, an upper limit of the thickness is desirably about 40 μm, and more desirably about 30 μm, and an lower limit thereof is desirably about 10 μm, and more desirably about 15 μm, from the viewpoints of securing insulation without fail, reducing the unevenness of the thickness when a solder resist composition is applied, making it easier to mount optical elements and various kinds of electronic parts, and the like, when the above described multilayer printed circuit board is a package substrate.

In addition, in the case where the above described multilayer printed circuit board according to the embodiments functions as a substrate for a motherboard, it is desirable for an outermost conductor circuit to be formed in such a position that the distance from an optical path for transmitting an optical signal is about 50 μm or less. In addition, it is desirable for the above described outermost conductor circuit to be formed so as to make contact with the sides of the portion which protrudes from the above described optical path for transmitting an optical signal or so that the distance to the above described optical path for transmitting an optical signal is at least about 25 μm and at most about 50 μm.

Here, with regard to the substrate for a motherboard, also in the case where a solder resist layer is formed, a desirable upper limit of the thickness is about 40 μm, a desirable lower limit thereof is about 10 μm, a more desirable upper limit is about 30 μm, and a more desirable lower limit is about 15 μm. In addition, an optical waveguide is formed on top of the outermost insulating layer, and furthermore, in the case where the solder resist layer is formed so as to cover this optical waveguide, with regard to the above described solder resist layer, the thickness of the portion which is formed on the optical waveguide is within the above described range.

Furthermore, in the case where an outermost conductor circuit is formed in the vicinity of the above described optical path for transmitting an optical signal, as illustrated in FIGS. 1E, 1F, and the like, it is desirable for portions of sides of this outermost conductor circuit to make contact with the portion where the above described optical path for transmitting an optical signal protrudes from the surface of the above described outermost insulating layer.

As thus described, it is because in the case where portions of sides of this outermost conductor circuit make contact with the portion where the above described optical path for transmitting an optical signal protrudes from the surface of the above described outermost insulating layer, the occurrence of waviness of a formed solder resist layer tends to be reduced more certainly after a solder resist layer is formed, and it becomes particularly suitable for forming openings for optical paths in a desired shape and providing a micro lens.

In addition, in the above described multilayer printed circuit board according to the embodiments, as illustrated in FIGS. 1A, 1B, and the like, desirably, an outermost conductor circuit has the same height as the portion where the above described optical path for transmitting an optical signal protrudes from the surface of the above described outermost insulating layer.

As thus described, it is because in the case where an outermost conductor circuit has the same height as the above described protruded portion, the occurrence of waviness of a formed solder resist layer tends to be reduced more certainly after a solder resist layer is formed, and it becomes particularly suitable for forming openings for optical paths in a desired shape and providing a micro lens.

Here, also in the case where openings for optical paths are formed, micro lenses may be provided inside the openings for optical paths, and it also becomes suitable for forming openings for optical paths in a desired shape and providing a micro lens.

In addition, in the above described multilayer printed circuit board according to the embodiments, it is desirable for outermost conductor circuits which are formed in the vicinity of the above described optical path for transmitting an optical signal to be dummy conductor circuits. This is because optical elements are more likely to be mounted by using the dummy conductor circuits.

Here, the above described dummy conductor circuits have the same configuration as the above described external electrodes, except that no current flows through them as a result of the design of the multilayer printed circuit board.

In addition, it is desirable for outermost conductor circuits which are formed in the vicinity of the above described optical path for transmitting an optical signal to be part of a power supply pattern or a ground pattern. This is because the occurrence of noise may be suppressed more easily. From the viewpoint of suppressing the occurrence of noise, it is desirably part of a ground pattern.

In addition, with regard to outermost conductor circuits which are formed in the vicinity of the above described optical path for transmitting an optical signal, it is desirable for an electrode pad for mounting an optical element on part thereof to be formed thereon.

The shape of the above described outermost conductor circuits in a plan view is not particularly limited, and may be, for example, a circular, elliptical, quadrilateral, polygonal form or the like, or may be a meshed or solid pattern form.

In the multilayer printed circuit board according to one embodiment of the present invention, as illustrated in FIGS. 1I and 1J, a solder resist layer may be transparent.

In this case, the transmittance of light having a wavelength for communication in the above described solder resist layer with a thickness of 30 μm is about 60% or more. In the following, the transmittance for light having a wavelength for communication when the thickness is 30 μm is shown in the unit (%/30 μm).

This is because the loss of the optical signal tends not to become too large, and an optical signal tends to be transmitted when the transmittance of light having a wavelength for communication is about 60%/30 μm or more. Hereinafter, the solder resist layer having a transmittance within the above described range is also referred to as a transparent solder resist layer.

It is desirable for the above described transmittance to be about 90%/30 μm or more.

Here, in the present specification, the transmittance of light having a wavelength for communication is a transmittance of light having a wavelength for communication per predetermined length (for example, 1 mm or 30 μm). Specifically, this is the value that can be calculated through the following formula (1) in the case where an optical signal having a power of $I_1$ enters a solder resist layer, passes through a solder resist layer with a predetermined thickness, and comes out with a power of $I_2$ in an optical signal.

$$\text{transmittance}(\%) = (I_2/I_1) \times 100 \quad (1)$$

Here, the above described transmittance is a transmittance measured at 25° C.

The above described solder resist layer is not particularly limited as long as it has a transmittance within the above described range, and can be formed of a solder resist composition, of which the resin component is, for example, a polyphenylene ether resin, a polyolefin resin, a fluorine resin, a thermoplastic elastomer, an epoxy resin, a polyimide resin, or the like.

In addition, a commercially available solder resist composition having a transmittance within the above described range can be used.

In addition, it is desirable for the index of refraction of the above described transparent solder resist layer to be the same as the index of refraction of the resin composite comprising the optical path for transmitting an optical signal. This is because transmission loss tends not to occur due to the reflection in the interface between the two.

An optical path for transmitting an optical signal comprising the resin composite is formed on a multilayer printed circuit board according to the embodiments of the present invention. A collective through hole structure and an individual through hole structure can be cited as examples for the above described optical path for transmitting an optical signal. The specific structures of these are described in the following in reference to the drawings.

The resin component of the above described resin composite is not particularly limited as long as it has a little absorption in the wavelength band for communication, and a thermosetting resin, a thermoplastic resin, a photosensitive resin, a resin of which a portion of a thermosetting resin is converted to have photosensitivity, and the like can be cited as examples.

Specifically, an epoxy resin, an UV setting epoxy resin, a polyolefin based resin, an acrylic resin such as PMMA (polymethyl methacrylate), deuterated PMMA or deuterated PMMA fluoride, a polyimide resin, such as polyimide fluoride, a silicone resin, such as a deuterated silicone resin, a polymer manufactured from benzocyclobutene and the like can be cited as examples.

In addition, the above described resin composite may include particles, for example, resin particles, inorganic particles, metal particles or the like in addition to the above described resin component. The matching of the coefficient of thermal expansion tends to be achieved between the optical path for transmitting an optical signal and the substrate, the insulating layer or the solder resist layer by including these particles and in addition incombustibility is also more likely to be added depending on the kind of particles.

With regard to the above described particles, inorganic particles, resin particles, metal particles and the like can be cited as examples.

With regard to the above described inorganic particles, particles made of aluminum compounds such as alumina and aluminum hydroxide, calcium compounds such as calcium carbonate and calcium hydroxide, potassium compounds such as potassium carbonate, magnesium compounds such as magnesia, dolomite, basic magnesium carbonate and talc, silicon compounds such as silica and zeolite, titanium compounds such as titania and the like can be cited as examples. In addition, particles having a mixed component where at least two kinds of inorganic materials are mixed or melted together may be used.

With regard to the above described resin particles, particles made of, for example, a thermosetting resin, a thermoplastic resin or the like can be cited, and specifically, particles made of an amino resin (such as a melamine resin, a urea resin or a guanamine resin), an epoxy resin, a phenolic resin, a phenoxy resin, a polyimide resin, a polyphenylene resin, a polyolefin resin, a fluorine resin, a bismaleimide-triazine resin and the like can be cited as examples.

With regard to the above described metal particles, gold, silver, copper, tin, zinc, a stainless steel, aluminum, nickel, iron, lead and the like can be cited as examples. It is desirable for the surface layer of the above described metal particles to be coated with a resin and the like in order to secure insulating properties.

In addition, these particles may be solely used or two or more kinds may be used together.

It is desirable for the particle diameter of the above described particles to be shorter than the wavelength.

In addition, the lower limit of the above described particle diameter is desirably about 0.01 μm, more desirably about 0.1 μm and most desirably about 0.2 μm. Meanwhile, the upper limit of the above described diameter is desirably about 0.8 μm and more desirably about 0.6 μm.

Here, in the present specification, the particle diameter means the length of the longest portion of particles.

It is desirable for the lower limit of the amount of the mixed particles contained by the above described resin composite to be about 10% by weight, and it is desirable for the upper limit to be about 50% by weight. This is because in the case where the amount of the mixed particles is about 10% by weight or more, the effects of mixing particles may be gained more easily; while in the case where the amount of the mixed particles is 50% by weight or less, it may become easier for the optical path for transmitting an optical signal to be filled in with the resin. A more desirable lower limit of the amount of the mixed particles is about 20% by weight and a more desirable upper limit of the amount of the mixed particles is about 40% by weight.

In addition, it is desirable for the transmittance of the above described optical path for transmitting an optical signal for light having a wavelength for communication to be about 70% or more when the thickness is 1 mm. In the following, the transmittance for light having a wavelength for communication in the case where the thickness is 1 mm is shown in the unit (%/1 mm).

This is because in the case where the transmittance for light having a wavelength for communication is about 70%/1 mm or more, the loss of the optical signal tends not to become too large, which tends not to lead to lowering of the transmissivity of the optical signal. It is more desirable for the above described transmittance to be about 90%/1 mm or more.

In addition, a conductor layer may be formed on the wall surface of the above described optical path for transmitting an optical signal.

Diffused reflection of light from the wall surface of the optical path for transmitting an optical signal can be reduced and the transmissivity of the optical signal may be increased more easily by forming a conductor layer as described above. In addition, in some cases, it may become possible for the above described conductor layer to function as a through hole.

A micro lens may be provided in the above described multilayer printed circuit board. The above described micro lens may be directly provided on top of the transparent solder resist layer or may be provided inside openings for optical paths functioning as an optical path for transmitting an optical signal which is formed in the solder resist. This is because when a micro lens is provided, an optical signal is condensed through a micro lens, and thereby, it becomes possible to transmit an optical signal without failure.

The above described micro lens is not particularly limited and any micro lenses used as an optical lens can be cited, and with regard to the specific examples of the material thereof, optical glass, resins for an optical lens and the like can be cited. With regard to the above described resins for an optical lens, the same materials as the polymer materials, such as an acrylic resin and an epoxy resin, which are described as the resin composite with which the above described optical path for transmitting an optical signal is filled in, can be cited as examples.

In addition, with regard to the form of the above described micro lens, a convex lens having a convex surface only on one side can be cited as an example and in this case the radius of curvature of the above described convex surface of the lens can be appropriately selected taking the design of the optical path for transmitting an optical signal into consideration. Specifically, in the case where it is necessary to make the focal distance long, for example, it is desirable to make the radius of curvature long; while in the case where it is necessary to make the focal distance short, it is desirable to make the radius of curvature short.

Here, the form of the above described micro lens is not limited to a convex lens, and any form which can condense an optical signal in a desired direction may be used.

It is desirable for the above described micro lens to have a transmittance for light having a wavelength for communication of about 70%/1 mm or more.

In the case where the transmittance for light having a wavelength for communication is about 70%/1 mm or more, the loss of the optical signal tends not to become too large, which tends not to lead to lowering of transmissivity of the optical signal. It is more desirable for the above described transmittance to be about 90%/1 mm or more.

In addition, the above described micro lens may include particles such as resin particles, inorganic particles or metal particles.

This is because the strength of the micro lens can be increased so that the form can be maintained without failure by including particles and the coefficient of thermal expansion may be matched more easily between the micro lens and the above described substrate or insulating layer, and thus, it becomes more difficult for cracks due to the difference in the coefficient of thermal expansion to occur.

In the case where the above described micro lens includes particles, it is desirable for the index of refraction of the resin component of the micro lens and the index of refraction of the above described particles to be approximately the same. Therefore, it is desirable for the particles included in the micro lens to be a mixture of particles of two or more kinds having different indices of refraction so that the index of refraction of the particles becomes approximately the same as the index of refraction of the resin component.

Specifically, in the case where the resin component is an epoxy resin having an index of refraction of 1.53, for example, it is desirable for the particles included in the micro lens to be particles which are gained by mixing and melting silica particles having an index of refraction of 1.46 and titania particles having an index of refraction of 2.65.

Here, with regard to the method for mixing particles, a method for kneading particles and a method for melting and mixing two or more kinds of particles and afterward, converting the mixture into particle form can be cited.

Here, the same kinds of particles as those mixed in the above described optical path for transmitting an optical signal can be cited as specific examples of the above described particles.

Though the particles diameter of the above described particles is not particularly limited, it is desirable for the upper limit thereof to be about 0.8 μm and for the lower limit thereof to be about 0.01 μm.

The above described micro lens is usually provided using an inkjet apparatus, a dispenser, or the like and this is because about 20 μm is the smallest size at present for the inner diameter of the application nozzle of inkjet apparatuses and the inner diameter of the nozzle of dispensers, and thus, the nozzle tends not to be clogged and application may be carried out more easily in the case where the particle diameter is within the above described range.

In addition, it is more desirable for the lower limit of the above described particle diameter to be about 0.1 μm.

This is because it is more desirable for the above described particle diameter to be within this range from the points of view of stability in the viscosity for the application by means of inkjet apparatuses, dispensers or the like and inconsistency in the applied amount.

A desirable lower limit of the amount of mixed particles included in the above described micro lens is about 5% by weight, and a more desirable lower limit is about 10% by weight. Meanwhile, a desirable upper limit of the above described amount of mixed particles is about 60% by weight and a more desirable upper limit is about 50% by weight. This is because in the case where the amount of mixed particles is about 5% by weight or more, the effects may be gained more easily by mixing particles, and in the case where the amount of mixed particles is 60% by weight or less, transmission of an optical signal tends not to be obstructed.

Here, in the case where micro lenses are provided to a multilayer printed circuit board of the present invention, these micro lenses may be independent of each other or may be a plurality of lenses aligned in parallel.

Though the above described micro lenses may be directly provided on top of the above described solder resist layer or may be provided using an optical adhesive, it is desirable for the micro lenses to be directly provided.

The above described optical adhesive is not particularly limited, and optical adhesives such as an epoxy resin based adhesive, an acrylic resin based adhesive and a silicone resin based adhesive can be used.

It is desirable for the properties of the above described optical adhesive to be a viscosity of at least about 0.2 Pa·s and at most about 1.0 Pa·s, an index of refraction of at least about 1.4 and at most about 1.6, an optical transmittance of about 80% or more and a coefficient of thermal expansion (CTE) of at least about $4.0 \times 10^{-5}$ to at most about $9.0 \times 10^{-5}$ (/° C.).

In addition, it is desirable for the thickness of the above described optical adhesive to be about 50 μm or less.

In addition, in the case where micro lenses are provided as described above, a surface treatment may be carried out on the region where they are provided.

When a resin for the formation of micro lenses is applied by means of an inkjet apparatus and the like, though the form of micro lenses, in particular the degree of sagging, easily becomes uneven due to the inconsistent conditions for the process up to the formation of the solder resist layer and due to the inconsistent wettability of the portions on which micro lenses are provided which is caused by the difference in time during which the resin is left, the unevenness in the degree of sagging may be reduced more easily by carrying out a surface treatment using a water repellent coating agent.

With regard to the above described surface treatment, a process using a water repellent coating agent such as a fluorine based polymer coating agent (surface tension: about 10 mN/m to about 12 mN/m), a water repellent process using $CF_4$ plasma and a hydrophilic process using $O_2$ plasma can be cited as examples.

Here, in the present specification, the degree of sagging of micro lenses means the height in portions which protrude from the surface of the solder resist layer.

In addition, the above described micro lenses may be provided by using lens markers.

With regard to the above described lens markers, the lens markers disclosed in JP-A 2002-331532 can be cited as an example.

The contents of JP-A 2002-331532 are incorporated herein by reference in their entirety.

In addition, in the case where lens markers are formed, it is desirable for the above described micro lenses to be provided on the lens markers on which a water repellent process or a hydrophilic process has been carried out.

This is because in the case where the surface of the lens markers is smeared, the resin composite used for the formation of micro lenses (resin composite for lenses) does not spread uniformly, which may cause failure in the formation of micro lenses in a desired form, but the smear on the surface of the lens markers may be removed more easily by carrying out a water repellent process or a hydrophilic process as described above so that the above described resin composite for lenses tends to be uniformly spread over the lens markers.

Furthermore, it is desirable for a hydrophilic process, rather than a water repellent process to be carried out on the lens markers.

This is because, in the case where a hydrophilic process is carried out, it is easy for the resin composite for lenses to spread over the entirety of the lens markers when dropped to provide micro lenses on the lens markers and the spread of the resin tends to be stopped at the periphery of the lens markers without failure, which is appropriate for the formation of micro lenses in a predetermined form using the surface tension.

In addition, in a multilayer printed circuit board according to the embodiments of the present invention, it is desirable for conductor circuits which sandwich the above described substrate to be connected via through holes and for conductor circuits which sandwich the above described insulating layer to be connected through via holes. This is because miniaturization of the multilayer printed circuit board is more likely to be achieved while increasing the density of wires of the multilayer printed circuit board.

A multilayer printed circuit board according to the embodiments with such a configuration is mainly used for optical communication, may function as an optical element, a package substrate on which an IC chip is mounted, or a substrate for a motherboard inside which an optical waveguide is formed.

A multilayer printed circuit board functioning as a package substrate and a multilayer printed circuit board functioning as a substrate for a motherboard are separately described in the following.

Figure 2:
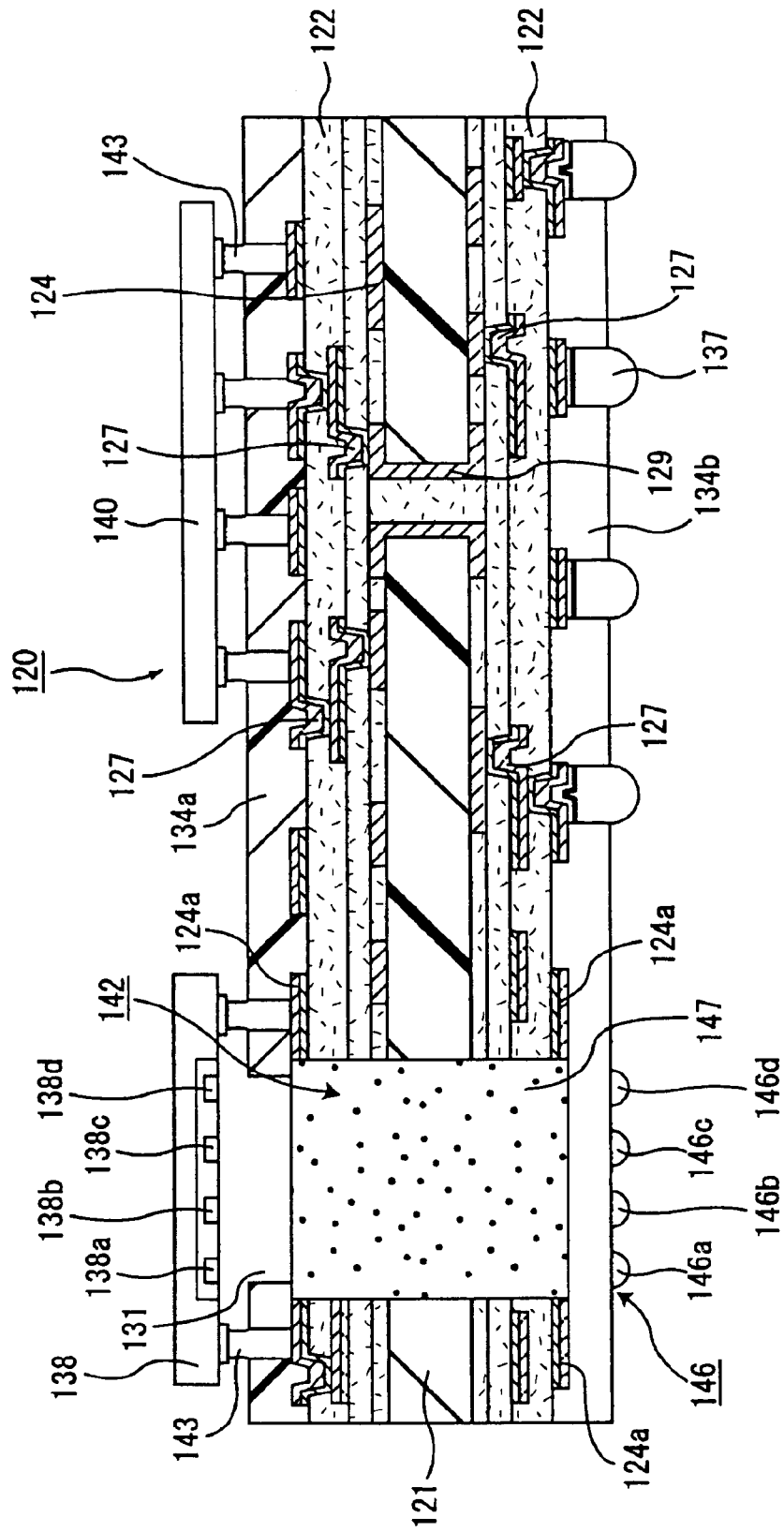
FIG. 2 is a cross-sectional view schematically illustrating an example of a multilayer printed circuit board functioning as a package substrate according to one embodiment of the present invention.

FIG. 2 is a cross-sectional view schematically illustrating an example of a multilayer printed circuit board according to one embodiment of the present invention functioning as a substrate for a package substrate. Here, a package substrate with an IC chip mounted on is illustrated in FIG. 2.

In a package substrate (multilayer printed circuit board) 120, conductor circuits 124 and insulating layers 122 are formed and layered on both sides of a substrate 121, and conductor circuits which sandwich the substrate 121 are electrically connected to each other through a through hole 129, and conductor circuits which sandwich an insulating layer 122 are electrically connected to each other through via holes 127. In addition, solder resist layers 134a, 134b are formed as outermost layers. Here, since solder resist layers 134a which are formed as one of the two outermost layers do not have a high transmittance for light having a wavelength for communication, openings for optical paths functioning as optical paths for transmitting an optical signal are formed, and since solder resist layers 134b which are formed as the other outermost layer are transparent, they are formed so as to cover the entirety of an end portion of the optical path for transmitting an optical signal 142 comprising the resin composite 147.

In this package substrate 120, the optical path for transmitting an optical signal 142 is formed so as to penetrate through the substrate 121, the insulating layers 122, and the like, and an end portion of the optical path for transmitting an optical signal 142 protrudes from the surface of an outermost insulating layer 122.

Here, the optical path for transmitting an optical signal 142 which penetrates through the substrate 121 and the insulating layers 122 are collectively formed with a size that can allow an optical signal to be transmitted from all of the light emitting portions 138a to 138d of the light emitting element 138.

In addition, outermost conductor circuits 124a are formed on outermost insulating layers 122 so that the sides thereof make contact with the portion which protrudes from the optical path for transmitting an optical signal 142 and so that the outermost conductor circuits 124a have the same height as the portion which protrudes from the optical path for transmitting an optical signal 142.

A light emitting element 138 having four channels is mounted on one surface of the package substrate 120 (the surface on the side where the solder resist layer 134a has been formed) via solder connection portions 143 so that each of the light emitting portions 138a to 138d faces the solder resist layer 134a, and at the same time, an IC chip 140 is mounted on the surface via solder connection portions 143. In addition, solder bumps 137 are formed on the solder resist layer 134 on the other surface of the package substrate 120 (the surface on the side where the transparent solder resist layer 134 has been formed).

Micro lenses 146a to 146d are directly provided on top of the transparent solder resist layer 134b.

In the package substrate 120 having such a configuration, an electrical signal from the IC chip 140 is converted into an optical signal in the light emitting element 138 and afterward is transmitted to external optical parts and the like via openings for optical paths 131, the optical path for transmitting an optical signal 142, the solder resist layer 134b and the micro lenses 146a to 146b.

In the package substrate 120, the solder bumps 137 are formed on the solder resist layer 134 via a metal plating layer, and therefore, an electrical signal can be transmitted between the IC chip 140 and an external substrate and the like via the solder bumps 137.

In the case where the solder bumps 137 are formed in such a manner, the above described package substrate can be connected to external substrates such as a substrate for a motherboard via the solder bumps 137, and in this case, the above described package substrate is more likely to be placed at a predetermined position by the self-alignment function of the solder.

Here, the above described self-alignment function means a function of solder which tends to exist in a stable form in the vicinity of the center of openings for the formation of solder bumps due to the liquidity of the solder itself at the time of reflow processing, and this function presumably occurs because the solder is repelled by the solder resist layer and a strong surface tension works to make the solder in spherical form when the solder adheres to a metal.

In the case where this self-alignment function is used, the above described package substrate moves at the time of reflow even when a positional error exists before reflow between the above described package substrate and an external substrate at the time of connection of the two via the above described solder bumps so that the package substrate tends to be attached to the external substrate at the precise position.

Accordingly, in the case where an optical signal is transmitted between the optical element mounted on the above described package substrate and an external optical part via the optical path for transmitting an optical signal and the like, the optical signal tends to be transmitted precisely between the above described package substrate and the above described external substrate only if the mounting position of the optical element mounted on the above described package substrate is precise.

In a multilayer printed circuit board according to the embodiments functioning as the package substrate, a light receiving element, a light emitting element and the like can be cited as examples of an optical element to be mounted.

These can be used in different applications, taking the configuration and required properties of the above described package substrate into consideration. Si, Ge, InGaAs, and the like can be cited as the material of the above described light receiving element. From among these, InGaAs is desirable from the point of view of having excellent photosensitivity.

A PD (photodiode), an APD (avalanche photodiode), and the like can be cited as examples of the above described light receiving element.

An LD (laser diode), a DFB-LD (distributed-feedback laser diode), an LED (light emitting diode), an infrastructure or oxide-confinement VCSEL (vertical cavity surface emitting laser) and the like can be cited as examples of the above described light emitting element.

These may be used in different applications, taking the configuration and required properties of the above described package substrate into consideration.

With regard to the material of the above described light emitting element, a compound of gallium, arsenic and phosphorous (GaAsP), a compound of gallium, aluminum and arsenic (GaAlAs), a compound of gallium and arsenic (GaAs), a compound of indium, gallium and arsenic (InGaAs), a compound of indium, gallium, arsenic and phosphorous (InGaAsP), and the like can be cited.

These may be used in different applications, taking the wavelength for communication into consideration, and in the case where the wavelength for communication is, for example, a band of 0.85 µm, GaAlAs can be used, and in the case where the wavelength for communication is a band of 1.31 µm or a band of 1.55 µm, InGaAs and InGaAsP can be used.

In addition, the optical element such as a light receiving element or a light emitting element may be a multi-channel optical element, and the number of channels thereof is not particularly limited.

In addition, the above described optical element may be mounted through flip chip bonding with external electrodes, as described above, in between, may be mounted through wire bonding or the like.

In addition, in the case where the surface where the above described external electrodes for the above described optical element (hereinafter, also referred to as the external electrode formed surface) is viewed in a plan view, the above described external electrodes may be formed so as to be unevenly distributed in one of the two regions by interposing a center line which divides the shape in a plan view into two equal portions.

In the case where the external electrodes are unevenly distributed in this manner, the above described optical element tends to be connected to a driving IC or an IC chip such as an amplifier IC that is mounted on the package substrate via linear conductor circuits having the same length, and as a result, the system becomes excellent in the freedom of design, and skew (the shifting of a signal) is more likely to be prevented from occurring, and thus, the system becomes excellent in its reliability in terms of transmission of an optical signal.

In addition, in the case where the external electrodes are unevenly distributed, it is desirable for level maintaining members such as dummy electrodes to be formed in one region where external electrodes are formed and in the other region on the opposite side of the region which interposes the center line, on the above described external electrode formed surface.

In particular, in the case where the above described optical element is a kind that is mounted with the face facing downwards through flip chip bonding, it is desirable for level maintaining members to be formed. This is because the optical element inclines at the time of mounting, and the optical signal sometimes fails to be transmitted in the case where the level maintaining members are not formed.

Here, the above described dummy electrodes have the same configuration as the above described external electrodes, except that no current flows through them as a result of the design of the optical element.

A gap adjacent to the above described optical element on the above described substrate side may be filled in with an underfill.

The material of the above described underfill is not particularly limited, and a thermosetting resin, a photosensitive resin, a resin where a photosensitive group is added to a portion of a thermosetting resin, or a resin compound which includes these and a thermoplastic resin, for example, can be used. In addition, a commercially available resin for an underfill can be used.

In addition, it is desirable for the above described underfill to have a transmittance for light having a wavelength for communication of about 70%/1 mm or more. This is because, in the case where the transmittance for the light having a wavelength for communication is about 70%/1 mm or more, the loss of the optical signal becomes not too great, which tends not to lead to lowering of the transmissivity of the optical signal. It is desirable for the above described transmittance to be about 90%/1 mm or more.

With regard to the above described thermosetting resin, an epoxy resin, a phenolic resin, a polyimide resin, a polyester resin, a bismaleimide resin, a polyolefin based resin, a polyphenylene ether resin, a polyphenylene resin, a fluorine resin and the like can be cited as examples.

An acrylic resin and the like can be cited as an example of the above described photosensitive resin.

In addition, with regard to the resin where a photosensitive group is added to a portion of the above described thermosetting resin, a resin gained by making the thermosetting group of any of the above described thermosetting resins and methacrylic acid or acrylic acid react with each other in order to bring about acrylic conversion can be cited as an example.

With regard to the above described thermoplastic resin, a phenoxy resin, polyether sulfone (PES), polysulfone (PSF), polyphenylene sulfone (PPS), polyphenylene sulfide (PPES), polyphenylene ether (PPE), polyether imide (PI) and the like can be cited as examples.

In addition, the above described underfill may include particles. In the case where particles are included, the coefficient of thermal expansion can be adjusted by the amount of mixture when particles are included, and therefore, a matching in the coefficient of thermal expansion may be achieved more easily between the underfill and the package substrate or the optical element.

The same particles as those included in the above described optical path for transmitting an optical signal can be cited as specific examples of the above described particles.

In addition, in the case where the above described particles are included in the above described underfill, it is desirable for the lower limit of the amount of mixture of the particles to be about 20% by weight, and it is desirable for the upper limit to be about 70% by weight. This is because the amounts within this range are usually appropriate for matching the coefficients of thermal expansion between the package substrate and the optical element, and the liquidity required at the time of filling is also provided.

A more desirable lower limit is about 30% by weight, and a more desirable upper limit is about 60% by weight.

In addition, in the package substrate on which a multi channel optical element is mounted as illustrated in FIG. 2, the diameter of the micro lens may be appropriately determined in accordance with the pitch between the respective channels in the array element and in the case where an array element having a pitch of 250 µm is used, for example, it is desirable for the diameter to be at least about 100 µm and at most about 240 µm and it is more desirable for the diameter to be in the range of about 180 µm to about 230 µm. In the case where the diameter is about 100 µm or more, a desired focal distance may be gained more easily and in the case where the diameter is 240 µm or less, adjacent micro lenses tend not to make contact with each other and the micro lenses sometimes cannot be placed at predetermined positions.

In addition, in the case where an array element having a pitch of 500 µm is used, for example, it is desirable for the diameter to be at least about 100 µm and at most about 490 µm, and it is more desirable for the diameter to be in the range of about 180 µm to about 480 µm. In the case where the diameter is 100 µm or more, a desired focal distance may be gained more easily and in the case where the diameter is 490 µm or less, adjacent micro lenses tend not to make contact with each other and the micro lenses tend to be placed at predetermined positions.

With regard to the form of the optical path for transmitting an optical signal in the above described collective through hole structure, a round pillar, a rectangular pillar, a cylindroid shape, a form where a plurality of cylindrical pillars are aligned in parallel and portions of sides of adjacent cylindrical pillars are connected to each other, a pillar form where the bottom is surrounded by a line and an arc and the like can be cited as examples.

In addition, in the case where the form of the above described optical path for transmitting an optical signal is a form where a plurality of cylindrical pillars are aligned in parallel and portions of sides of adjacent cylindrical pillars are connected to each other, dummy cylindrical pillars, which do not actually function as an optical path for transmitting a optical signal, may be formed as some of the cylindrical pillars thereof.

In addition, it is desirable for both the longitudinal and lateral sizes of the optical path for transmitting an optical signal having the above described collective through hole structure to be at least about 100 μm and at most about 5 mm. In addition, in the case where the form of the above described optical path for transmitting an optical signal is cylindrical, it is desirable for the diameter thereof to be within the above described range.

In the case where the diameter of the above described cross section is about 100 μm or more, transmission of an optical signal tends not to be obstructed, while in the case where the diameter exceeds about 5 mm, transmission of an optical signal is not improved in terms of the loss, and miniaturization of the above described package substrate becomes difficult; thus, about 5 mm or less is desirable.

In a multilayer printed circuit board on which an optical path for transmitting an optical signal having a collective through hole structure illustrated in FIG. 2 is formed, an outermost conductor circuit which is connected to an electrode pad of an optical element is formed in the vicinity of the optical path for transmitting an optical signal.

In the multilayer printed circuit board according to the embodiments of the present invention, as described above, dummy conductor circuits may be formed as outermost conductor circuits. In the following, the embodiment in the case where dummy conductor circuits are formed in the vicinity of an end portion of the optical path for transmitting an optical signal having a collective through hole structure is briefly described in reference to the drawings.

Figure 18A:
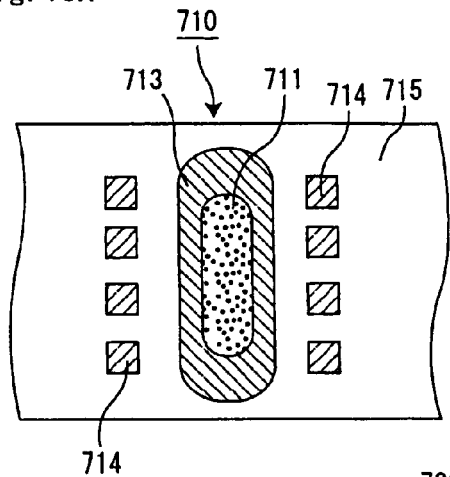
FIGS. 18A to 18C are plan views schematically illustrating part of a multilayer printed circuit board according to one embodiment of the present invention on which an optical path for transmitting an optical signal is formed in a collective through hole structure.
Figure 18B:
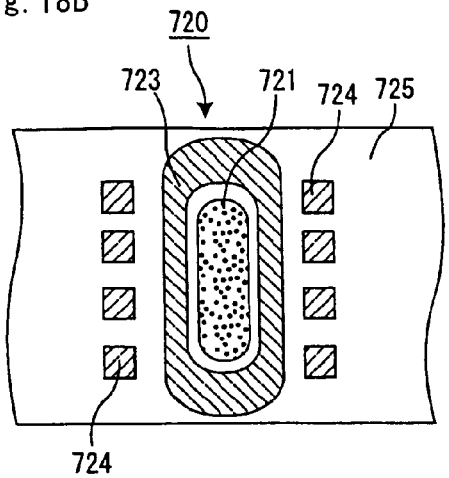
Figure 18C:
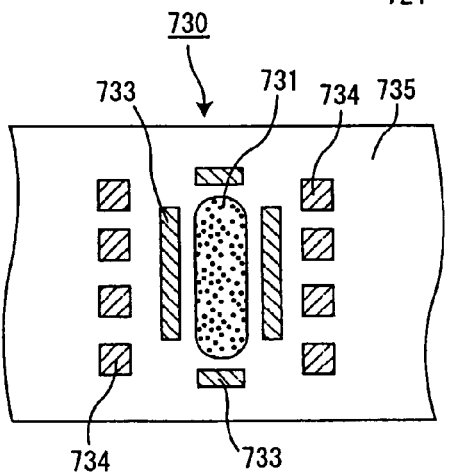

FIGS. 18A to 18C are plan views schematically illustrating a portion of a multilayer printed circuit board according to one embodiment of the present invention on which an optical path for transmitting an optical signal having a collective through hole structure is formed.

In a multilayer printed circuit board 710 illustrated in FIG. 18A, a dummy conductor circuit 713 with a solid shape of an elliptical ring in a plan view is formed so as to make contact with the periphery of the optical path for transmitting an optical signal 711 having a collective through hole structure. Here, in the figure, 714 is an electrode pad for mounting an optical element, and 715 is an insulating layer.

In addition, in a multilayer printed circuit board 720 illustrated in FIG. 18B, dummy conductor circuits 723 with a solid shape of an elliptical ring in a plan view is formed around the periphery of the optical path for transmitting an optical signal 721 having a collective through hole structure. Here, the dummy conductor circuit 723 is formed without making contact with the periphery of the optical path for transmitting an optical signal. Here, in the figure, 724 is an electrode pad for mounting an optical element, and 725 is an insulating layer.

In addition, in a multilayer printed circuit board 730 illustrated in FIG. 18C, four dummy conductor circuits 733 with a solid shape of a rectangle in a plan view are formed around the periphery of the optical path for transmitting an optical signal 731 having a collective through hole structure. Here, the dummy conductor circuits 733 are formed without making contact with the periphery of the optical path for transmitting an optical signal. Here, in the figure, 734 is an electrode pad for mounting an optical element, and 735 is an insulating layer.

Here, dummy conductor circuits in a plan view are not limited to the forms illustrated in FIGS. 18A to 18C, and may be a circular or meshed form.

Figure 3:
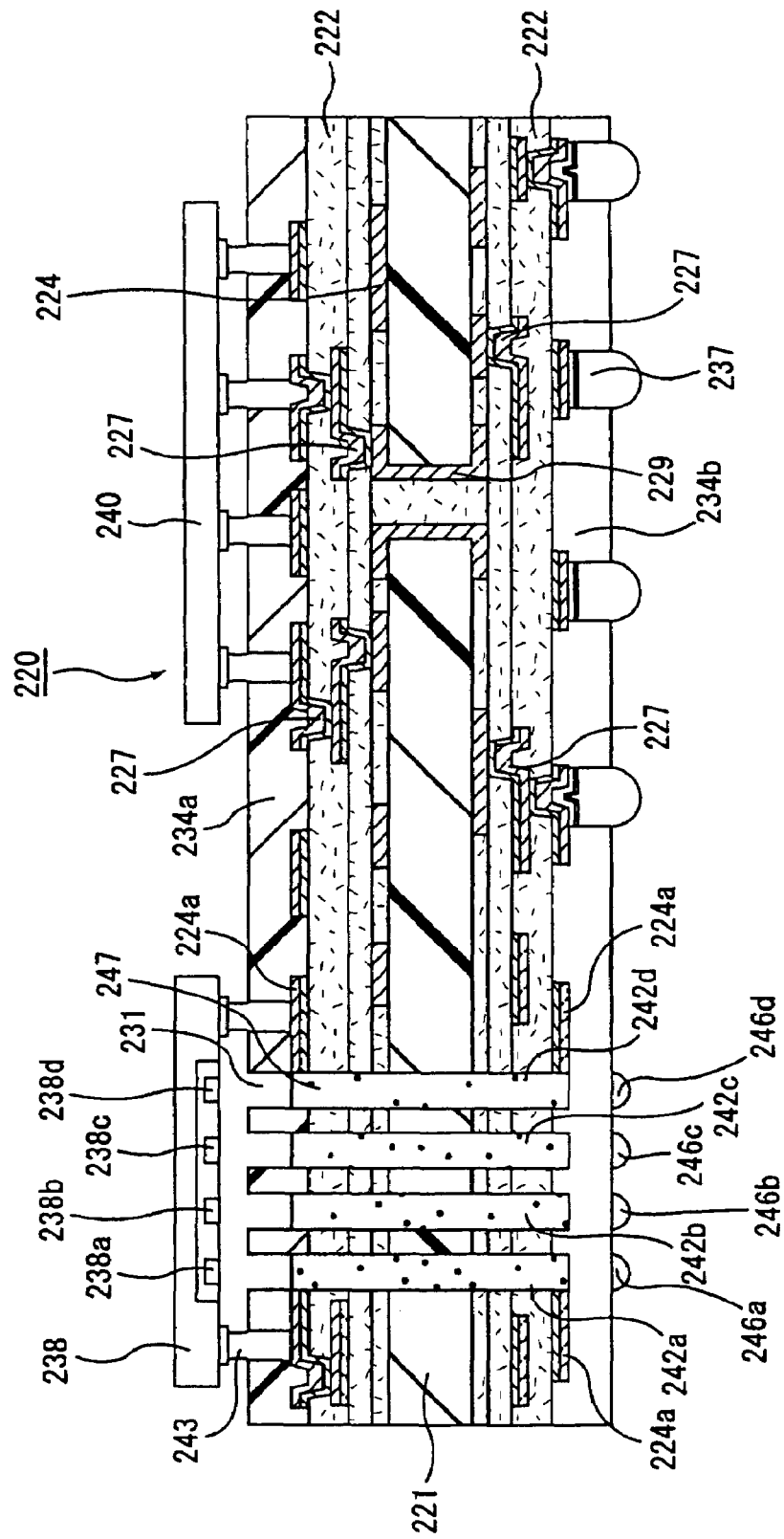
FIG. 3 is a cross-sectional view schematically illustrating another example of a multilayer printed circuit board functioning as a package substrate according to one embodiment of the present invention.

FIG. 3 is a cross-sectional view schematically illustrating another embodiment of a multilayer printed circuit board according to one embodiment of the present invention functioning as a substrate for a package substrate. Here, FIG. 3 illustrates a package substrate with an IC chip mounted thereon.

The configuration of a package substrate 220 illustrated in FIG. 3 is the same as that of a package substrate 120 illustrated in FIG. 2, except that the form of an optical path for transmitting an optical signal is different. Accordingly, the form of the optical path for transmitting an optical signal is herein described in detail.

Four independent optical paths for transmitting an optical signal 242 (242a to 242d) comprising a resin composite 247 are formed in the package substrate 220 illustrated in FIG. 3 so as to penetrate through a substrate 221 and insulating layers 222, so that an end portion of the optical path for transmitting an optical signal 242 protrudes from the surface of an outermost insulating layer 222.

In addition, outermost conductor circuits 224a are formed on an outermost insulating layer so that the sides thereof make contact with the portion which protrudes from an optical path for transmitting an optical signal 242 and so that the outermost conductor circuits 224a have the same height as the portion which protrudes from the optical path for transmitting an optical signal 242.

In addition, solder resist layers 234a, 234b are formed as outermost layers. Here, since the solder resist layer 234a which is formed as one of the two outermost layers does not have a high transmittance for light having a wavelength for communication, openings for optical paths functioning as an optical path for transmitting an optical signal are formed, and since the solder resist layer 234b which is formed as the other outermost layer is transparent, it is formed so as to cover the entirety of an end portion of the optical path for transmitting an optical signal 242 comprising a resin composite 247. In addition, micro lenses are provided on the solder resist layer 234b.

A light emitting element 238 having four channels is mounted on one surface of the package substrate 220 via solder connection portions.

Accordingly, an optical signal from the light emitting element 238 having four channels can be transmitted via any of the optical paths for transmitting an optical signal 242a to 242d. Here, the individual optical paths for transmitting an optical signal are independently formed, so that each thereof can transmit an optical signal from light receiving portions 238a to 238d of the light emitting element having four channels.

In the package substrate 220 having a configuration of this kind, an electrical signal from an IC chip 240 is converted into an optical signal in a light emitting element 238, and afterward, transmitted to an external optical part and the like via openings for optical paths 231, a solder resist layer 234, optical paths for transmitting an optical signal 242a to 242d, a solder resist layer 234b, and micro lenses 246a to 246d.

In addition, with regard to the size of each optical path for transmitting an optical signal, it is desirable for the lower limit of the diameter of the cross section thereof to be about 100

μm, and it is desirable for the upper limit to be about 500 μm. In the case where the above described diameter is about 100 μm or more, a risk that the optical paths may be clogged tends not to occur, and it may becomes easier for the optical paths for transmitting an optical signal to be filled in with an uncured resin composite. Meanwhile, in the case where the above described diameter is made more than about 500 μm, the transmissivity for an optical signal does not increase very much, and such a large diameter may hinder freedom in design of the conductor circuit and the like that form the package substrate; thus, about 500 μm or less is desirable.

A more desirable lower limit of the diameter is about 250 μm, and a more desirable upper limit of the diameter is about 350 μm. Here, the diameter of the cross section of the portion where the above described optical paths for transmitting an optical signal penetrates through the above described substrate and the above described insulating layers means the diameter of the cross section in the case where the above described optical paths for transmitting an optical signal are in cylindrical shape, the long diameter of the cross section in the case where the above described optical paths for transmitting an optical signal are in cylindroid shape, and the length of the longest portion in the cross section in the case where the above described optical paths for transmitting an optical signal are quadrangular or polyangular pillars. In addition, in the embodiments according to the present invention, the cross section of the optical paths for transmitting an optical signal means the cross section in the direction parallel to the main surface of the package substrate.

An appropriate diameter of the micro lenses which are provided on end portions of the optical paths for transmitting an optical signal in the package substrate of this embodiment may be determined in accordance with the pitch between the channels in the array element, and in the case where an array element having a pitch of 250 μm is used, for example, it is desirable for the diameter of the micro lenses to be at least about 100 μm and at most about 190 μm. Here, in this case, it is desirable for the diameter of the optical paths for transmitting an optical signal to be at least about 150 μm and at most about 200 μm.

In addition, in the case where an array element having a pitch of 500 μm is used, for example, it is desirable for the diameter of the micro lenses to be at least about 100 μm and at most about 490 μm, and it is more desirable for it to be in the range of about 180 μm to about 480 μm. Here, in this case, it is desirable for the diameter of the optical paths for transmitting an optical signal to be at least about 150 μm and at most about 450 μm.

In addition, the reason why it is desirable for the diameter of the individually formed optical paths for transmitting an optical signal to be 100 μm or more is described in detail as follows.

That is to say, the optical paths for transmitting an optical signal in the above described embodiment are formed by filling in through holes which penetrate through the substrate and the insulating layers with a resin composite if necessary after the creation of the through holes, and the above described through holes are usually created using a drill, and in the case where through holes are created through a drilling process, it is difficult to create through holes of which the diameter is less than about 100 μm.

In addition, with regard to the form of the respective optical paths for transmitting an optical signal having the above described individual through hole structure, a round pillar, a rectangular pillar, a cylindroid shape and pillar form having a bottom surrounded by a line, and an arc and the like can be cited as examples.

In a multilayer printed circuit board according to one embodiment on which an optical path for transmitting an optical signal in an individual through hole structure illustrated in FIG. 3 is formed, an outermost conductor circuit which is connected to an electrode pad of an optical element is formed in the vicinity of the optical path for transmitting an optical signal.

In the multilayer printed circuit board according to one embodiment of the present invention, as described above, dummy conductor circuits may be formed as outermost conductor circuits. In the following, the embodiment in which dummy conductor circuits are formed in the vicinity of an end portion of an optical path for transmitting an optical signal in an individual through hole structure is briefly described in reference to the drawings.

Figure 19A:
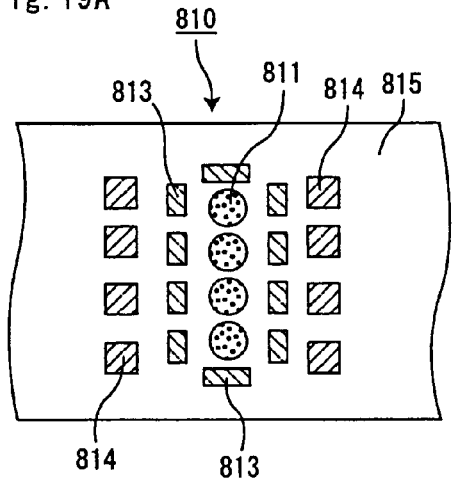
FIGS. 19A and 19B are plan views schematically illustrating part of a multilayer printed circuit board according to one embodiment of the present invention on which an optical path for transmitting an optical signal is formed in an individual through hole structure.
Figure 19B:
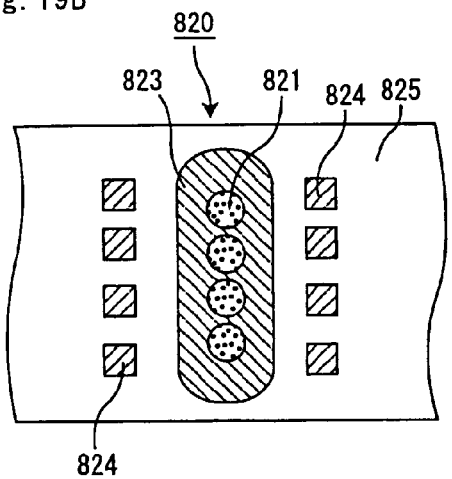

FIGS. 19A and 19B are plan views schematically illustrating a portion of a multilayer printed circuit board according to one embodiment of the present invention on which optical paths for transmitting an optical signal in an individual through hole structure are formed.

In a multilayer printed circuit board 810 illustrated in FIG. 19A, the dummy conductor circuits 813 with a rectangular shape in a plan view are formed on the periphery of optical paths for transmitting an optical signal 811 having an individual through hole structure. Here, the dummy conductor circuits 813 are formed without making contact with the outer periphery of the optical path for transmitting an optical signal. Here, in the figure, 814 is an electrode pad for mounting an optical element, and 815 is an insulating layer.

In addition, in a multilayer printed circuit board 820 illustrated in FIG. 19B, a dummy conductor circuit 823 with a solid shape in a plan view is formed so as to make contact with the periphery of optical paths for transmitting an optical signal 821 having an individual through hole structure. Here, in the figure, 824 is an electrode pad for mounting an optical element, and 825 is an insulating layer.

Here, dummy conductor circuits in a plan view are not limited to the forms illustrated in FIGS. 19A and 19B, and may be circular or meshed forms In addition, though the multilayer printed circuit board according to the embodiments functioning as package substrates illustrated in FIGS. 2 and 3 are examples where a light emitting element is mounted as an optical element, a light receiving element may be mounted on the above described multilayer printed circuit board according to the embodiments instead of a light emitting element, or a light emitting element and a light receiving element may be mounted together.

In addition, the number of channels of the optical element that is mounted is not limited to four but may be one, two, three, or five or more.

In addition, in package substrates illustrated in FIGS. 2 and 3 according to the embodiments, solder resist layers which do not have a high transmittance are formed on one of the outermost insulating layers, and transparent solder resist layers are formed on the other solder resist layers, but the above described package substrate is not necessarily limited to such a form, and both solder resist layers may be solder resist layers which do not have a high transmittance or transparent solder resist layers.

In addition, a multilayer printed circuit board according to the embodiments of the present invention functioning as a package substrate may be a package substrate where an optical path for transmitting an optical signal in recess form is formed.

Figure 4:
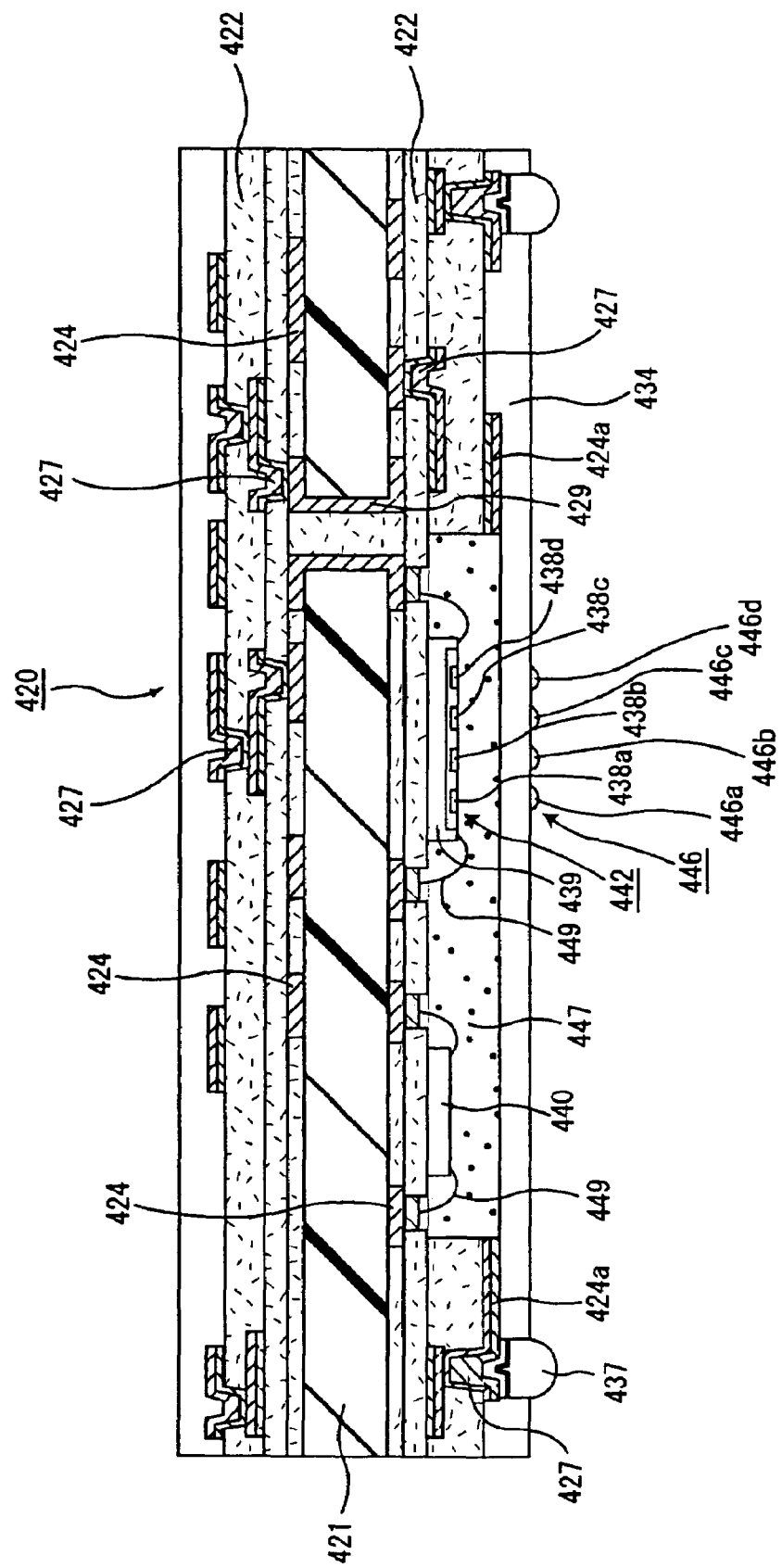
FIG. 4 is a cross-sectional view schematically illustrating another example of a multilayer printed circuit board functioning as a package substrate according to one embodiment of the present invention.

FIG. 4 is a cross-sectional view schematically illustrating another example of a multilayer printed circuit board according to one embodiment of the present invention functioning as a package substrate.

In a package substrate 420, conductor circuits 424 and insulating layers 422 are formed and layered on both sides of a substrate 421, and conductor circuits which sandwich the substrate 421 are electrically connected to each other through a through hole 429, and conductor circuits which sandwich the insulating layer 422 are electrically connected to each other through via holes 427. In addition, transparent solder resist layers 434 are formed as outermost layers on both sides.

In this package substrate 420, an optical path for transmitting an optical signal 442 in recess form comprising a resin composite 447 is provided in the insulating layer that is formed and layered on one side of the substrate. The end portion of the side of a solder resist layer 434 of this optical path for transmitting an optical signal 442 protrudes from the surface of an outermost insulating layer 422.

Inside this optical path for transmitting an optical signal 442, a light emitting element 438 and an IC chip 439 are mounted and connected by wire bonding 449. Here, inside the optical path for transmitting an optical signal, an IC chip 440 having no optical elements is mounted by wire bonding 449.

In addition, outermost conductor circuits 424a are formed on insulating layers so that the sides thereof are in the vicinity of the portion which protrudes from an optical path for transmitting an optical signal 442 and so that the outermost conductor circuits 424a has the same height as the portion which protrudes from the optical path for transmitting an optical signal 442.

Here, a light emitting element may be mounted through flip chip bonding on a package substrate having an optical path for transmitting an optical signal in recess form, and in this case, external electrodes are formed on the surface opposite to the surface where a light emitting portion is formed.

In addition, micro lenses 446 (446a to 446d) are provided on the solder resist layer 434 on the side where the optical path for transmitting an optical signal 442 is formed (lower side in the figure).

Package substrates of this sort are also multilayer printed circuit boards according to the embodiments of the present invention.

As described above, the multilayer printed circuit board according to the embodiments of the present invention may be a multilayer printed circuit board that functions as a substrate for a motherboard. Next, a multilayer printed circuit board according to the embodiments functioning as a substrate for a motherboard is described.

Figure 5:
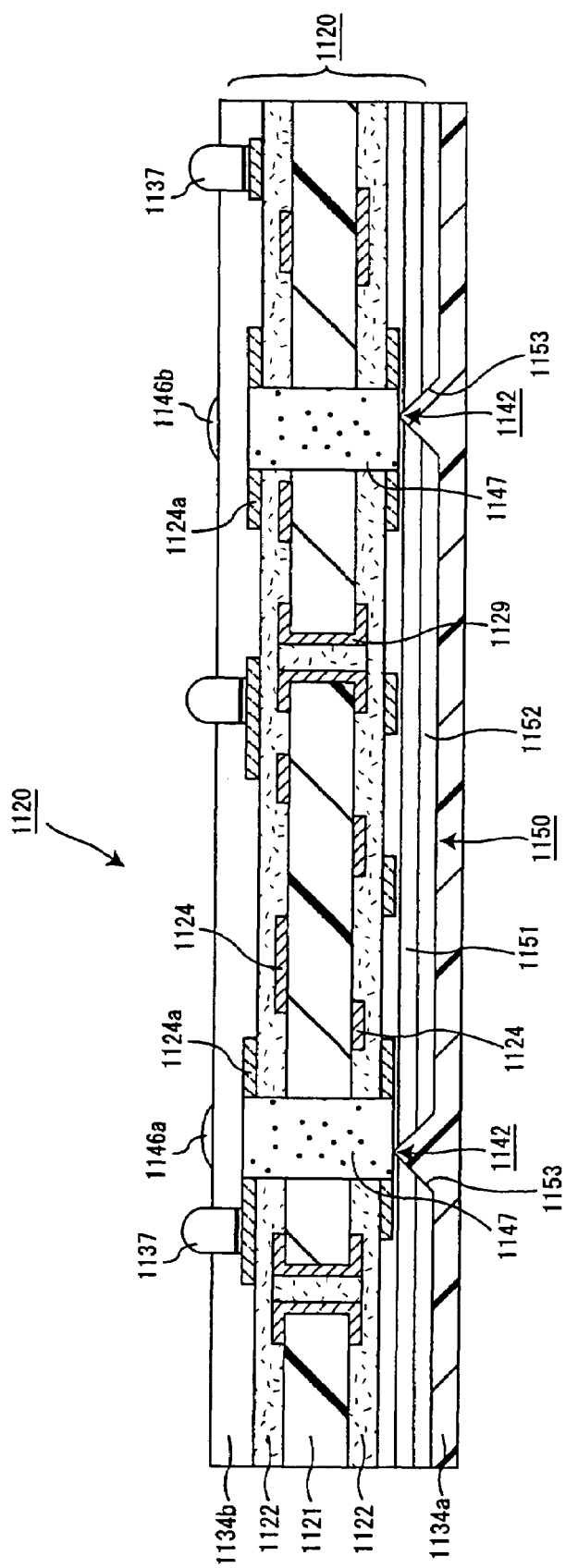
FIG. 5 is a cross-sectional view schematically illustrating an example of a multilayer printed circuit board functioning as a substrate for a motherboard according to one embodiment of the present invention.

FIG. 5 is a cross-sectional view schematically illustrating an example of a multilayer printed circuit board according to one embodiment functioning as a substrate for a motherboard.

In a substrate for a motherboard 1120 illustrated in FIG. 5, conductor circuits 1124 and insulating layers 1122 are formed and layered on both sides of a substrate 1121, and conductor circuits which sandwich the substrate 1121 are electrically connected to each other by means of a through hole 1129, and conductor circuits which sandwich the insulating layers 1122 are electrically connected to each other by means of via holes (not shown). In addition, a solder resist layer 1134a which does not have a high transmittance is formed as one of the two outermost layers, and a transparent solder resist layer 1134b is formed as the other solder resist layer.

Optical paths for transmitting an optical signal 1142 comprising a resin composite 1147 are provided in this substrate for a motherboard 1120 so as to penetrate through the substrate 1121 and the insulating layers 1122.

The optical paths for transmitting an optical signal 1142 are formed so that the end portions thereof protrude from the surface of outermost insulating layers 1122.

In addition, the outermost conductor circuits 1124a are formed on the outermost insulating layer 1122 so that the sides thereof make contact with the portion which protrudes from the optical path for transmitting an optical signal 1142 and so that the outermost conductor circuits 1124a have the same height as the portion which protrudes from the optical path for transmitting an optical signal 1142.

An optical waveguide 1150 comprising a core 1151 and a clad 1152 including an underclad and an overclad is formed on an outermost insulating layer 1122 on the side of a solder resist layer 1134a (lower in the figure). Here, the underclad that is not shown is formed so that the portion on which conductor circuits are not formed beneath the underclad has a greater thickness than conductor circuits.

In addition, the optical path conversion mirrors 1153 are formed on each end portion of the optical waveguide 1150 so that optical signals are more likely to be transmitted between the optical waveguide 1150 and an optical path for transmitting the optical signal 1142.

In addition, micro lenses 1146a and 1146b are provided on a solder resist layer 1134b.

Each of the micro lenses 1146a and 1146b are provided so as to be located in a corresponding end portion of the core 1151 on which the optical path conversion mirrors are formed.

Here, in the multilayer printed circuit board of the present invention, a metal vapor deposition layer may be formed on the surface of the optical path conversion mirrors on which an optical waveguide is formed.

In a substrate for a motherboard 1120 of this kind, as a result, optical signals from external package substrates and the like are transmitted to other package substrates and the like, via a micro lens 1146a, a solder resist layer 1134b, an optical path for transmitting an optical signal 1142, an optical waveguide 1150, an optical path for transmitting an optical signal 1142, a solder resist layer 1134b, and a micro lens 1146b.

In addition, solder bumps 1137 are formed in the solder resist layer 1134b, and a package substrate including the solder bumps 1137 can be mounted thereon. In addition, solder bumps may be formed also on the side of a solder resist layer 1134a.

Figure 6:
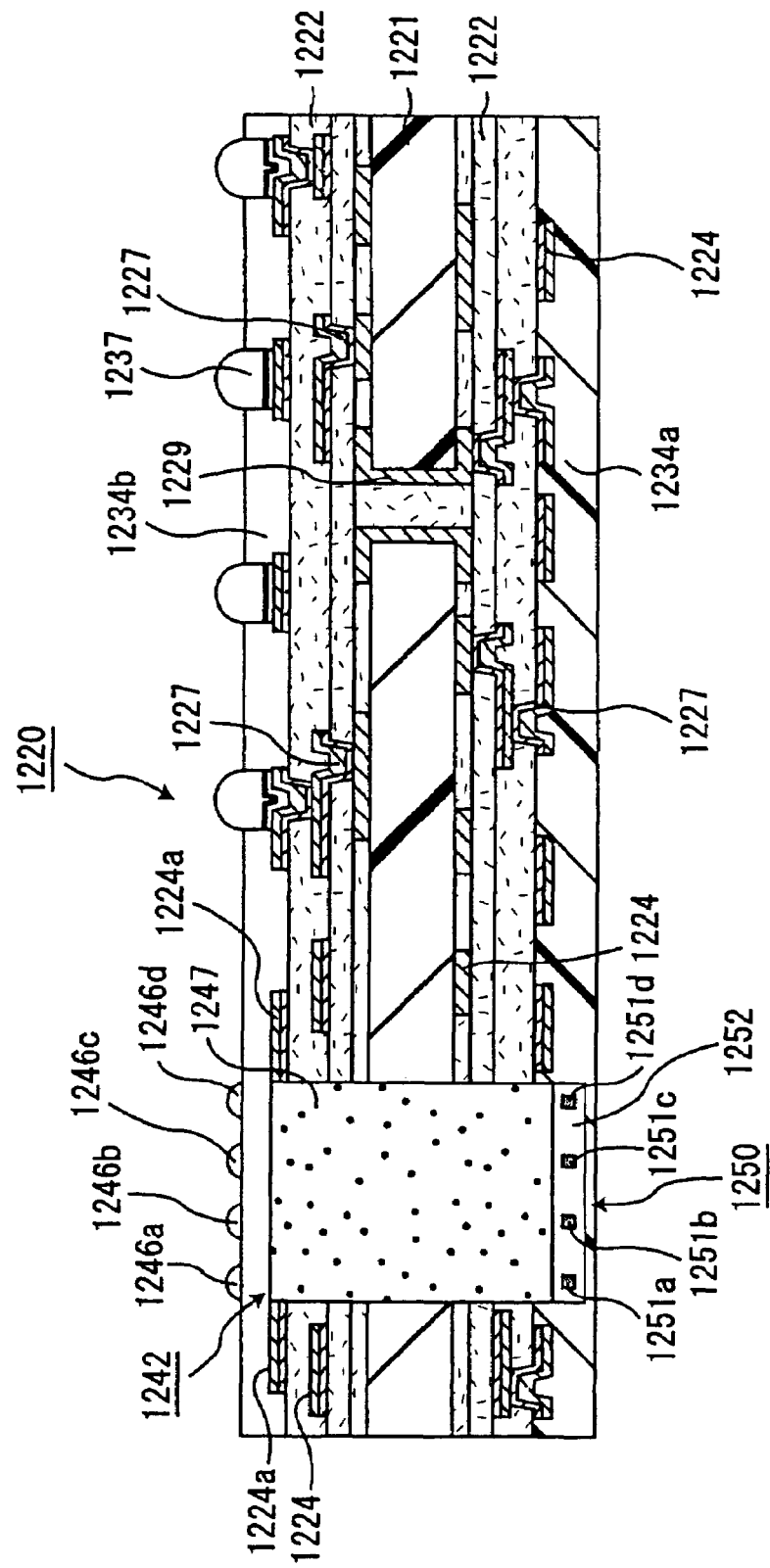
FIG. 6 is a cross-sectional view schematically illustrating another example of a multilayer printed circuit board functioning as a substrate for a motherboard according to one embodiment of the present invention.

In addition, the embodiments of the multilayer printed circuit board according to the embodiments functioning as a substrate for a motherboard are not limited to an embodiment illustrated in FIG. 5, and may be an embodiment illustrated in FIG. 6.

FIG. 6 is a cross-sectional view schematically illustrating another example of a multilayer printed circuit board functioning as a substrate for a motherboard.

As illustrated in FIG. 6, in a substrate for a motherboard 1220, conductor circuits 1224 and insulating layers 1222 are formed and layered on both sides of a substrate 1221, and conductor circuits which sandwich the substrate 1221 are electrically connected to each other by means of a through hole 1229, and conductor circuits which sandwich the insulating layers 1222 are electrically connected to each other by means of via holes 1227. In addition, a solder resist layer 1234a is formed as one of the two outermost layers, and transparent solder resist layers 1234b are formed as the other solder resist layers.

In this substrate for a motherboard 1220, an optical path for transmitting an optical signal 1242 comprising a resin composite 1247 is provided so as to penetrate through a substrate 1221 and insulating layers 1222.

The optical path for transmitting an optical signal 1242 is formed so that an end portion thereof penetrates through the surface of the outermost insulating layer 1222. In addition, this optical path for transmitting an optical signal has collective through holes with which a plurality of an optical signal can be transmitted Accordingly, in the case where a package substrate on which a multi-channel optical element is mounted or a multi-channel optical element is directly mounted on a substrate for a motherboard, optical signals tend to be transmitted from all the channels.

In addition, outermost conductor circuits 1224*a* are formed on the outermost insulating layers 1222 so that the sides thereof make contact with the portion which protrudes from an optical path for transmitting an optical signal 1242 and so that the outermost conductor circuits 1224*a* have the same height as the portion which protrudes from the optical path for transmitting an optical signal 1242.

An optical waveguide 1250 comprising four cores 1251*a* to 1251*d* and a clad 1252 are formed on the outermost insulating layer 1222 in one of the two substrates for a motherboard 1220 (the side of a solder resist layer 1234*a*).

In addition, the optical path conversion mirrors are formed on each end portion of an optical waveguide 1250 so that optical signals tend to be transmitted between the optical waveguide 1250 and the optical path for transmitting an optical signal 1242.

In addition, micro lenses 1246*a* to 1246*d* are provided on a transparent solder resist layer 1234*b*.

Each of the micro lenses 1246*a* and 1246*d* are provided so as to be located in a corresponding end portion of a core 1251 on which the optical path conversion mirrors are formed.

Here, as illustrated in FIG. 6, in a substrate for a motherboard, only one optical path for transmitting an optical signal having a collective through hole structure is formed, while as illustrated in FIG. 5, two or more optical paths for transmitting an optical signal may be formed therein.

In addition, a multilayer printed circuit board of the present invention functioning as a substrate for a motherboard may have an optical path for transmitting an optical signal in a collective through hole structure, or may have an optical path for transmitting an optical signal in an individual through hole structure.

As illustrated in FIGS. 5 and 6, an optical waveguide is formed on a multilayer printed circuit board according to the embodiments functioning as a substrate for a motherboard.

An organic based optical waveguide made of a polymer material and the like, silica glass, an inorganic based optical waveguide made of a compound semiconductor and the like can be cited as the above described optical waveguide. From among these, an organic based optical waveguide is desirable. This is because such an optical waveguide has high adhesiveness to an insulating layer and processing is easy.

The above described polymer material is not particularly limited, as long as it has little absorption for a wavelength band for communication, and a thermosetting resin, a thermoplastic resin, a photosensitive resin, a resin where a portion of a thermosetting resin is made photosensitive, a resin compound of a thermosetting resin, a thermoplastic resin, a compound of a photosensitive resin and a thermoplastic resin and the like can be cited.

Specifically, polymers made from an acrylic resin such as PMMA (polymethyl methacrylate), deuterated PMMA or deuterated PMMA fluoride, a polyimide resin, such as polyimide fluoride, an epoxy resin, a UV setting epoxy resin, a polyolefin based resin, a silicone resin such as deuterated silicone resin or a siloxane resin, benzocyclobutene, or the like can be cited.

In addition, in the case where the above described optical waveguide is an optical waveguide having multiple modes, it is desirable for the material to be an acrylic resin, an epoxy resin or a UV setting epoxy resin, and in the case where the above described optical waveguide is an optical waveguide having a single mode, it is desirable for the material to be a polyimide resin, a silicone resin or a siloxane resin.

In addition, it is desirable for the thickness of the core portion of the above described optical waveguide to be at least about 1 µm and at most about 100 µm, and it is desirable for the width thereof to be at least about 1 µm and at most about 100 µm. In the case where the above described width is about 1 µm or more, the optical waveguide may sometimes be easy to form. Meanwhile, in the case where the above described width is 100 µm or less, this tends not to result in hindrance of the freedom in design of the conductor circuit and the like which form the substrate for a motherboard (multilayer printed circuit board).

In addition, it is desirable for the ratio of the thickness to the width in the core portion of the above described optical waveguide to be close to about (1:1). This is because the form in the light receiving portion of the above described light receiving element and the form in the light emitting portion of the above described light emitting element are circular in a plan view. Here, the above described ratio of the thickness to the width is not particularly limited, and usually, it is acceptable for it to fall in the range of about (1:2) to about (2:1).

Furthermore, in the case where the above described optical waveguide is an optical waveguide having a single mode with a wavelength for communication of 1.31 µm or 1.55 µm, it is more desirable for the thickness and the width in this core portion to be at least about 5 µm and at most about 15 µm, and it is most desirable for it to be about 10 µm. In addition, in the case where the above described optical waveguide is an optical waveguide having multiple modes with a wavelength for communication of 0.85 µm, it is more desirable for the thickness and the width in this core portion to be at least about 20 µm and at most about 80 µm, and it is most desirable for it to be about 50 µm.

In addition, particles may be mixed in within the optical waveguide. This is because it becomes difficult for cracks to occur in the optical waveguide when particles are mixed in. That is to say, in the case where no particles are mixed in within the optical waveguide, cracks may sometimes occur in the optical waveguide due to the difference in the coefficient of thermal expansion between the optical waveguide and the other layer (substrate, insulating layer and the like), but in the case where the difference in the coefficient of thermal expansion between the optical waveguide and the above described other layer is made small by adjusting the coefficient of thermal expansion when mixing particles into the optical waveguide, it becomes difficult for cracks to occur in the optical waveguide.

As the above described particles, the same particles as those included in the above described optical path for transmitting an optical signal can be cited as examples. These particles may be used alone, or two or more kinds may be used together.

As the above described particles, inorganic particles are desirable, and particles comprising silica, titania or alumina are desirable. In addition, particles having a mixed component where at least two from among silica, titania and alumina are mixed and fused are also desirable.

In addition, the form of the above described resin particles is not particularly limited, and sphere, elliptical sphere, rubble and polyhedron can be cited.

In addition, it is desirable for the particle diameter of the above described particles to be smaller than the wavelength for communication. This is because in the case where the particle diameter is more than the wavelength for communication, transmission of an optical signal may sometimes be obstructed.

It is more desirable for the lower limit of the above described particle diameter to be about 0.01 µm and the upper limit to be about 0.8 µm. This is because in the case where particles within this range are included, distribution in the particle size does not become too wide, and inconsistency of the viscosity of the resin composite tends not to become too great when the particles are mixed into the resin composite, and thus, reproducibility in preparing the resin composite worsens, and it tends not to become difficult to prepare a resin composite having a predetermined viscosity.

It is more desirable for the lower limit of the above described particle diameter to be about 0.1 µm and for the upper limit to be about 0.8 µm. In the case where the particle diameter is within this range, it is appropriate for the resin composite to be applied using a spin coat method, a roll coating and the like, and it becomes easy to prepare a resin composite having a predetermined viscosity when the resin composite is prepared by mixing in particles.

It is particularly desirable for the lower limit of the above described particle diameter to be about 0.2 µm and the upper limit to be about 0.6 µm. This range is particularly appropriate for the application of the resin composite and formation of the core portion of the optical waveguide. Furthermore, inconsistency in the formed optical waveguides, in particular, inconsistency in the core portion, becomes very small, and the properties of the substrate for a motherboard become particularly excellent.

In addition, particles of two or more different particle diameters may be included, as long as the particles have a particle diameter within this range.

A desirable lower limit of the amount of particles mixed in as described above is about 10% by weight, and a more desirable lower limit is about 20% by weight. Meanwhile, a desirable upper limit of the above described particles is about 80% by weight, and a more desirable upper limit is about 70% by weight. This is because in the case where the amount of particles mixed in is about 10% by weight or more, the effects of mixing particles tends to be gained, and in the case where the amount of particles mixed in is about 80% by weight or less, transmission of an optical signal tends not to be obstructed.

In addition, though the form of the above described optical waveguide is not particularly limited, sheet form is preferable, because this makes formation easy.

In addition, in the case where the above described optical waveguide is formed of a core portion and a clad portion, though the above described particles may be mixed into both the core portion and the clad portion, it is desirable for the core portion not to have particles mixed in, and for only the clad portion that covers the surrounding of this core portion to have particles mixed in. The reason for this is as follows.

That is to say, in the case where particles are mixed in within an optical waveguide, an air layer may be created in the interface between the particles and the resin component, depending on the adhesiveness between these particles and the resin component of the optical waveguide. In such a case, the direction of refraction of light is changed by this air layer, increasing the transmission loss of the optical waveguide; while in the case where particles are mixed only in the clad portion, no problems arise when particles are mixed in as described above, such that the transmission loss of the optical waveguide increases and the above described effects, such that it may become difficult for cracks to occur in the optical waveguide, tend to be gained.

In addition, it is desirable for an optical path conversion mirror to be formed in the above described optical waveguide. This is because it may become possible to change the optical path easily by a desired angle by forming an optical path conversion mirror.

The above described optical path conversion mirror can be formed by cutting an end portion of the optical waveguide as described below. In addition, a member having an optical path conversion portion may be placed at the tip of an end portion of the optical waveguide instead of forming an optical path conversion mirror in the optical waveguide.

Figure 21:
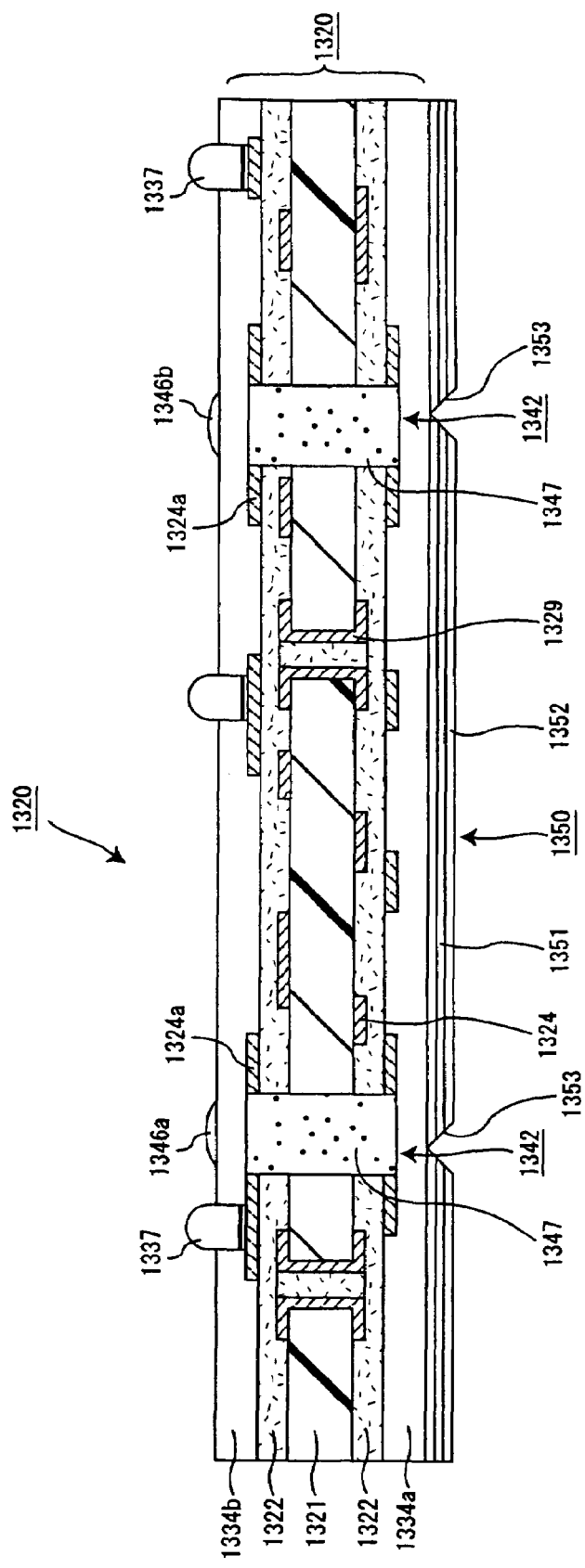
FIG. 21 is a cross-sectional view schematically illustrating another example of a multilayer printed circuit board according to one embodiment functioning as a substrate for a motherboard.

In addition, a multilayer printed circuit board of the present invention functioning as a substrate for a motherboard is not always limited to that on which an optical waveguide was formed on an outermost insulating layer illustrated in FIGS. 5 and 6, and an optical waveguide may be formed on a solder resist layer, for example, as illustrated in FIGS. 21, 22A and 22B.

FIG. 21 is a cross-sectional view schematically illustrating another example of a multilayer printed circuit board according to one embodiment functioning as a substrate for a motherboard.

The configuration of a substrate for a motherboard 1320 illustrated in FIG. 21 is the same as that of a substrate for a motherboard 1120, except that the configuration of a solder resist layer and an optical waveguide is different from that of a substrate for a motherboard 1120 illustrated in FIG. 5. Accordingly, a substrate for a motherboard 1320 is herein described, focusing on the configuration of a solder resist layer and an optical waveguide.

In a substrate for a motherboard 1320, a transparent solder resist layer 1334a is formed on an outermost insulating layer 1322 on the side opposite to the side where micro lenses 1346a, 1346b are provided (lower in the figure), and furthermore, an optical waveguide 1350 comprising a core 1351 and a clad 1352 is formed on the entirety of this transparent solder resist layer 1334a. In addition, the optical path conversion mirrors 1353 are formed in a predetermined portion of an optical waveguide 1350.

In addition, as described above, the configuration thereof is the same as that of a substrate for a motherboard 1120 apart from the configuration of a solder resist layer 1334a and an optical waveguide 1350.

In a substrate for a motherboard 1320 of this kind, as a result, optical signals from an external package substrate and the like are transmitted to other package substrates and the like via a micro lens 1346a, a solder resist layer 1334b, an optical path for transmitting an optical signal 1342, a solder resist layer 1334a, an optical waveguide 1350, a solder resist layer 1334a, an optical path for transmitting an optical signal 1342, a solder resist layer 1334b, and a micro lens 1346b.

In addition, a multilayer printed circuit board of the present invention functioning as a substrate for a motherboard may be a mode illustrated in FIGS. 22A and 22B.

FIG. 22A is a cross-sectional view schematically illustrating another example of a multilayer printed circuit board functioning as a substrate for a motherboard, and FIG. 22B is a partial cross-sectional view schematically illustrating another example of a portion of a multilayer printed circuit board functioning as a substrate for a motherboard In a substrate for a motherboard 1420 illustrated in FIG. 22A, conductor circuits 1424 and insulating layers 1422 are formed and layered on both sides of a substrate 1421, and conductor circuits which sandwich the substrate 1421 are electrically connected via through holes 1429, and conductor circuits which sandwich the insulating layers 1422 are electrically connected through via holes (not shown).

Optical paths for transmitting an optical signal 1442 are provided in this substrate for a motherboard 1420 so as to penetrate through the substrate 1421 and the insulating layers 1122.

The optical paths for transmitting an optical signal 1442 are formed so that the end portions thereof protrude from the surface of an outermost insulating layer 1422.

In addition, outermost conductor circuits 1424a are formed on the outermost insulating layer 1422 so that the sides thereof make contact with the portion which protrudes from an optical path for transmitting an optical signal 1442 and so that the outermost conductor circuits 1424a have the same height as the portion which protrudes from the optical path for transmitting an optical signal 1442.

A solder resist layer 1434b which does not have a high transmittance is formed on an outermost layer on the side opposite to the side where an optical waveguide 1450 in the substrate for a motherboard 1420 is formed (upper in the figure) The optical path for transmitting an optical signal 1442, and openings for optical paths which are optically connected are formed on this solder resist layer 1434b. Here, the cross-sectional size of openings for optical paths may be, as illustrated in the figure, the same as, or larger or smaller than that thereof.

In addition, on the side where the optical waveguide 1450 in the substrate for a motherboard is formed (lower in the figure), a solder resist layer 1434a which does not have a high transmittance is formed on an outermost insulating layer 1422, and the optical waveguide 1450 of the required minimum size on whose both sides the optical path conversion mirrors 1453 are formed is formed on this solder resist layer 1434a. This optical waveguide 1450 consists of a core 1451 and a clad 1452.

In addition, a solder 1437 is formed on a solder resist layer 1434b.

In addition, an optical path for transmitting an optical signal comprising a resin composite is formed on the solder resist layer 1434a so as to penetrate through the solder resist layer 1434a.

Accordingly, in a substrate for a motherboard 1420, as a result, the height of the portion where an optical path for transmitting an optical signal protrudes from an outermost insulating layer is the same as or larger than that of an outermost conductor circuit 1424a.

Here, a cross-sectional diameter of the portion where the optical path for transmitting an optical signal penetrates through solder resist layers may be, as shown in the figure, the same as, or larger or smaller than that of the portion where the optical path for transmitting an optical signal penetrates through the substrate and insulating layers. Larger is desirable from the viewpoints of the easiness of formation and easiness of securing location accuracy.

In a substrate for a motherboard 1420 of this kind, as a result, optical signals from external package substrates and the like are transmitted to a package substrate and the like via openings for optical paths which are formed on a solder resist layer 1434b, an optical path for transmitting an optical signal 1442, an optical waveguide 1450, an optical path for transmitting an optical signal 1442, and openings for optical paths which are formed on the solder resist layer 1434b.

In addition, the shape of an optical waveguide forming a substrate for a motherboard 1420 illustrated in FIG. 22A is a shape on both of whose portion the optical path conversion mirrors are formed, but the shape of an optical waveguide forming the above described substrate for a motherboard is not limited to such a shape, and may be a shape of an optical waveguide 1550 illustrated in FIG. 22B, for example.

That is to say, an optical waveguide 1550 in sheet form comprising a core 1551 and a clad 1552 is formed on part of the solder resist layer 1434a, and furthermore, an optical waveguide may have the shape of an optical waveguide on which the optical path conversion mirrors 1553 have been formed by providing notches on part thereof.

In addition, in a substrate for a motherboard on which a solder resist layer which does not have a high transmittance is used as a solder resist layer illustrated in FIGS. 22A and 22B on the side where an optical waveguide is formed, the shape of the optical waveguide is not limited to that illustrated in FIGS. 22A and 22B, but may be that formed on the entirety of the solder resist layer illustrated in FIG. 21.

In addition, with regard to a substrate for a motherboard illustrated in FIGS. 22A and 22B, an optical path for transmitting an optical signal is formed so as to penetrate through solder resist layers on the side where an optical waveguide is formed, this portion is filled in with the same resin composite as has been provided to the portion which penetrates through the substrate of the optical path for transmitting an optical signal and insulating layers, and for example, the portion where the optical path for transmitting an optical signal penetrates through the solder resist layers may be filled in with the same materials as a lower clad (a resin composite for a clad) comprising an optical waveguide.

The process that the portion which penetrates through the solder resist layers is filled in with the resin composite can be omitted, and thereby, damages resulting from filling in the portion with the resin composite, hardening, polishing, and the like, especially the damages from polishing, which are all necessary for this process, are more likely to be removed.

Of course, the shape of an optical waveguide in a substrate for a motherboard illustrated in FIG. 5 and FIG. 21 may be the shape which has been formed on part of the insulating layer illustrated in FIGS. 22A and 22B, and in addition, the shape of an optical waveguide in a substrate for a motherboard illustrated in FIG. 6 may be not only the shape which is formed on part of the insulating layer, but also the shape which has been formed on the entirety of the insulating layer.

Next, a method for manufacturing a multilayer printed circuit board according to the embodiments of the present invention is described in the order of the processes.

Here, an example of a method for manufacturing a multilayer printed circuit board according to the embodiments using a multilayer printed circuit board according to the embodiments functioning as a package substrate is described.

In the method for manufacturing the above described multilayer printed circuit board, first, a multilayer circuit board where conductor circuits and insulating layers are formed and layered on both sides of a substrate is manufactured. The above described multilayer circuit board can be manufactured in accordance with a semi-additive method, a full additive method, a subtractive method, a collect layering method, a conformal method and the like. Here, an example of a method for manufacturing a multilayer circuit board using a semi-additive and subtractive method is described.

(1) An insulating substrate is prepared as a starting material, and first, conductor circuits are formed on this insulating substrate.

The above described insulating substrate is not particularly limited, and a glass epoxy substrate, a bismaleimide-triazine (BT) resin substrate, a copper covered multilayer board, a resin substrate such as an RCC substrate, a ceramic substrate such as an aluminum nitride substrate, a silicon substrate and the like can be cited as examples.

The above described conductor circuits can be formed by forming a conductor layer on the entirety of the surface of the above described insulating substrate in accordance with, for example, an electroless plating process, and afterward, carrying out an etching process.

In addition, through holes may be created for the connection between the conductor circuits which sandwich the above described insulating substrate. In addition, a coarse surface may be formed on the surface of the conductor circuits in accordance with an etching process and the like if necessary after the formation of the conductor circuits.

(2) Next, an insulating layer having openings for via holes is formed on the substrate on which the conductor circuits are formed.

The above described insulating layer may be formed of a thermosetting resin, a photosensitive resin, a resin where a photosensitive group is added to a portion of a thermosetting resin, a resin compound including any of these and a thermoplastic resin or the like.

Specifically, first, an uncured resin is applied using a roll coater, a curtain coater and the like, or a resin film is bonded through thermocompression so that a resin layer is formed, and afterward, a hardening process is carried out if necessary, and openings for via holes are created in accordance with a laser process or through exposure to light and development, and thus, an insulating layer is formed.

In addition, a resin layer made of the above described thermoplastic resin can be formed by bonding a resin mold in film form through thermocompression.

With regard to the above described thermosetting resin, an epoxy resin, a phenolic resin, a polyimide resin, a polyester resin, a bismaleimide resin, a polyolefin based resin, a polyphenylene ether resin, a polyphenylene resin, a fluorine resin and the like can be cited as examples.

An acrylic resin and the like can be cited as an example of the above described photosensitive resin.

In addition, with regard to the resin where a photosensitive group is added to a portion of the above described thermosetting resin, a resin gained by making the thermosetting group of any of the above described thermosetting resins and methacrylic acid or acrylic acid react with each other in order to bring about acrylic conversion, and the like can be cited as an example.

With regard to the above described thermoplastic resin, a phenoxy resin, polyether sulfone (PES), polysulfone (PSF), polyphenylene sulfone (PPS), polyphenylene sulfide (PPES), polyphenylene ether (PPE), polyether imide (PI) and the like can be cited as examples.

In addition, with regard to specific combinations in the above described resin compound, phenolic resin/polyether sulfone, polyimide resin/polysulfone, epoxy resin/polyether sulfone and epoxy resin/phenoxy resin can be cited as examples. In addition, with regard to combinations of a photosensitive resin and a thermoplastic resin, acrylic resin/phenoxy resin, epoxy resin where a portion of the epoxy group has been converted to acryl/polyether sulfone, and the like can be cited as examples.

In addition, it is desirable for the mixture ratio of the thermosetting resin or photosensitive resin in the above described resin compound to the thermoplastic resin to be thermosetting resin or photosensitive resin/thermoplastic resin=about 95/about 5 to about 50/about 50. This is because a high degree of toughness tends to be secured without losing resistance to heat.

In addition, the above described insulating layer may be formed of two or more different resin layers.

In addition, the above described insulating layer may be formed of a resin composite for the formation of a coarse surface.

As the above described resin composite for the formation of a coarse surface, a substance which is soluble in a coarsening liquid made of at least one selected from acid, alkali and an oxidant is dispersed in an uncured resin matrix which is heat-resistant and insoluble in a coarsening liquid made of at least one selected from among acid, alkali and an oxidant can be cited as an example.

Here, with regard to the above described words "insoluble" and "soluble," substances of which the rate of dissolution is relatively high in the case where the substance is immersed in the same coarsening liquid for the same period of time are referred to as "soluble" for the sake of convenience, and substances of which the rate of dissolution is relatively low are referred to as "insoluble" for the sake of convenience.

With regard to the above described resin matrix which is heat-resistant, resins which allow the form of the coarse surface to be maintained when the coarse surface is formed on the insulating layer using the above described coarsening liquid can be used, and a thermosetting resin, a photosensitive resin, a thermoplastic resin, a compound of these and the like can be cited as examples.

As the above described thermosetting resin, an epoxy resin, a phenolic resin, a polyimide resin, a polyolefin resin, a fluorine resin and the like can be cited as examples. In addition, in the case where the above described thermosetting resin is made photosensitive, methacrylic acid, acrylic acid or the like is used, and the thermosetting group reacts, so that (meth) acrylic conversion is brought about.

As the above described thermoplastic resin, a phenoxy resin, polyether sulfone, polysulfone, polyphenylene sulfone, polyphenylene sulfide, polyphenyl ether, polyether imide and the like can be cited as examples.

It is desirable for the above described soluble substance to be of at least one kind selected from inorganic particles, resin particles and metal particles.

As the above described inorganic particles, particles made of an aluminum compound, a calcium compound, a potassium compound, a magnesium compound, a silicon compound or the like can be cited as examples.

With regard to the above described resin particles, particles comprising a thermosetting resin, a thermoplastic resin or the like can be cited as examples, and the particles are not particularly limited, as long as the rate of dissolution is higher than the above described resin matrix which is heat-resistant when immersed in a coarsening liquid made of at least one selected from acid, alkali and an oxidant.

Here, it is necessary for a hardening process to be carried out in advance on the above described resin particles. This is because the above described resin particles dissolve in a solvent for solving a resin matrix which is heat-resistant, unless the particles are hardened in advance.

As the above described metal particles, particles comprising gold, silver, copper, tin, zinc, stainless steel, aluminum, nickel, iron, lead or the like can be cited as examples. In addition, the surface of the above described metal particles may be coated with a resin and the like, in order to secure insulating properties.

Phosphoric acid, hydrochloric acid, sulfuric acid, nitric acid, organic acids such as formic acid and acetic acid, and the like can be cited as the acid to be used as the above described coarsening liquid, and as the above described oxidant, chromic acid, a chromate acid mixture and solutions such as of alkaline permanganate (potassium permanganate) can be cited as examples, and sodium hydroxide, potassium hydroxide and the like can be cited as the above described alkali.

It is desirable for the average particle diameter in the above described soluble substance to be about 10 μm or less.

In addition, coarse particles of which the average particles diameter is relatively large and microscopic particles of which the average particle diameter is relatively small may be combined for use. A shallow and complex coarse surface can be formed by combining the two for use.

As the laser that is used in the above described laser process, a gas carbonate laser, an ultraviolet ray laser, an excimer laser or the like can be cited as examples. After the creation of openings for via holes, a desmear process may be carried out if necessary.

In addition, in this process, through holes for through holes may be formed if necessary.

(3) Next, if necessary, a conductor circuit in inner layers is formed on the surface of the insulating layer which includes the inner walls of the openings for via holes.

First, a method for forming conductor circuits in accordance with a semi-additive method is described.

Specifically, first, a thin film conductor layer is formed on the surface of the insulating layer through electroless plating, sputtering and the like, and then, a plating resist is formed on part of the surface, and afterward, an electrolytic plating layer is formed in the plating resist non-forming portion. Next, the plating resist and the thin film conductor layer beneath this plating resist are removed, so that a conductor circuit is formed.

As the material for the above described thin film conductor layer, copper, nickel, tin, zinc, cobalt, thallium, lead and the like can be cited as examples. It is desirable for the layer to be made of copper or copper and nickel, in order to gain excellent electrical properties and from an economical point of view.

In addition, it is desirable for the thickness of the above described thin film conductor layer to be at least about 0.1 μm and at most about 2.0 μm.

In addition, a coarse surface may be formed on the surface of the insulating layer before the formation of the above described thin film conductor layer.

The above described plating resist can be formed through exposure to light and development after a photosensitive dry film, for example, is pasted.

In addition, it is desirable for the thickness of the above described electrolytic plating layer to be at least about 5 μm and at most about 20 μm. Copper plating is desirable as the electrolytic plating for the formation of the above described electrolytic plating layer.

The above described plating resist may be removed using an etchant, for example, an alkaline solution, and the above described thin film conductor layer may be removed using an etchant, such as a mixed liquid of sulfuric acid and hydrogen peroxide, sodium persulfate, ammonium persulfate, ferric chloride or cupric chloride.

In addition, the catalyst on the insulating layer may be removed using acid or an oxidant if necessary after the formation of the above described conductor circuit. This is in order to prevent deterioration in the electrical properties.

In addition, the above described conductor circuit can be formed with the subtractive method.

In this case, thin film conductor layers are formed on the surface of the insulating layer with a method such as electroless plating, sputtering and the like, and then, if necessary, thickening of the conductor layers is carried out by means of electrolytic plating and the like.

After that, the conductor circuit is formed by forming an etching resist on part of the surface of the conductor layers and removing the conductor layers on the etching resist non-forming portion.

Here, when electrolytic plating, an etching process, and the like are carried out, for example, the same method as used in the semiadditive method can be used.

(4) Furthermore, in the case where the process of forming the conductor circuit in the above described process (3) is carried out, the above described process (2) is repeated, and insulating layers are formed in layers.

After that, the processes (3) and (2) may be repeated if necessary, and thereby, insulating layers and conductor layers are formed in layers.

(5) Next, with the formation of an outermost conductor circuit on an outermost insulating layer, an optical path for transmitting an optical signal whose end portion protrudes from the outermost insulating layer is formed.

Here, in forming an outermost conductor circuit, it is desirable for the outermost conductor circuit to be formed in the vicinity of an optical path for transmitting an optical signal comprising a resin composite which is formed through the subsequent process, and for the portion which protrudes from the optical path for transmitting an optical signal to be formed so as to make contact with the sides of the outermost conductor circuit.

In addition, it is desirable for the outermost conductor circuit to be formed so that the outermost conductor circuit has the same height as the portion which protrudes from the outermost insulating layer.

In addition, in forming the optical path for transmitting an optical signal in this process, a conductor layer may be formed on the wall surface of the optical path for transmitting an optical signal. In the case where the through hole for an optical path is filled with the resin composite after a desmear process is carried out if necessary on the wall surface of the through hole for an optical path without forming the conductor layer, a void is easily created in the resin composite, but the risk that a void is created becomes smaller by forming the above described conductor layer.

In addition, in the case where the above described conductor layer is formed, it is desirable for a coarsening process to be carried out on the surface thereof, and for the surface roughness Ra to be at least about 0.1 μm and at most about 5 μm in the case. It is because adhesiveness to the resin composite is improved as a result of carrying out a coarsening process (surface treatment).

Specifically, for example, by carrying out the below described processes ($a_1$) to ($a_4$), an outermost conductor circuit and an optical path for transmitting an optical signal can be formed.

($a_1$) First, a thin film conductor layer is formed on an outermost insulating layer with the same method as was used in the above described process (3), and afterward, if necessary, thickening of the conductor layer is carried out by means of electrolytic plating and the like.

($a_2$) Next, a through hole for an optical path is formed which penetrates through a substrate, insulating layers, and a conductor layers.

The above described through hole for an optical path is created in accordance with, for example, a drilling process, a router process, a laser process or the like.

As the laser used in the above described laser process, the same kinds of laser as can be used for the creation of the above described openings for via holes can be cited.

In the above described drilling process, it is desirable to use an apparatus with a function of recognizing recognition marks which reads recognition marks on a multilayer circuit board, corrects the point to be processed and carries out the drilling process.

The location for formation and size of the above described through hole for an optical path is not particularly limited, and an appropriate location for formation and size may be selected taking the design of the conductor circuits and the point where the IC chip, the optical elements and the like are mounted into consideration.

In addition, in the case where a through hole for an optical path in a form where a plurality of round pillars are aligned in parallel and certain portions on sides of round pillars which are adjacent to each other are connected is created in this process, it is desirable for the number of round pillars formed to be an odd number, and it is desirable to form round pillars which are not adjacent to each other in advance, and afterward, form round pillars between the round pillars which are not adjacent to each other, so that certain portions on the sides are connected.

This is because in the case where a round pillar is attempted to be formed in sequence so as to be adjacent to the previous round pillar with certain portions on the surface connected, the tip of the drill tends to shift in the direction of already created round pillar; that is, deviation is caused in the tip of the drill, and thus, the precision at the time of the drilling process may deteriorate.

In addition, a desmear process may be carried out on the wall surface of a through hole for an optical path if necessary after the creation of the through hole for an optical path.

A process using a solution of permanganate, a plasma process, a corona process and the like can be used for the above described desmear process. Here, resin residue, burrs and the like can be removed from the inside of a through hole for an optical path by carrying out a desmear process as described above, so that loss of transmission of an optical signal due to diffuse reflection of light from the wall surface of the completed optical path for transmitting an optical signal tends to be prevented from increasing.

In addition, a process for forming a coarse surface may be carried out in order to roughen the wall surface of a through hole for an optical path to if necessary after the creation of a through hole for an optical path, before filling the through hole with an uncured resin composite. This is because it may become easier for the adhesiveness between the wall surface and the resin composite to be increased.

The formation of a coarse surface as described above can be carried out using, for example, acid such as sulfuric acid, hydrochloric acid or nitric acid; oxidant such as chromic acid, a chromate acid mixture or permanganate, or the like. In addition, it can also be carried out in accordance with a plasma process or a corona process.

($a_3$) Next, the through hole for an optical path is filled in with a resin composite.

The through hole for an optical path is filled in with an uncured resin composite, and afterward, a hardening process is carried out, and thereby, the optical path for transmitting an optical signal whose end portion protrudes from the surface of an outermost insulating layer can be formed.

The specific method for filling the through hole with an uncured resin composite is not particularly limited, and a printing method, a potting method, or the like, for example, can be used.

Furthermore, it is desirable for the through hole to be filled in with the resin composite which is larger in quantity than the inner product of the through hole for an optical path, and afterward, for a hardening process to be carried out so that this resin composite can protrude from an outermost insulating layer. In addition, it is desirable for a polishing process to be carried out on the exposed surface of the protruded resin composite so that the protruded portion has the same height as the adjacent outermost conductor circuit.

The above described polishing process can be carried out through, for example, polishing using a buff, polishing using sandpaper and the like, polishing to a mirror surface, polishing to a clean surface, lapping and the like. In addition, chemical polishing using acid, an oxidant or other chemicals may be carried out. In addition, a polishing process may be carried out combining two or more from among these methods.

In addition, here, since a polishing process can be carried out on the entirety of the exposed surface of the circuit board including the exposed surface of the resin composite, the polishing member is not touched diagonally, and the flatness of the exposed surface of the resin composite is more likely to be secured.

($a_4$) Next, an etching resist can be formed on a conductor layer, and after that, by removing the conductor layer of the etching resist non-forming portion, an outermost conductor circuit can be formed.

Here, an etching process can be carried out with the same method as used in the above described process (3).

In addition, an outermost conductor circuit and an optical path for transmitting an optical signal can be formed in the below described processes ($b_1$) to ($b_4$).

($b_1$) First, a thin film conductor layer is formed on an outermost insulating layer with the same method as used in the above described process (3).

($b_2$) Next, a through hole for an optical path is formed so as to penetrate through a substrate, insulating layers, and thin film conductor layers.

The formation of the above described through hole for an optical path can be carried out with the same method as used in the above described process ($a_2$) and the like.

In addition, after forming the through hole for an optical path, with the same method as used in the above described process ($a_2$) and the like, before the through hole is filled in with an uncured resin composite in the below described process, if necessary, the process of forming a coarse surface which roughens the wall surface of the through hole for an optical path can be carried out. It is because adhesiveness to the resin composite tends to be improved.

($b_3$) Next, the through hole for an optical path is filled in with a resin composite.

After the through hole for an optical path was filled in with the uncured resin composite, an optical path for transmitting an optical signal whose end portion protrudes from the surface of an outermost insulating layer can be formed by carrying out a hardening process. The method for filling in the through hole with the uncured resin composite is not particularly limited, the same method as used in the above described process ($a_3$) and the like can be used.

Furthermore, in this process, it is desirable for the through hole for an optical path to be filled in with the resin composite which is larger in quantity than the inner product of the through hole for an optical path in the same manner as in the above described process ($a_3$), and after that, for a hardening process to be carried out so that this resin composite protrudes from the surface of the outermost insulating layer.

In addition, it is also desirable for a polishing process to be carried out on the exposed surface of the protruded resin composite, and a polishing process is preferably carried out so that the protruded portion has the same height as the thin film conductor layer. Also in this case, flatness tends to be secured in the same manner as in the above described process ($a_3$).

The above described polishing process can be carried out with the method as used in the above described process ($a_3$).

($b_4$) Next, a plating resist is formed on part of the above described thin film conductor layer, and after that, an electrolytic plating layer is formed on the plating resist non-forming portion. Next, by removing the plating resist and the thin film conductor layer beneath the plating resist, an outermost conductor circuit can be formed.

As specific methods for forming the above described plating resist, electrolytic plating layers, thin film conductor layers, and the like, the same method as used in the above described process (3) and the like can be used.

(6) Next, a solder resist layer is formed as an outermost layer of the multilayer circuit board in which a through hole for an optical path is formed.

The above described solder resist layer can be formed by carrying out a hardening process after an uncured solder resist composition has been applied to the multilayer circuit board, or making a film made of the above described solder resist composition adhere to the multilayer circuit board through pressure, and if necessary, carrying out a hardening process.

In addition, in this process, in the case where a solder resist layer not having a high transmittance as a solder resist layer is formed, openings for optical paths which can function as an optical path for transmitting an optical signal are formed upon the formation of a solder resist layer. Here, in the case where a transparent solder resist layer is formed, it is not necessary to form openings for optical paths.

The above described openings for optical paths can be formed through, for example, exposure to light and development after application of the above described solder resist composition.

In addition, upon the formation of openings for optical paths, openings for forming solder bumps (openings for mounting an IC chip and an optical element) may be formed. Of course, the openings for optical paths and the openings for forming solder bumps may be formed separately.

In addition, when a solder resist layer is formed, a resin film having openings at desired positions is manufactured in advance, and the solder resist layer having openings for optical paths and openings for forming solder bumps may be formed by pasting this resin film to the multilayer circuit board.

In addition, as a multilayer printed circuit board according to the embodiments of the present invention, it is desirable to use the below described method in the case where the multilayer printed circuit board is manufactured where the surface of an end portion of an optical path for transmitting an optical signal and the surface of a solder resist layer are made in the same plane.

That is to say, in the above described process (5), the process of forming the optical path for transmitting an optical signal is not carried out, and after forming a solder resist layer in the present process, a through hole for an optical path which penetrates through a substrate, insulating layers, and solder resist layers is formed.

After that, the process of filling in a through hole for an optical path with an uncured resin composite, a hardening process of a resin composite, and a polishing process of the resin composite are carried out. Here, each of these processes can be carried out with the same method as used in the process (5) and the like.

In addition, in the case where a solder resist layer is formed in the present process, a solder resist layer with two layers or more may be formed.

Here, as described above, in the case where a multilayer printed circuit board is manufactured where the surface of an end portion of the optical path for transmitting an optical signal and the surface of the solder resist layer are made in the same plane, and in the case where a solder resist layer with two layers is formed, the surface of the first (lower) solder resist layer and an end portion of the optical path for transmitting an optical signal may be made in same plane.

(7) Next, a micro lens is provided on top of the solder resist layer if necessary. Here, the micro lens may be provided on the solder resist layer in the case where a transparent solder resist layer is formed as the above described solder resist layer, and the micro lens may be provided inside openings for optical paths in the case where openings for optical paths are formed on the solder resist layer.

In addition, in the case where a micro lens is provided, a surface treatment, such as a process using a water repellent coating material, a water repellant process using $CF_4$ plasma, or a hydrophilic process using $O_2$ plasma, may be carried out in advance in the portion where the micro lens is provided. The form of the micro lens, in particular the degree of sagging, may easily become uneven, depending on the wettability in the portion where the above described micro lens is provided, but the unevenness in the degree of sagging is more likely to be reduced by carrying out a surface treatment.

A specific method for the surface treatment described above is briefly described.

In the case where a process is carried out using a water repellent coating agent as described above, first, a mask having an opening in a portion which corresponds to the portion where the micro lens is to be formed is provided, and after that, a water repellent coating agent is applied through spraying or using a spin coater, and afterward, the water repellent coating agent is naturally dried and the mask is peeled off, and thereby, the surface treatment is completed. Here, the thickness of the water repellent coating agent layer is usually approximately 1 μm. Here, a mesh plate or a mask where a resist is formed may be used.

Here, in the case where a process is carried out using a water repellent coating agent, a process using a water repellent coating agent may be carried out on the entirety of the solder resist layer without using a mask.

In addition, in the case where a water repellent process is carried out using $CF_4$ plasma as described above, first, a mask having an opening in a portion which corresponds to the portion of the solder resist layer where the micro lens is to be formed is made, and after that, a $CF_4$ plasma process is carried out, and furthermore, the mask is peeled off, and thereby, the surface treatment is completed. Here, a mask where a resist is formed may be used.

In addition, in the case where a hydrophilic process is carried out using the above described $O_2$ plasma, first, a mask having an opening in a portion which corresponds to the portion of the solder resist layer where the micro lens is to be formed is made, and after that, an $O_2$ plasma process is carried out, and furthermore, the mask is peeled off, and thereby, the surface treatment is completed. Here, a metal plate or a mask where a resist is formed may be used.

In addition, it is desirable to carry out the above described water repellent process (including a process using a water repellent coating agent) and a hydrophilic process in combination.

In addition, the above described micro lens may be provided directly or with an optical adhesive in between.

As the method for providing a micro lens directly on top of the solder resist layer as described above, a method for dropping an appropriate amount of uncured resin for an optical lens onto the resin composite and carrying out a hardening process on this uncured resin for an optical lens that has been dropped can be cited, for example.

In the above described method, when dropping an appropriate amount of uncured resin for an optical lens onto the solder resist layer, an apparatus such as a dispenser, an inkjet, a micro pipette, a micro syringe or the like can be used. In addition, the uncured resin for an optical lens that has been dropped onto the solder resist layer using such an apparatus tends to be spherical, due to its surface tension, and therefore, it becomes of a hemispherical form on top of the solder resist layer, and afterward, a hardening process is carried out on the uncured resin for an optical lens in hemispherical form, and thereby, a micro lens in hemispherical form can be formed on top of the solder resist layer.

Here, the form of the micro lens that is formed in this manner, including the diameter and the curve, tends to be controlled by adjusting the viscosity and the like of the uncured resin for an optical lens to an appropriate degree taking the wettability of the solder resist layer for the uncured resin for an optical lens into consideration.

(8) Next, solder pads and solder bumps are formed in accordance with the following method, and furthermore, an optical element is mounted.

That is to say, the portions of the conductor circuit that have been exposed from the above described openings for the formation of solder bumps are coated with an anti-corrosive metal, such as nickel, palladium, gold, silver or platinum, if necessary, so that solder pads are formed.

The above described coating layer can be formed through, for example, plating, vapor deposition or electrolytic deposition, and from among these, formation through plating is desirable, in order to gain high uniformity in the coating layer. Here, the solder pads may be formed before the above described process for providing a micro lens.

Furthermore, the space for the above described solder pads is filled in with a solder paste using a mask where openings are created in portions which correspond to the above described solder pads, and afterward, the solder bumps are formed through reflow. In addition, gold bumps may be formed instead of solder bumps.

Furthermore, an optical element (light receiving element or light emitting element) is mounted on the solder resist layer. The optical element can be mounted with, for example, the above described solder bumps in between. In addition, when the above described solder bumps are formed, for example, an optical element is attached at the point in time when the space is filled in with the solder paste, and the optical element may be mounted during reflow. In addition, the composition of the solder used here is not particularly limited, and any composition, including Sn/Pb, Sn/Pb/Ag, Sn/Ag/Cu, Sn/Cu, and the like may be used.

In addition, the optical element may be mounted using a conductor adhesive and the like instead of solder.

(9) Next, a gap adjacent to the above described optical element on the above described substrate side is filled in with an underfill if necessary. Here, conventionally well-known methods for underfill filling can be used.

The multilayer printed circuit board functioning as a package substrate according to the present invention may be manufactured more easily by carrying out these processes.

In addition, a multilayer printed circuit board according to the embodiments of the present invention can be manufactured in accordance with the following method in the case where it is a package substrate where an optical path for transmitting an optical signal in recess form is formed.

That is to say, first, in the same manner as in the processes (1) to (4) described above, a conductor circuit and an insulating layer are formed and layered on a substrate. After that, a recess form which is to be an optical path for transmitting an optical signal is formed by carrying out spot facing on the above described insulating layer.

Next, a conductor circuit is exposed from the bottom of the above described recess, and the coating layer is formed on the exposed portion if necessary, and afterward, an optical element and an IC chip are mounted on the bottom through flip chip bonding, wire bonding or the like.

Next, the above described recess is filled in with a resin composite and outermost conductor circuits are formed with the same method as in the above described process (5), and furthermore, an appropriate solder resist layer is formed, an appropriate micro lens is provided, and appropriate solder bumps are formed in the same manner as in the above described processes (6) to (8), and thereby, a package substrate where an optical path for transmitting an optical signal in recess form as described above is formed may be manufactured more easily.

In addition, the method for manufacturing a multilayer printed circuit board according to the embodiments functioning as a substrate for a motherboard is briefly described.

In the case where a multilayer printed circuit board according to the embodiments functioning as a substrate for a motherboard is manufactured, (1) first, conductor circuits are formed on both sides or on one side of a substrate in the same manner as in the process (1) in the method for manufacturing a package substrate according to the present invention, and if necessary, through holes for connecting conductor circuits which sandwich the substrate with each other are created. In addition, in this process as well, if necessary, a coarse surface may be formed on the surface of the conductor circuit or on the wall surface of the through holes.

(2) Next, if necessary, insulating layers and conductor layers are formed and layered on top of the substrate on which the conductor circuits are formed.

Specifically, the insulating layers and the conductor layers may be formed and layered in accordance with the same method as that which includes processes (2) and (5) in the method for manufacturing a substrate for mounting an IC chip according to the present invention.

Here, this process of layering an insulating layer and a conductor circuit may be carried out only once or may be repeated a plurality of times.

Here, in forming outermost conductor circuits, in the same manner as in a method for manufacturing a package substrate explained above, the outermost conductor circuits are formed on an outermost insulating layer, and an optical path for transmitting an optical signal whose end portion protrudes from the surface of the outermost insulating layer is formed.

Here, in forming the outermost conductor circuit, it is desirable for the outermost conductor circuits to be formed in the vicinity of the optical path for transmitting an optical signal comprising a resin composite which is formed through the subsequent process, and for the portion which protrudes from the optical path for transmitting an optical signal to be formed in such a position so as to make contact with the sides of the outermost conductor circuits.

In addition, it is desirable for an outermost conductor circuit to be formed so that the outermost conductor circuit has the same height as the portion which protrudes from an outermost insulating layer.

(3) Next, an optical waveguide is formed in a predetermined location on top of the substrate and/or the insulating layer (which may be a portion or the entirety of the insulating layer) in accordance with the design. Here, in the case where an optical waveguide is formed on a solder resist layer as described above, a solder resist layer is formed in the post-processing, and afterward, an optical waveguide may be formed on this solder resist layer.

In the case where the above described optical waveguide is formed using an inorganic material such as silica glass as the material thereof, an optical waveguide that has been formed in a predetermined form can be attached via an optical adhesive.

In addition, the above described optical waveguide comprising an inorganic material can be formed through film formation of an inorganic material such as $LiNbO_3$ or $LiTaO_3$ in accordance with a liquid phase epitaxial method, a chemical deposition method (CVD), a molecular beam epitaxial method or the like.

In addition, as the method for forming an optical waveguide of a polymer material, (1) a method for pasting a film for forming an optical waveguide, which has been formed in film form on top of a mold release film in advance, to the top of an insulating layer, (2) a method for forming an optical waveguide directly on top of an insulating layer by sequentially forming and layering a lower clad, a core and an upper clad on top of the above described insulating layer, and the like can be cited.

Here, the same method can be used as the method for forming an optical waveguide in the case where an optical waveguide is formed on a mold release film and in the case where an optical waveguide is formed on the insulating layer.

Specifically, a method using reactive ion etching, a process including exposure to light and development, a die forming method, a resist forming method, a method where these are combined or the like can be used.

In the above described method using reactive ion etching, (i) first, a lower clad is formed on top of a mold release film or an insulating layer (hereinafter, simply referred to as a mold release film and the like), and (ii) next, a resin composite for a core is applied to the top of this lower clad, and furthermore, a hardening process is carried out, if necessary, and thereby, a resin layer for forming a core is provided. (iii) Next, a resin layer for forming a mask is formed on top of the above described resin layer for forming a core, and then a process including exposure to light and development is carried out on this resin layer for forming a mask, and thereby, a mask (etching resist) is formed on top of the resin layer for forming a core.

(iv) Next, reactive ion etching is carried out on the resin layer for forming a core, and thereby, the resin layer for forming a core on the mask non-forming portion is removed; and a core is formed on top of the lower clad by leaving alone a resin for forming a core present beneath the mask. (v) Finally, an upper clad is formed on top of the lower clad so as to cover the above described core, and thus, an optical waveguide is provided.

According to this method using reactive ion etching, an optical waveguide having excellent reliability in the dimension tends to be formed. In addition, this method is also excellent in reproducibility.

In addition, in the process including exposure to light and development, (i) first, a lower clad is formed on top of a mold release film and the like, and (ii) next, a resin composite for a core is applied to the top of this lower clad, and furthermore, a hardening process is carried out, if necessary, and thereby, a resin composite layer for forming a core is formed.

(iii) Next, a mask where a pattern is drawn corresponding to the portion where the core is to be formed is placed on top of the layer of the above described resin composite for forming a core, and afterward, a process including exposure to light and development is carried out, and thereby, a core is formed on top of the lower clad. (iv) Finally, an upper clad is formed on top of the lower clad so as to cover the above described core, and thus, an optical waveguide is provided.

This process, including exposure to light and development, has a small number of processes, and therefore, can be appropriately used when an optical waveguide is mass produced, and in addition, this process has a small number of heating processes, and therefore, stress tends not to occur in the optical waveguide.

In addition, in the above described die forming method, (i) first, a lower clad is formed on top of a mold release film, and (ii) next, a trench for forming a core is created in the lower clad through die formation. (iii) Furthermore, the above described trench is filled in with a resin composite for a core through printing, and afterward, a core is formed by carrying out a hardening process. (iv) Finally, an upper clad is formed on top of the lower clad so as to cover the above described core, and thus, an optical waveguide is provided.

This die forming method can be appropriately used when an optical waveguide is mass produced, and an optical waveguide having excellent reliability in the dimension may be formed more easily. In addition, this method is excellent in reproducibility.

In addition, according to the above described resist forming method, (i) first, a lower clad is formed on top of a mold release film and the like, and (ii) furthermore, a resin composite for a resist is applied to the top of this lower clad, and afterward, a process including exposure to light and development is carried out, and thereby, a resist for forming a core is formed in the core non-forming portion on top of the above described lower clad.

(iii) Next, a resin composite for a core is applied to the resist non-forming portion on top of the lower clad, and (iv) furthermore, the resin composite for a core is hardened, and afterward, the above described resist for forming a core is peeled off, and thereby, a core is formed on top of the lower clad. (v) Finally, an upper clad is formed on top of the lower clad so as to cover the above described core, and thus, an optical waveguide is provided.

This resist forming method can be appropriately used when an optical waveguide is mass produced, and an optical waveguide having excellent reliability in the dimension may be formed more easily. In addition, this method is also excellent in reproducibility.

In the case where an optical waveguide is formed of a polymer material using these methods, and an optical waveguide where particles are mixed into the core is formed, a mold forming method is desirable in comparison with a process including exposure to light and development. The reason for this is as follows.

That is to say, this is because in the case where a trench for forming a core is created in the lower clad through die formation, and afterward, a core is formed within this trench in accordance with a die forming method for forming a core, all of the particles that are to be mixed into the core are contained in the core, and therefore, the surface of the core becomes flat, providing excellent transmissivity of an optical signal; whereas in the case where the core is formed in a process including exposure to light and development, portions of the particles may extrude from the surface of the core or recesses, from which particles may be removed are created on the surface of the core, and thus, the surface of the core may sometimes become uneven, and this unevenness prevents light from being reflected in a desired direction, and as a result, the transmissivity of an optical signal may drop.

In addition, optical path conversion mirrors are formed in the above described optical waveguide.

Though the above described optical path conversion mirrors may be formed before the optical waveguide is attached to the insulating layer or may be formed after the optical waveguide has been attached to the insulating layer, it is desirable to form the optical path conversion mirrors in advance, except for the case where the optical waveguide is directly formed on top of the insulating layer. This is because the process can be easily carried out, and there is no risk where other members which form the multilayer printed circuit board, the substrate, the conductor circuits and the insulating layers may be scratched or damaged during the process.

The above described method for forming an optical path conversion mirror is not particularly limited, and conventionally well-known methods for formation can be used. Specifically, a physical process using a diamond saw or a blade, of which the edge is in a V shape at about 90 degrees, a process using reactive ion etching and laser aberration can be used. In addition, optical path conversion members may be embedded instead of the formation of optical path conversion mirrors.

In addition, in the case where optical path conversion mirrors at about 90 degrees are formed in the optical waveguide, the angle formed between the surface where the lower clad makes contact with the substrate or the insulating layer and the optical path conversion surface may be about 45 degrees or about 135 degrees.

In addition, in the case where an optical waveguide is formed in this process, as a result of the design of the substrate for a motherboard, an outermost conductor circuit is formed on a region where an optical waveguide is formed on an outermost insulating layer in some cases.

In this case, it is desirable to form an optical waveguide by means of the below described method. It is because it may become unlikely for an optical waveguide to be affected by the unevenness of an optical waveguide forming region as a result of the presence of an outermost conductor circuit and it may become easier to form an optical waveguide.

That is to say, in the case where a film for forming an optical waveguide which has been shaped for a film is pasted on the insulating film, it is desirable for a region where an outermost conductor circuit non-forming region on an outermost insulating layer to be filled in with a resin composite so as to be in the same height as this outermost conductor circuit. It is because when a film for forming an optical waveguide is pasted, this film is to be pasted on a flat region, and waviness and the like tend to be prevented from occurring in the optical waveguide formed thereby.

Here, the resin composite with which an outermost conductor circuit non-forming region is filled in is not particularly limited, but a clad material and the like can be cited, for example.

In addition, in the case where an optical waveguide is directly formed on the above described insulating layer and the like by forming and layering a lower clad, a core, and an upper clad in a sequence, it is desirable for the resin composite for a clad to be applied so that the thickness of a lower clad is larger than the height of the conductor circuit in the process of forming a lower clad, and after that, for the process of flattening the surface of a lower clad to be carried out. It is because waviness and the like tend to be prevented from occurring in the optical waveguide formed thereby though this process.

Here, though a method for forming an optical waveguide on top of the substrate or an outermost insulating layer is described, in the case where the above described multilayer printed circuit board is manufactured, the above described optical waveguide may sometimes be formed between the substrate and the insulating layer or between the insulating layers.

In the case where an optical waveguide is formed between the substrate and the insulating layer, a substrate where conductor circuits are formed on both sides thereof is manufactured in the above described process (1), and afterward, an optical waveguide is formed in a conductor circuit non-forming portion on top of the substrate in accordance with the same method as in the above described process (3), and subsequently, an insulating layer is formed in accordance with the same method as in the above described process (2), and thereby, an optical waveguide can be formed in the above described location.

In addition, in the case where an optical waveguide is formed between insulating layers, at least one insulating layer is formed and layered on top of a substrate where conductor circuits are formed in the same manner as in the above described processes (1) and (2), and afterward, an optical waveguide is formed on top of the insulating layer in the same manner as in the above described process (3), and subsequently, the same process as the above described process (2) is additionally repeated, and thereby, an optical waveguide can be formed between the insulating layers.

(4) After that, just as a multilayer printed circuit board functioning as a package substrate is manufactured, a substrate for a motherboard can be manufactured by forming an outermost solder resist layer, openings for optical paths functioning as an optical path for transmitting an optical signal, solder bumps, and the like, and providing micro lens.

In addition, in some cases, by forming an optical waveguide on the entirety of the outermost layer of a substrate in the above described process (3), the optical waveguide may function as a solder resist layer.

In addition, as described above, in the case where an optical waveguide is formed on a solder resist layer, the optical waveguide on a solder resist layer may be formed after forming the solder resist layer in this process.

In addition, in the case where the optical waveguide is formed on the solder resist layer, it is desirable for the solder resist layer which has a high transmittance as a solder resist layer to be formed. It is because the formation of the optical path for transmitting an optical signal which penetrates through the solder resist layer is not necessary, and it can be manufactured easily.

By carrying out the above described method, a multilayer printed circuit board according to the embodiments of the present invention functioning as a package substrate and a substrate for a motherboard may be manufactured more easily.

In addition, by mounting the above described multilayer printed circuit board according to the embodiments of the present invention functioning as a package substrate on the multilayer printed circuit board according to the embodiments of the present invention functioning as a substrate for a motherboard via solder bumps, a device for optical communication enabling transmission of an optical signal between package substrates tends to be obtained.

Taking a substrate for mounting an IC chip disclosed in JP-A2002-329891 into consideration, though the above described substrate for mounting an IC chip disclosed in this official gazette was more likely to sufficiently adapt to the miniaturization of terminal apparatuses and the like, transmission loss sometimes became large at the time of transmission of optical signals.

In the following, the reasons for this are briefly described in reference to the drawings.

FIGS. 7A and 7D are partial cross-sectional views schematically illustrating part of a process of manufacturing a conventional substrate for mounting an IC chip (multilayer printed circuit board).

When a conventional substrate for mounting an IC chip (multilayer printed circuit board) is manufactured, after conductor circuits 624 and insulating layers 622 are formed and layered on a substrate and the conductor circuits 624a are formed as an outermost layer, a through hole for an optical path is formed so as to penetrate through a substrate (not shown) and the insulating layers 622, and this through hole for an optical path is filled with a resin composite 647.

Here, when the through hole for an optical path is filled in with the resin composite, it is filled in with the amount of a resin composite 647a which spills out of the through hole for an optical path (see FIG. 7A), and afterward, the process of removing the resin composite which has spilled out of the through hole for an optical path.

However, in the case where a through hole for an optical path is filled in with a resin composite with such a method, the following inconveniences sometimes occurred. Specifically, for example, (1) After the through hole for an optical path was filled in with a resin composite 647, extra resin composite 647a was polished and removed, but since conductor circuits 624a were formed as an outermost layer in the vicinity of the extra resin composite 647a which overflowed, with regard to the polishing of this resin composite 647a, it was necessary to partially polish the portion out of which the resin composite 647 flowed with a polishing apparatus of which the edge was fine and flat. However, with such a polishing method, it took time to carry out a polishing process, and polishing members such as polishing hone and polishing paper which were attached to an end portion of the polishing apparatus sometimes touched the resin composite diagonally, as illustrated in FIG. 7B, an end portion of the resin composite 647 with which a through hole for an optical path was filled in was polished, in some cases, even part of the insulating layer was polished and the surface of the insulating layer was scratched. In addition, because an end portion of the resin composite was polished diagonally, part of the insulating layer was polished, and cracks and the like sometimes occurred from these portions in a substrate for mounting an IC chip (multilayer printed circuit board) which was manufactured with scratches thereon, the reliability was not excellent. Especially, cracks occurred easily in the reliability test.

In addition, in the above described polishing process (2), in the case where attempts were made to prevent the resin composite 647a from being polished diagonally and the surface of the insulating layer from being scratched, by contraries, a resin composite sometimes remained on the surface of an outermost insulating layer 622 due to insufficient polishing (see FIG. 7C). In addition, in some cases, the resin composite 647a remained on the surface and sides of the conductor circuits 624a.

As thus described, in the case where the portion occurred where the resin composite 647a was not polished and removed, and furthermore, solder resist layers were formed and layered, since the adhesive force of the solder resist layers differed between a portion on which the resin composite 647a remained and the portion on which it did not (the adhesive force of the portion on which the resin composite 647a remained was small), in a heat treatment process and the like after the solder resist layer was formed, separations (peeling) sometimes occurred from the portion whose adhesive force was small, and the reliability of the obtained substrate for mounting an IC chip (multilayer printed circuit board) was not sufficient. In addition, when the resin composite 647a remained on the conductor circuits 624a, a failure for the conductor circuits 624a to electrically connect electrode pads and the like even after the formation thereof on the portion sometimes resulted in poor connection.

In addition, depending on the above described polishing process (3), there were cases where part of outermost layers of the conductor circuits 624a as well as the resin composite 647a was polished (see FIG. 7D), and thereby there occurred an inconvenience that electrodes became thin or disappeared.

In a multilayer printed circuit board of according to the embodiments of the present invention, since an optical path for transmitting an optical signal comprising a resin composite is formed and an end portion of this optical path for transmitting an optical signal protrudes from the surface of the outermost insulating layer, when the multilayer printed circuit board according to the embodiments of the present invention is manufactured, the optical path for transmitting an optical signal comprising the resin composite tends not to be polished diagonally, and a resin composite forming the optical path for transmitting an optical signal tends not to remain on the insulating layer and conductor circuits.

Therefore, in the multilayer printed circuit board according to the embodiments of the present invention, cracks tend not to occur on the optical path for transmitting an optical signal and the insulating layer, when the solder resist layer is formed, separations (peeling) of this solder resist layer and disconnection of conductor circuits and the like tend not to occur. When optical signals are transmitted via the optical path for transmitting an optical signal, transmission loss is small, and the transmission performance of an optical signal tends to be excellent, more easily leading to excellent electric reliability.

EXAMPLES

In the following, the present invention is described in further detail.

Example 1

A. Manufacture of Resin Film for Insulating Layer 30 parts by weight of bisphenol A type epoxy resin (equivalent of epoxy 469, Epikote 1001, made by Yuka Shell Epoxy K.K.), 40 parts by weight of cresol novolac type epoxy resin (equivalent of epoxy 215, Epiclon N-673, made by Dainippon Ink and Chemicals, Incorporated) and 30 parts by weight of phenol novolac resin containing triazine structure (equivalent of phenolic hydroxy group 120, Phenolite KA-7052, made by Dainippon Ink and Chemicals, Incorporated) were heated and melted in 20 parts by weight of ethyl diglycol acetate and 20 parts by weight of a naphtha solvent while stirring, to which 15 parts by weight of polybutadiene rubber with a terminal converted to epoxy (DENAREX R-45EPT, made by Nagase Chemicals Ltd.), 1.5 parts by weight of crushed 2-phenyl-4, 5-bis(hydroxymethyl)imidazole, 2 parts by weight of finely crushed silica and 0.5 parts by weight of a silicone based antifoaming agent were added, and thus, an epoxy resin composite was prepared.

The gained epoxy resin composite was applied to the top of a PET film having a thickness of 38 μm using a roll coater, so that the thickness after drying became 50 μm, was dried for ten minutes at 80° C. to 120° C. and thereby, a resin film for an insulating layer was manufactured.

B. Preparation of Resin composite with which Through Hole is Filled 100 parts by weight of a bisphenol F type epoxy monomer (YL983U, made by Yuka Shell Epoxy K.K., molecular weight: 310), 170 parts by weight of $SiO_2$ particles in spherical form (CRS 1101-CE, made by ADTEC Corporation) of which the surface is coated with a silane coupling agent, the average particle diameter is 1.6 μm and the diameter of the largest particles is 15 μm or less, and 1.5 parts by weight of a leveling agent (Perenol S4, made by San Nopco Limited) were put in a container and mixed through stirring, and thereby, a resin filler of which the viscosity is 45 Pa·s to 49 Pa·s at 23±1° C. was prepared. Here, 6.5 parts by weight of an imidazole hardening agent (2E4MZ-CN, made by Shikoku Chemicals Corporation) were used as a hardening agent.

Figure 8A:
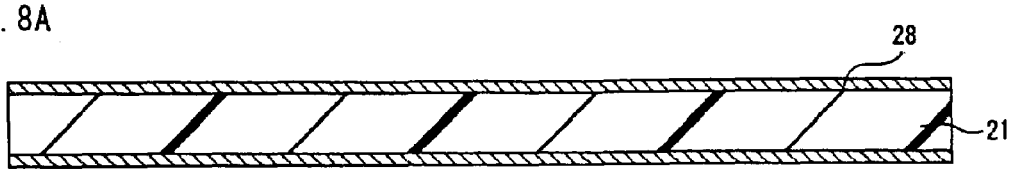
FIGS. 8A to 8F are partial cross-sectional views schematically illustrating part of a method for manufacturing a multilayer printed circuit board according to one embodiment of the present invention.

C. Manufacture of Package Substrate (1) A copper pasted multilayer plate where copper foil 28 having a thickness of 18 μm is laminated on both sides of an insulating substrate 21 made of a glass epoxy resin or a BT (bismaleimide triazine) resin having a thickness of 0.8 mm was used as a starting material (see FIG. 8A). First, holes were drilled in this copper pasted multilayer plate, an electroless plating process was carried out, and etching was carried out so as to form a pattern, and thus, conductor circuits 24 were formed on both sides of the substrate 21 and a through hole 29 was formed.

Figure 8B:
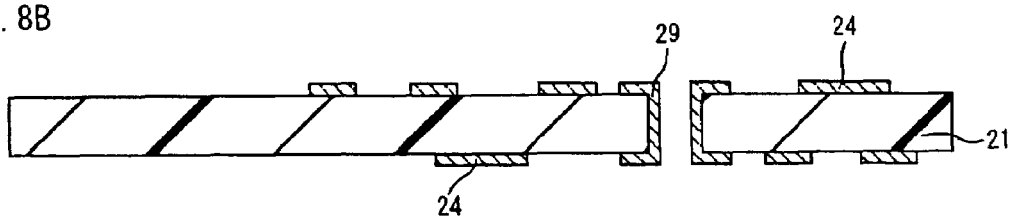

(2) The substrate where the through hole 29 and the conductor circuits 24 were formed was washed with water and dried, and afterward, a blackening process using a solution including NaOH (10 g/l), $NaClO_2$ (40 g/l) and $Na_3PO_4$ (6 g/l) for a blackening bath (oxidation bath) and a reduction process using a solution including NaOH (10 g/l) and $NaBH_4$ (6 g/l) for a reduction bath were carried out, and a coarse surface (not shown) was formed on the surface of the conductor circuits 24, including the through hole 29 (see FIG. 8B).

(3) After the preparation of the resin filler described in the above B, a layer of a resin filler 30' was formed in a conductor circuit non-forming portion within the through hole 29 and on one side of the substrate 21, as well as on the outer periphery portion of the conductor circuits 24 within 24 hours.

Figure 8C:
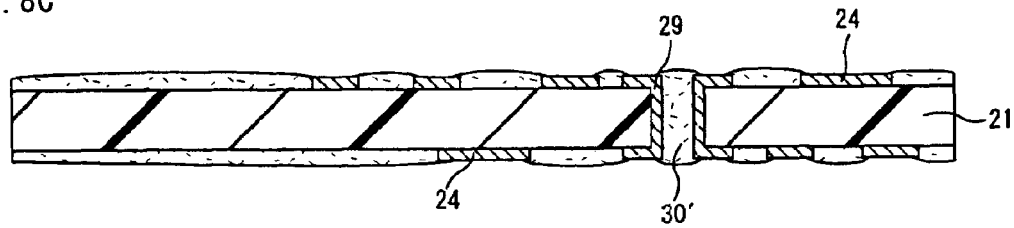

That is to say, first, a squeegee was used to push the resin filler into the through hole, and afterward, the resin filler was dried under conditions of 100° C. for 20 minutes. Next, a mask having openings in portions corresponding to the conductor circuit non-forming portion was placed on the substrate and the conductor circuit non-forming portion in recess form were filled in with a resin filler using a squeegee, and the resin filler was dried under conditions of 100° C. for 20 minutes, and thereby, a layer of resin filler 30' was formed (see FIG. 8C).

(4) One side of the substrate after the above described process (3) was polished through belt sander polishing using belt polishing paper #600 (made by Sankyo Rikagaku Co., Ltd.), so that no resin filler 30' was left on the surface of the conductor circuits 24 or the land surface of the through hole 29, and then, buff polishing was carried out in order to remove scratches created as a result of the above described belt sander polishing. This polishing sequence was carried out in the same manner on the other side of the substrate.

Next, heat treatment was carried out for one hour at 100° C., three hours at 120° C., one hour at 150° C. and seven hours at 180° C., and thereby, a resin filler layer 30 was formed.

Figure 8D:
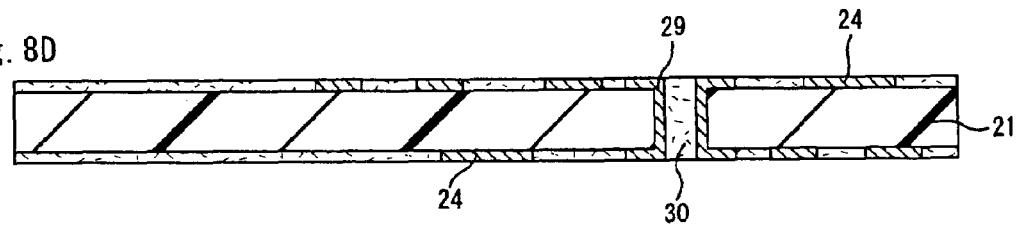

In this manner, an insulating substrate was gained, where the surface layer portion of the resin filler layer 30 formed in the through hole 29 and in conductor circuit non-forming portions, and the surface of the conductor circuits 24 are flattened, the resin filler layer 30 and the sides of the conductor circuits 24 adhered firmly to each other via the coarse surface (not shown), and the inner wall surface of the through hole 29 and the resin filler layer 30 adhered firmly to each other via the coarse surface (not shown) (see FIG. 8D). In this process, the surface of the resin filler layer 30 and the surface of the conductor circuits 24 were made in the same plane.

(5) The above described substrate was washed with water and the fat was removed with acid, and afterward, soft etching was carried out, and then, an etchant was sprayed onto both sides of the substrate so that the surface of the conductor circuit 24, and the land surface and inner wall of the through hole 29 were etched, and thereby, a coarse surface (not shown) was formed on the entirety of the surface of the conductor circuit 24. As the etchant, an etchant including 10 parts by weight of a imidazole copper (II) complex, 7 parts by weight of glycolic acid and 5 parts by weight of potassium chloride (MECetchBOND, made by MEC Co., Ltd.).

Figure 8E:
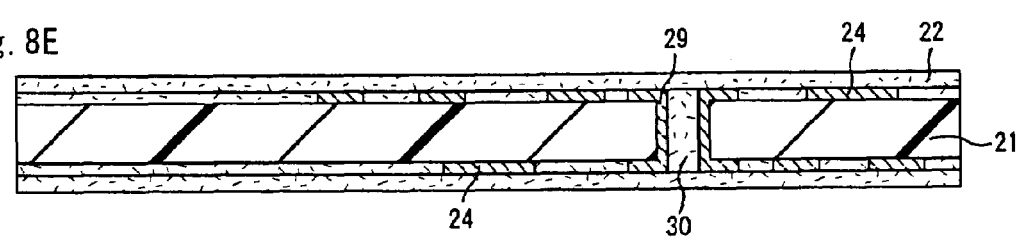

(6) Next, resin films for an insulating layer which are a little larger than the substrate prepared in the above described A were placed on the substrate and temporarily bonded thereto under pressure under such conditions that the pressure was 0.4 MPa, the temperature was 80° C. and the time for pressing was 10 seconds, and the edges were trimmed, and afterward, two other films were pasted using a vacuum laminating apparatus in accordance with the following method, and thereby, insulating layers 22 were formed (see FIG. 8E).

That is to say, resin films for an insulating layer were permanently bonded to the substrate under pressure under such conditions that the degree of vacuum was 65 Pa, the pressure was 0.4 MPa, the temperature was 80° C. and the time for pressing was 60 seconds, and afterward, thermosetting was carried out at 170° C. for 30 minutes.

Figure 8F:
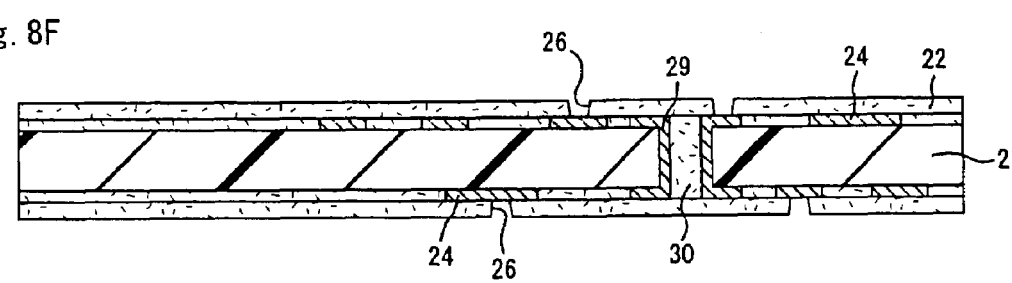

(7) Next, openings for via holes 26 having a diameter of 80 μm were formed in the insulating layers 22 using a $CO_2$ gas laser having a wavelength of 10.4 μm through a mask which was placed on the insulating layers 22 and had a thickness of 1.2 mm of through holes created therein, under such conditions that the beam had a diameter of 4.0 mm, was in a top hat mode, had a pulse width of 8.0 μsecond, and was of a one-shot type, and the diameter of through holes in the mask was 1.0 mm (see FIG. 8F).

(8) The substrate where the openings for via holes 26 were formed was immersed in a solution including 60 g/l of permanganic acid at 80° C. for 10 minutes, so that the epoxy resin particles on the surface of the insulating layers 22 dissolved and were removed, and thereby, a coarse surface (not shown) was formed on the surface of the substrate, including the inner wall surface of the openings for via holes 26.

(9) Next, the substrate after the above described process was immersed in a neutral solution (made by Shipley Company L.L.C.) and then washed with water.

Furthermore, a palladium catalyst was provided on the surface of this substrate on which a process for coarsening the surface (depth of coarseness: 3 μm) was carried out, and thus, catalyst nuclei were attached to the surface of the insulating layers 22 (including the inner wall surface of the openings for via holes 26) (not shown). That is to say, the above described substrate was immersed in a catalyst solution including palladium chloride ($PdCl_2$) and stannous chloride ($SnCl_2$) so that a palladium metal was deposited, and thus, a catalyst was provided.

Figure 9A:
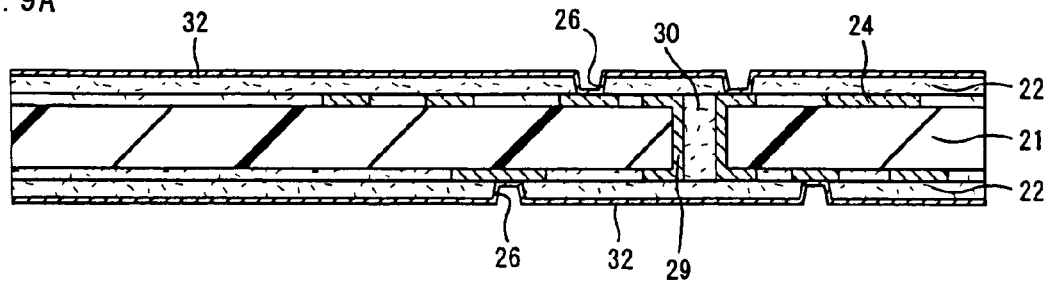
FIGS. 9A to 9D are cross-sectional views schematically illustrating part of a method for manufacturing a multilayer printed circuit board according to one embodiment of the present invention.

(10) Next, the substrate was immersed in an electroless copper plating solution having the following composition, and thin film conductor layers (electroless copper plating films) 32 having a thickness of 0.6 μm to 3.0 μm were formed on the surface of the insulating layers 22 (including the inner wall surface of the openings for via holes 26) (see FIG. 9A).

| [Electroless Plating Solution] | |
|---|---|
| $NiSO_4$ | 0.003 mol/l |
| Tartaric acid | 0.200 mol/l |
| Copper sulfate | 0.030 mol/l |
| HCHO | 0.050 mol/l |
| NaOH | 0.100 mol/l |
| a,a' -bipyridyl | 100 mg/l |
| Polyethylene glycol (PEG) | 0.10 g/l |
| [Conditions for Electroless Plating] | |
| Solution temperature of 30° C. for 40 minutes | |

Figure 9B:
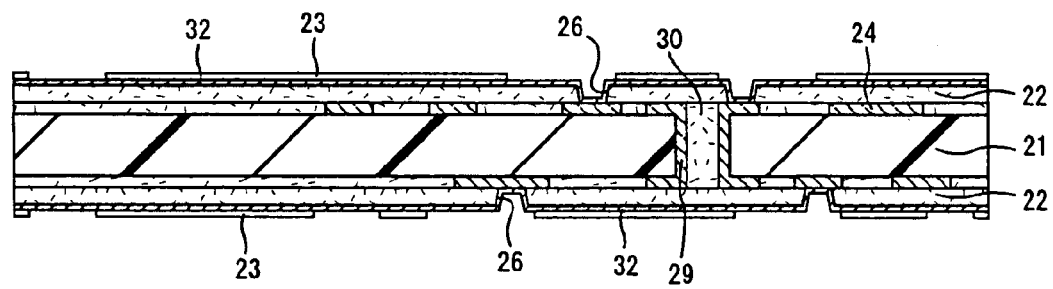

(11) Next, commercially available photosensitive dry films were pasted to the substrate on which thin film conductor layers (electroless copper plating films) 32 were formed, and the substrate was exposed to light of 100 mJ/$cm^2$ with a mask placed thereon, and then, a development process was carried out in a solution of 0.8% sodium carbonate, and thereby, plating resists 23 having a thickness of 20 μm were provided (see FIG. 9B).

Figure 9C:
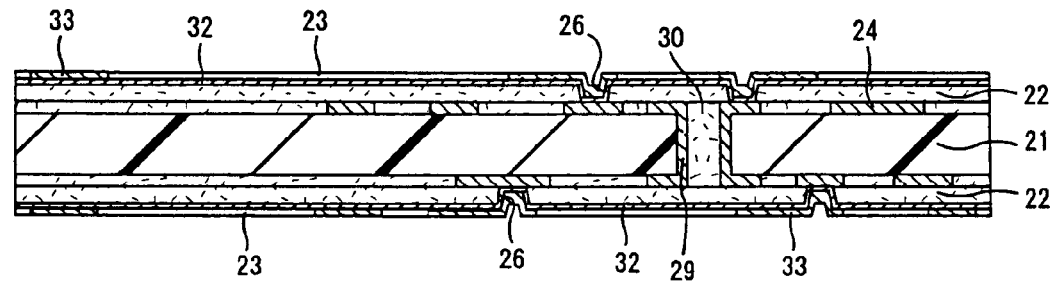

(12) Subsequently, the substrate was washed with water at 50° C., the fat was removed, the substrate was washed with water at 25° C., and afterward, further washed with sulfuric acid, electrolytic plating was carried out under the following conditions, and electrolytic copper plating films 33 having a thickness of 20 μm were formed in plating resist non-forming portions 23 (see FIG. 9C).

| [Electrolytic Plating Solution] | |
|---|---|
| Sulfuric acid | 2.24 mol/l |
| Copper sulfate | 0.26 mol/l |
| Additive | 19.5 ml/l |
| (KAPARACID HL, made by Atotech Japan K.K.) | |
| [Conditions for Electrolytic Plating] | |
| Current density | 1 A/$dm^2$ |
| Time | 65 minutes |
| Temperature | 22 ± 2° C. |

Figure 9D:
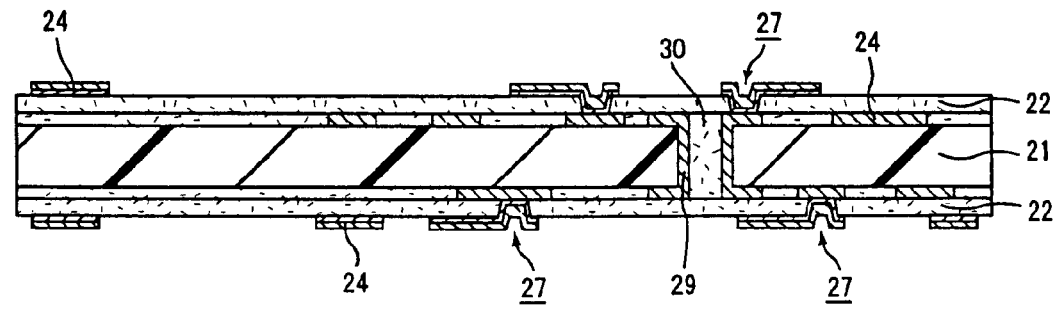

(13) Furthermore, the plating resists 23 were removed through separations (peeling) with 5% NaOH, and afterward, the thin film conductor layers beneath these plating resists 23 were dissolved and removed through an etching process using a mixed solution of sulfuric acid and hydrogen peroxide, and thus, conductor circuits 24 (including via holes 27) having a thickness of 18 μm were formed of thin film conductor layers (electroless copper plating films) 32 and electrolytic copper plating films 33 (see FIG. 9D).

Figure 10A:
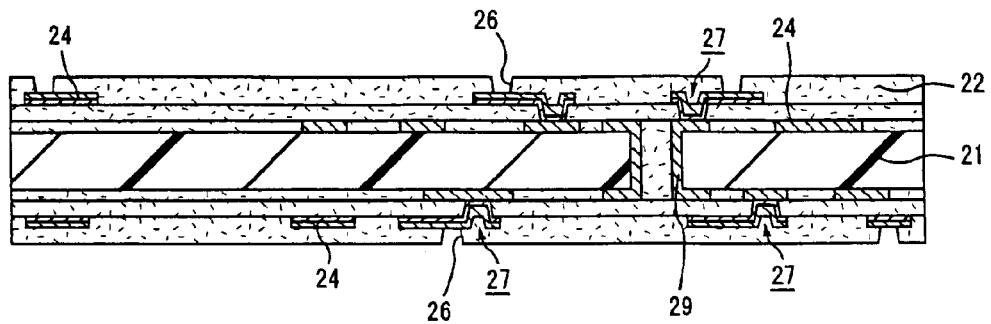
FIGS. 10A to 10D are cross-sectional views schematically illustrating part of a method for manufacturing a multilayer printed circuit board according to one embodiment of the present invention.

(14) Furthermore, the same kind of etchant as the etchant used in the above described process (5) was used to form a coarse surface (not shown) on the surface of the conductor circuits 24, and then, insulating layers 22 having openings for via holes 26 where a coarse surface (not shown) was formed on the surface were formed and layered in the same manner as in the above described processes (6) to (8) (see FIG. 10A).

(15) Next, a catalyst was added to the surface of the insulating layers 22 (including the inner wall surface of the openings for via holes 26) in accordance with the same method as used in the above described process (9), and furthermore, the substrate was immersed in the same electroless copper plating solution as the electroless plating liquid used in the above described process (10), so that thin film conductor layers (electroless copper plating films) 32 were formed on the surface of the insulating layers 22 (including the inner wall surface of the openings for via holes 26).

Figure 10B:
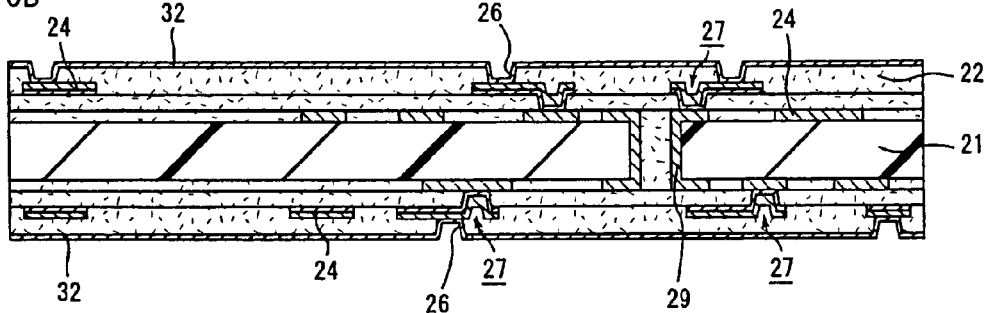

(16) Next, plating resists 23 were provided in accordance with the same method as used in the above described process (11), and furthermore, electrolytic copper plating films 33 having a thickness of 20 μm were formed in plating resists non-forming portions 23 were formed in accordance with the same method as used in the above described process (12) (see FIG. 10B).

Figure 10C:
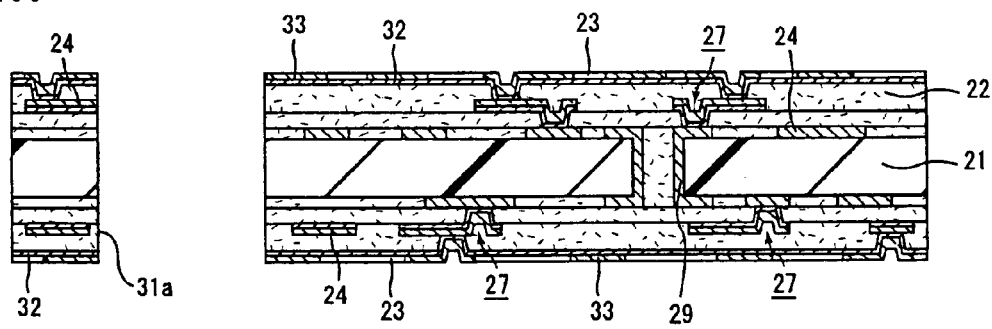

Next, a through hole for an optical path 31 which penetrates through the substrate 21, the insulating layers 22, the thin film conductor layers 32, and the electrolytic copper plating films 33 were penetrated through, a through hole for an optical path 31a was formed, whose cross-sectional shape is a rectangle with a longitude of 320 μm×a latitude of 1000 μm with semicircles with a radius of 160 μm on both sides thereof, and furthermore, a desmear process was carried out on the wall surface of the through hole for an optical path 31a (see FIG. 10C). In this case, as a result, a through hole for an optical path 31a having a collective through hole structure was formed.

Figure 10D:
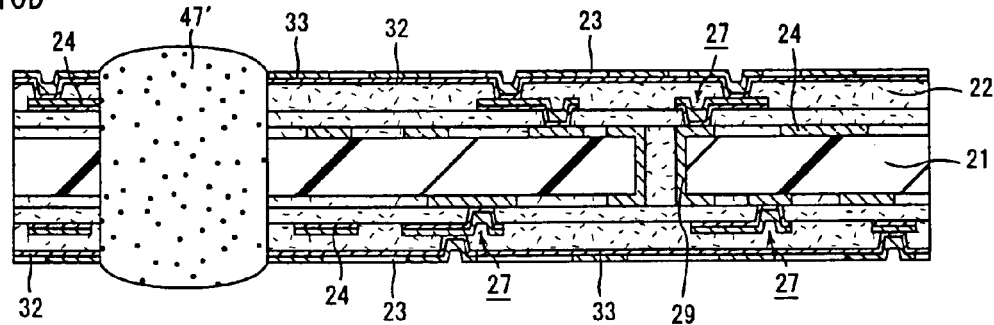
Figure 11A:
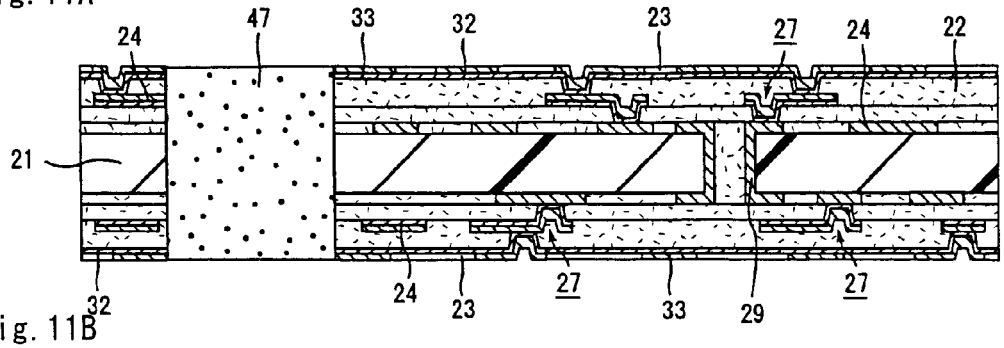
FIGS. 11A to 11D are cross-sectional views schematically illustrating part of a method for manufacturing a multilayer printed circuit board according to one embodiment of the present invention.

(17) Next, a resin was placed on a mask for filling a hole in a printer, and screen printing was carried out, and thereby, the through hole for an optical path 31a was filled in with the resin composite 47', and afterward (see FIG. 10D), a hardening process was carried out under conditions of 120° C. for one hour and 150° C. for one hour, and subsequently, the resin that protruded from the through hole for an optical path 31a was polished using polishing paper #3000, and furthermore, the surface was polished using alumina particles having a diameter of 0.05 μm so as to be flattened. Here, a polishing process was carried out so that an optical path for transmitting an optical signal comprising the resin composite 47' and electrolytic copper plating films 33 were made in the same plane (see FIG. 11A).

As the resin composite in this process, an epoxy resin (transmittance: 91%, CTE: 82 ppm) to which 40% by weight of crushed silica having a distribution in particle size from 0.1 μm to 0.8 μm was added so that the transmittance became 82%, the CTE became 42 ppm and the viscosity became 200000 cps was used.

Figure 11B:
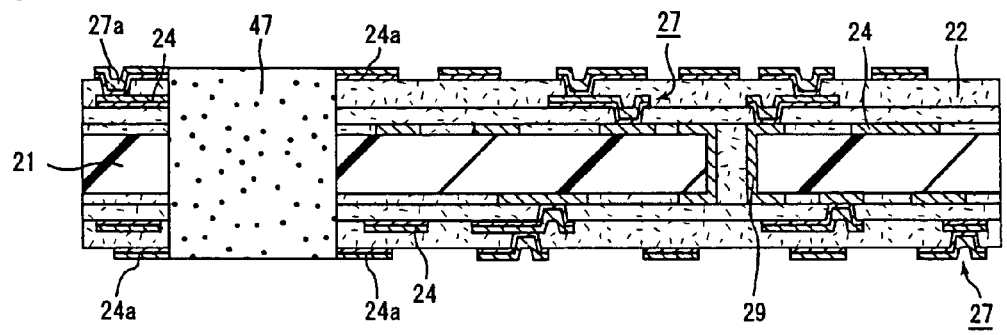

(18) Next, in the same manner as in the process (13), the plating resists 23 were peeled off, thin film conductor layers were removed beneath the plating resists 23, and outermost conductor circuits 24a was formed (see FIG. 11B).

Here, in this process, an outermost conductor circuit 24a was formed in such a position so as to make contact with the portion which protrudes from the resin composite forming an optical path for transmitting an optical signal which is to be formed in the subsequent process. The outermost conductor circuit 24a which was formed in such a position so as to make contact with this optical path for transmitting an optical signal is a dummy conductor circuit. In addition, the distance between this dummy conductor circuit and the adjacent conductor circuit where the electrode pad of the optical element was provided was 50 μm.

Furthermore, in the same manner as in the process (2), an oxidation-reduction process was carried out, and the surface of the conductor circuit 24 was converted to a coarse surface (not shown).

(19) Next, a solder resist composition prepared in accordance with the method described below was applied on one side of the substrate on which an optical path for transmitting an optical signal was formed so as to have a thickness of 30 μm, and a drying process was carried out under conditions of 70° C. for 20 minutes and 70° C. for 30 minutes, and thus, layers of a solder resist compound 34b' were formed.

The solder resist compound was prepared by mixing 46.67 g of a photosensitive oligomer (molecular weight: 4000), where 50% of the epoxy group in 60% by weight of a cresol novolac type epoxy resin (made by Nippon Kayaku Co., Ltd.) dissolved in DMDG was converted to acryl, 15.0 g of 80% by weight of a bisphenol A type epoxy resin (Epikote 1001, made by Yuka Shell Epoxy K.K.) dissolved in methyl ethyl ketone, 1.6 g of an imidazole hardening agent (trade name: 2E4MZ-CN, made by Shikoku Chemicals Corporation), 3.0 g of a multivalent acryl monomer (trade name: R604, made by Nippon Kayaku Co., Ltd.), which is a photosensitive monomer, 1.5 g of multivalent acryl monomer (trade name: DPE6A, made by Kyoeisha Chemical Co., Ltd.), which is also a photosensitive monomer, and 0.71 g of a dispersion type defoaming agent (trade name: S-65, made by San Nopco Co., Ltd.), and furthermore, adding 2 g of benzophenone (made by Kanto Chemical Co., Inc.) as an optical initiator, 0.2 g of Michler's ketone (made by Kanto Chemical Co., Inc.) as an optical sensitizer to this mixture, and adjusting the viscosity to 2.0 Pa·s at 25° C.

Here, the viscosity was measured using a B type viscometer (type DVL-B, made by Tokyo Keiki Co., Ltd.), with a rotor No. 4 in the case of 60 rpm and a rotor No. 3 in the case of 6 rpm.

Figure 11C:
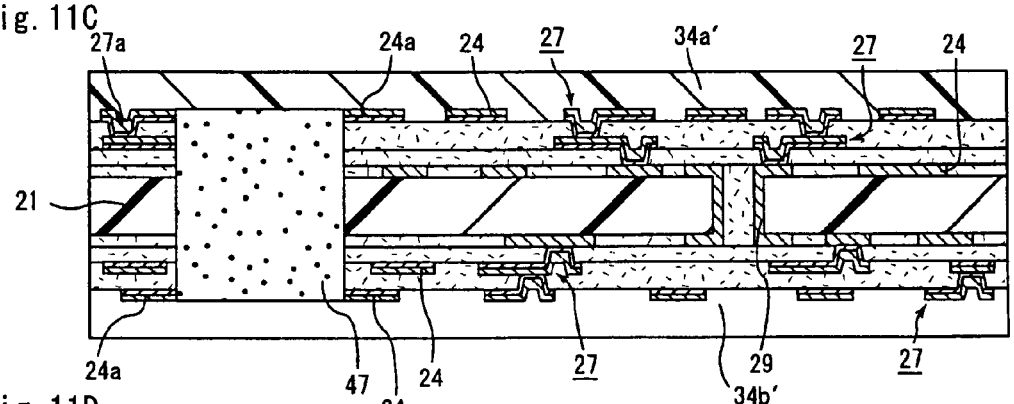

In addition, a solder resist composition (RPZ-1, made by Hitachi Chemical Co., Ltd.) was applied on the other side so as to have a thickness of 30 μm, and a drying process was carried out under conditions of 70° C. for 20 minutes and 70° C. for 30 minutes, and thus, layers of a solder resist compound 34a' were formed (see FIG. 11C).

(20) Next, a photo mask having a thickness of 5 mm where a pattern for openings for forming solder bumps was drawn was made to make contact with the layer of a solder resist layer 34b', and the substrate was exposed to ultraviolet rays of 1000 mJ/cm² and a development process was carried out using a DMTG solution, and thus, openings for forming solder bumps were created. In addition, a photo mask having a thickness of 5 mm where patterns for openings for optical paths and openings for forming solder bumps were drawn was made to make contact with the layer of a solder resist layer 34b', a process including exposure to light and development was carried out with the above described conditions, and openings for optical paths (whose cross-sectional shape is a rectangle with a longitude of 300 μm×a latitude of 1000 μm with semicircles with a radius of 160μ on both sides thereof) and openings for solder bumps were formed.

Figure 11D:
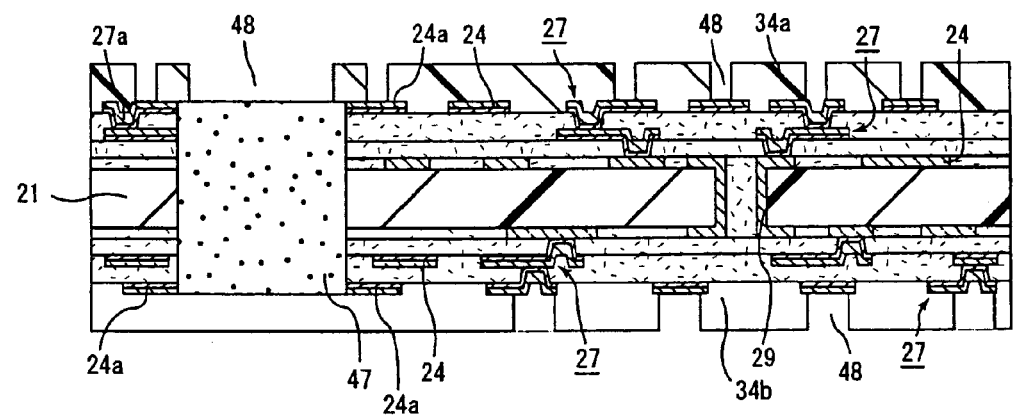

Furthermore, heat treatment was carried out under conditions of 80° C. for one hour, 100° C. for one hour, 120° C. for one hour and 150° C. for three hours, respectively, so that the layers of a solder resist composition were hardened, and thus, solder resist layers 34a and 34b having openings for a optical path and openings for forming and solder bumps 48 in a predetermined form and having a thickness of 20 μm were formed (see FIG. 11D).

(21) Next, the substrate on which the solder resist layers 34 were formed was immersed in an electroless nickel plating solution having a pH of 4.5 and including nickel chloride ($2.3 \times 10^{-1}$ mol/l), sodium hypophosphite ($2.8 \times 10^{-1}$ mol/l) and sodium citrate ($1.6 \times 10^{-1}$ mol/l) for 20 minutes, and thus, nickel plating layers having a thickness of 5 μm were formed in the openings for forming solder bumps 48. Furthermore, this substrate was immersed in an electroless gold plating solution including gold potassium cyanide ($7.6 \times 10^{-3}$ mol/l), ammonium chloride ($1.9 \times 10^{-1}$ mol/l), sodium citrate ($1.2 \times 10^{-1}$ mol/l) and sodium hypophosphite ($1.7 \times 10^{-1}$ mol/l) under conditions of 80° C. for 7.5 minutes, and thus, gold plating layers having a thickness of 0.03 μm were formed on top of the nickel plating layers for the formation of solder pads 36.

Figure 12A:
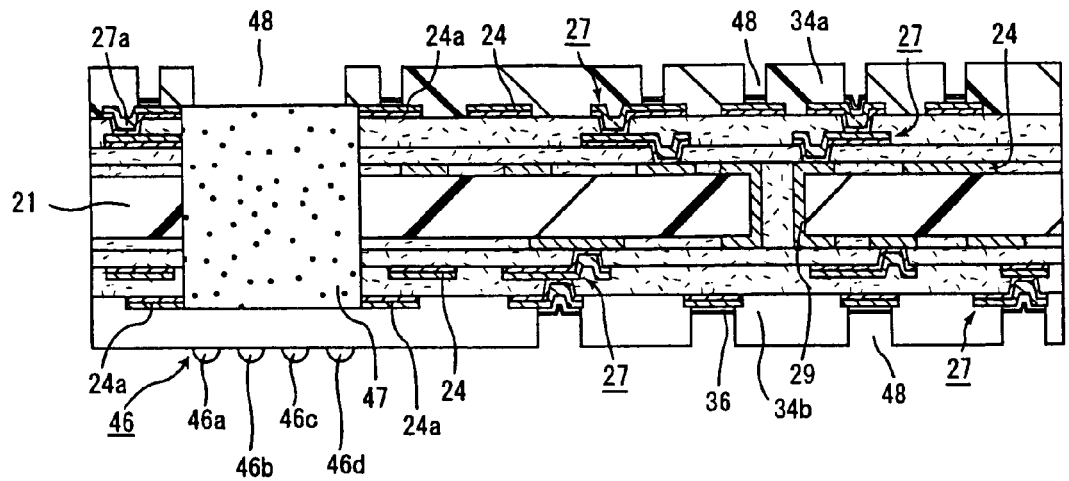
FIGS. 12A and 12B are cross-sectional views schematically illustrating part of a method for manufacturing a multilayer printed circuit board according to one embodiment of the present invention.

(22) Next, an inkjet apparatus was used to provide micro lenses 46a to 46d on top of the solder resist layer 34b in accordance with the following method (see FIG. 12A).

That is to say, a UV setting epoxy based resin (transmittance: 94%, index of refraction after hardening: 1.53) was prepared so as to have a viscosity of 20 cps at room temperature (25° C.), and afterward, this resin was prepared within the resin container of the inkjet apparatus so as to have a viscosity of 8 cps at a temperature of 40° C., and subsequently, the resin was applied in predetermined places on the solder resist layer 34 in hemispherical form with a diameter of 220 μm and a degree of sagging of 9 μm, and furthermore, irradiated with UV light (500 mW/min) so that the resin hardened, and thus, micro lenses 46a to 46d were provided.

Figure 12B:
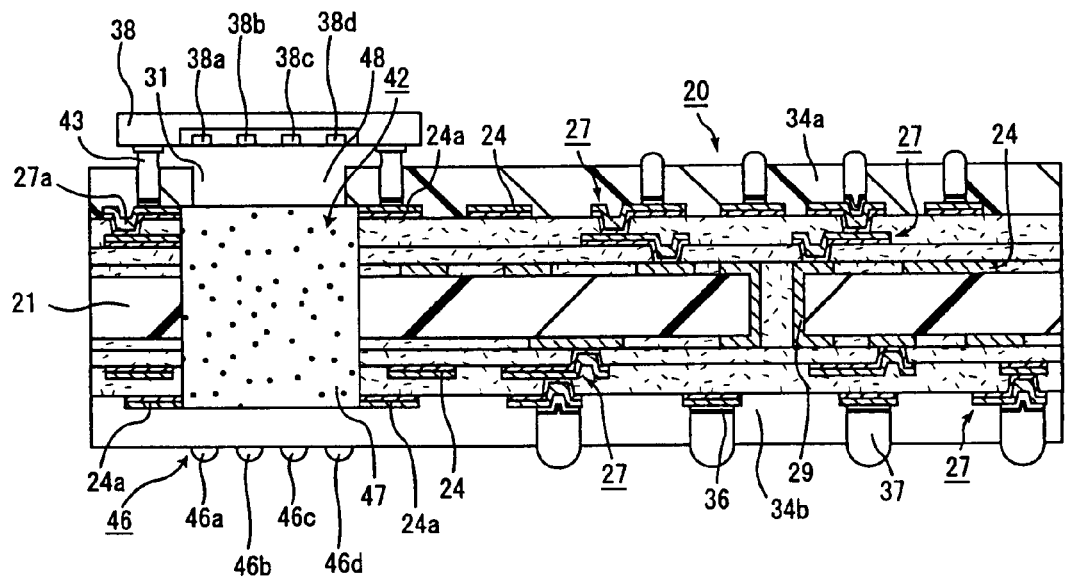

(23) Next, a solder paste was printed on the openings for forming solder bumps 47 which were formed in the solder resist layers 34, and furthermore, a light emitting element 38 was attached while positioning light emitting portions 38a to 38d, and reflow was carried out at 200° C., and thus, the light emitting element 38 was mounted, and at the same time, solder bumps 37 were formed in the openings for forming solder bumps 48 (see FIG. 12B).

Subsequently, a resin for an underfill where 60% by weight of crushed silica having a distribution in particle size from 0.1 μm to 0.8 μm was added to an epoxy based resin (transmittance: 90%, CTE: 73 ppm), so that the transmittance became 80%, the CTE became 30 ppm and the viscosity became 50 cps was prepared, and afterward, this resin for an underfill was applied around the surroundings of the light emitting element and left to penetrate into the gap between the light emitting element and the solder resist layer (50 μm), and furthermore, this resin for an underfill was hardened under conditions of 120° C. for one hour and 150° C. for two hours, and thereby, an underfill was formed. A multilayer printed circuit board functioning as a package substrate was manufactured through these processes.

Here, the transmittance of the solder resist layer 34b formed in the present example for light having a wavelength for communication (850 nm) was 96%/30 μm.

In the present comparative example, as the light emitting element 38, the VCSEL made of InGaAsP having a distance of 500 μm between electrode pads was used.

In addition, a multilayer printed circuit board has a size of 30 mm long×30 mm wide.

Example 2

A multilayer printed circuit was manufactured in the same manner as in Example 1, except that a solder resist composition layer 34b' was formed on both sides and openings for optical paths were not formed in the process (19) of Example 1.

Example 3

A multilayer printed circuit was manufactured in the same manner as in Example 1, except that in the processes (16) to (18) of Example 1, while forming outermost conductor circuits (dummy conductor circuits) and an optical path for transmitting an optical signal, outermost conductor circuits (dummy conductor circuits) and the optical path for transmitting an optical signal were formed so that the distance between the optical path for transmitting an optical signal and the dummy conductor circuits was 25 μm and the distance between this dummy electrode and adjacent conductor circuits on which the electrode pad of the optical element was provided was 25 μm.

Example 4

A multilayer printed circuit was manufactured in the same manner as in Example 3, except that a solder resist composition layer 34b' was formed on both sides in the process (19) of Example 1 cited in Example 3 and openings for optical paths were not formed in the process (20) of Example 1.

Example 5

A multilayer printed circuit board was manufactured in the same manner as in Example 1, except that in the process (16) of Example 1, when electrolytic copper plating films were formed, the thickness was set at 30 μm; in the process (18) of Example 1, after a thin film conductor layer was removed beneath a plating resist, an etching resist was formed on an outermost conductor circuit which makes contact with an optical path for transmitting an optical signal; and furthermore, by carrying out an etching process on the outermost conductor circuit other than the outermost conductor circuit which makes contact with this optical path for transmitting an optical signal, the thickness was made thin.

Here, in the multilayer printed circuit board which was manufactured in the present example, the outermost conductor circuit was formed in such a position so as to make contact with the portion which protrudes from a resin composite forming the optical path for transmitting an optical signal which is to be formed in the subsequent process. The outermost conductor circuit of this kind which was formed in such a position so as to make contact with this optical path for transmitting an optical signal is a dummy conductor circuit.

In addition, the distance between this dummy conductor circuit and the adjacent conductor circuit where the electrode pad of the optical element is provided was 50 μm.

In addition, the portion which protrudes from the above described optical path for transmitting an optical signal and the dummy conductor circuit were formed so that their height was greater than that of the conductor circuit which was formed on an outermost insulating layer.

Example 6

A multilayer printed circuit board was manufactured in the same manner as in Example 1, except that an outermost conductor circuit (dummy conductor circuit) and an optical path for transmitting an optical signal were formed by carrying out the below described processes (1) to (3) instead of the processes (16) to (18) of Example 1.

(1) After a thin film conductor layer was formed on an insulating layer after carrying out up to the process (15) of Example 1, a through hole for an optical path (the form in a plan view was a rectangle with arched corners (300 μm in the longitude×1000 μm in the latitude)) which penetrates through a substrate, insulating layers and thin film conductor layers by carrying out a drilling process was formed, and furthermore, a desmear process was carried out on the wall surface of the through hole for an optical path, resulting in the formation of the through hole for an optical path in a collective through hole structure in this case.

(2) Next, a resin was placed on a mask for filling a hole in a printer, and screen printing was carried out, and thereby, the above described recess form was filled in with the resin, and afterward, a hardening process was carried out under conditions of 120° C. for one hour and 150° C. for one hour, and subsequently, the resin that protruded from the through hole for an optical path was polished using polishing paper #3000, and furthermore, the surface was polished using alumina particles having a diameter of 0.05 μm so as to be flattened. Here, a polishing process was carried out so that an end portion of the optical path for transmitting an optical signal comprising the resin composite and the thin film conductor layer are made in the same plane.

In this process, the same resin as used in Example 1 was used.

(3) In the same manner as in the above described process (11), a plating resist was provided in a predetermined position on the thin film conductor layer, and furthermore, in the same manner as in the process (12), electrolytic copper plating films having a thickness of 20 μm were formed on the plating resist non-forming portion.

After that, in the same manner as in the process (13) of Example 1, the plating resist was peeled off, the thin film conductor layer was removed beneath the plating resist, and the outermost conductor circuit was formed.

Furthermore, in the same manner as in the process (2), an oxidation-reduction process was carried out, and the surface of the conductor circuit was roughened (not shown).

Here, in this process, an outermost conductor circuit was formed in such a position so as to make contact with the portion which protrudes from the resin composite forming an optical path for transmitting an optical signal which is to be formed in the subsequent process. The outermost conductor circuit which was formed in such a position so as to make contact with this optical path for transmitting an optical signal was a dummy conductor circuit.

In addition, the distance between this dummy conductor circuit and the adjacent conductor circuit where the electrode pad of the optical element was provided was 50 μm.

In addition, the portion which protrudes from the above described optical path for transmitting an optical signal and the dummy conductor circuit were formed so that their height was lower than that of the conductor circuit which was formed on an outermost insulating layer.

Example 7

(1) In the same manner as in the processes (1) to (15) of Example 1, conductor circuits and insulating layers were formed on both sides of the substrate, and furthermore, thin film conductor layers were formed on insulating layers.

(2) Next, in the same manner as in the process (16) of Example 1, a plating resist and electrolytic copper plating films were formed.

Next, by removing part of the insulating layers, thin film conductor layers, and electrolytic copper plating films through spot facing which were formed on one side of the substrate, the recess form (the form in a plan view was a square (one side is 15 mm)) was formed, and furthermore, a desmear process was carried out on the wall surface in recess form.

(18) Next, a resin was placed on a mask for filling a hole in a printer, and screen printing was carried out, and thereby, the above described recess form was filled in with the resin, and afterward, a hardening process was carried out under conditions of 120° C. for one hour and 150° C. for one hour, and subsequently, the resin that protruded from the recess form was polished using polishing paper #3000, and furthermore, the surface was polished using alumina particles having a diameter of 0.05 μm so as to be flattened. Here, a polishing process was carried out so that an end portion of an optical path for transmitting an optical signal comprising the resin composite and the electrolytic copper plating films are made in the same plane.

In addition, the recess form was filled in with the same resin composite as used for filling in Example 1 of the process (17).

(4) Next, in the same manner as in the process (18) of Example 1, a plating resist was peeled off, thin film conductor layers were removed beneath the plating resist, and an outermost conductor circuit was formed.

Here, in this process, an outermost conductor circuit was formed in such a position so as to make contact with the portion which protrudes from the resin composite forming an optical path for transmitting an optical signal which is to be formed in the subsequent process. This outermost conductor circuit which was formed in such a position so as to make contact with the optical path for transmitting an optical signal was a dummy conductor circuit. In addition, the dummy conductor circuit having a width of 0.1 mm was formed so as to make contact with the entirety of the periphery of the optical path for transmitting an optical signal, and the distance to the adjacent conductor circuit where solder bumps are to be formed was 0.65 mm.

(5) Next, the layer of a solder resist composition was formed in the same manner as in the process (19) of Example 1. Here, the same solder resist composition layer as the solder resist composition layer 34b' of Example 1 was formed on the side where the optical path for transmitting an optical signal was formed, and the same solder resist composition layer as the solder resist composition layer 34a' of Example 1 was formed on the opposite side.

(6) Next, in the same manner as in the process (20) of Example 1, openings for forming solder bumps were made in a solder resist composition layer 34b', and after that, a hardening process was carried out on the solder resist composition layers 34a', 34b'.

(7) Next, in the same manner as in the processes (21) to (23) of Example 1, solder pads were formed, micro lenses were provided, solder bumps were formed, and a multilayer printed circuit board was manufactured.

Here, the multilayer printed circuit board manufactured in the present example has a size of 35 mm long×35 mm wide, and in addition, on the side where a dummy conductor circuit was formed, 478 BGA pads were formed on the peripheral portion.

Example 8

A multilayer printed circuit board was manufactured in the same manner as in Example 7, except that a circuit was formed so as to make contact with the entirety of the periphery of an optical path for transmitting an optical signal having a width of 0.65 mm, and the distance from adjacent conductor circuits where solder bumps were made was set at 0.1 mm in the process (4) of Example 7.

Example 9

A multilayer printed circuit board was manufactured in the same manner as in Example 7, except that a dummy conductor circuit was formed on the periphery of an optical path for transmitting an optical signal having a distance of 0.5 mm from the side of the portion which protrudes from the optical path for transmitting an optical signal and having a width of 0.1 mm, and the distance from adjacent conductor circuits where solder bumps were made were set at 0.1 mm, in the process (4) of Example 7.

Examples 10 to 18

A multilayer printed circuit board was manufactured in the same manner as in each of Examples 1 to 9, except that the PD of a light receiving element was mounted as an optical element instead of the VCSEL of a light emitting element in each of Examples 1 to 9.

Comparative Example 1

A multilayer printed circuit board was manufactured in the same manner as in Example 1, except that the below described processes (1) to (3) were carried out instead of the processes (15) to (18) of Example 1.

(1) After carrying out up to the process (14) of Example 1, a through hole for an optical path which penetrates through a substrate and insulating layers was formed in the same manner as in the process (16) of Example 1 after forming an outermost insulating layer.

(2) Next, a through hole for an optical path was filled in with a resin composite in the same manner as in the process (17) of Example 1. Furthermore, a hardening process and a polishing process were carried out, and the optical path for transmitting an optical signal comprising the resin composite was formed.

Here, a polishing process was carried out so that an end portion of an optical path for transmitting an optical signal and the surface of an outermost insulating layer were made in the same plane.

(3) Next, a thin film conductor layer was formed in the same manner as in the process (15) of Example 1, and furthermore, a plating resist and electrolytic copper plating films were formed in the same manner as in the process (16) of Example 1.

After that, in the same manner as in the process (18) of Example 1, a plating resist was peeled off, a thin film conductor layer was removed beneath the plating resist, and an outermost conductor circuit was formed.

Here, the outermost conductor circuit (including a dummy conductor circuit) was not formed in the vicinity of the optical path for transmitting an optical signal in this process.

Comparative Example 2

A multilayer printed circuit board was manufactured in the same manner as in Example 1, except that the below described processes (1) to (3) were carried out instead of the processes (1) to (4) of Example 7.

(1) After carrying out up to the process (14) of Example 1, after an insulating layer was formed as an outermost layer, with the same method as used in the process (2) of Example 7, a recess form (the form in a plan view was a square (one side is 15 mm)) was formed by removing part of the insulating layer through spot facing, and furthermore, a desmear process was carried out on the wall surface in recess form.

(2) Next, in the same manner as in the process (3) of Example 7, a through hole for an optical path was filled in with a resin composite. Furthermore, a hardening process and a polishing process were carried out, and an optical path for transmitting an optical signal comprising the resin composite was formed.

Here, a polishing process was carried out so that an end portion of the optical path for transmitting an optical signal comprising the resin composite and the surface of an outermost insulating layer are made in the same plane.

(3) Next, in the same manner as in the process (15) of Example 1, a thin film conductor layer was formed, and furthermore, in the same manner as in the process (16) of Example 1, a plating resist and electrolytic copper plating films were formed.

After that, in the same manner as in the process (18) of Example 1, the plating resist was peeled off, the thin film conductor layer was removed beneath the plating resist, and an outermost conductor circuit was formed.

Here, in this process, the outermost conductor circuit (including a dummy conductor circuit) was not formed in the vicinity of the optical path for transmitting an optical signal.

Comparative Examples 3 and 4

In each of Comparative Examples 1 and 2, a multilayer printed circuit board was manufactured in the same manner as in Comparative Examples 1 and 2, except that the PD was mounted instead of the VCSEL as an optical element.

Example 19

A. Manufacture of Resin Film for Insulating Layer

A resin film for an insulating layer was manufactured in the same manner as in the process A in Example 1.

B. Preparation of Resin Composite for Filling Through Hole

A resin composite for filling a through hole was prepared in the same manner as in the process B in Example 1.

Figure 13A:
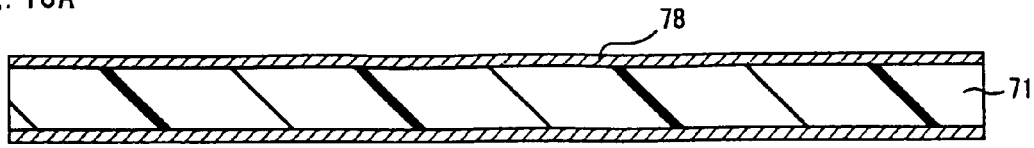
FIGS. 13A to 13F are cross-sectional views schematically illustrating part of a method for manufacturing a multilayer printed circuit board according to one embodiment of the present invention.

C. Manufacture of Substrate for Motherboard (1) A copper pasted multilayer plate where copper foils 78 having a thickness of 18 μm were laminated on both sides of an insulating substrate 71 made of a glass epoxy resin or BT (bismaleimide triazine) having a thickness of 0.8 mm was used as a starting material (see FIG. 13A). First, holes were drilled in this copper pasted multilayer plate, an electroless plating process was carried out, and etching was carried out to form a pattern, and thereby, conductor circuits 74 and through holes 79 were formed on both sides of the substrate 71.

Figure 13B:
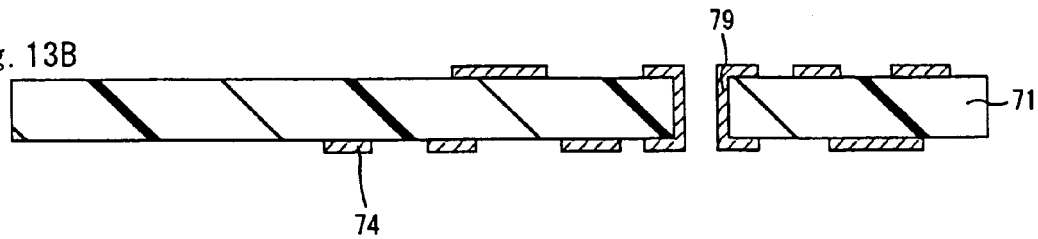

(2) The substrate where through holes 79 were created and conductor circuits 74 were formed was washed with water and dried, and afterward a blackening process was carried out using a solution including NaOH (10 g/l), $NaClO_2$ (40 g/l) and $Na_3PO_4$ (6 g/l) as a blackening bath (oxidation bath) and a reduction process was carried out using a solution including NaOH (10 g/l) and $NaBH_4$ (6 g/l) as a reduction bath so that a coarse surface (not shown) was formed on the surface of the conductor circuits 74 including through holes 79 (see FIG. 13B).

(3) A layer of a resin filler 80' was formed in accordance with the following method in the conductor circuit non-forming portion within the through holes 79 and on one side of the substrate 71 and in the outer peripheral portion of the conductor circuit 74 within 24 hours after a resin filler was prepared as described in the above B.

Figure 13C:
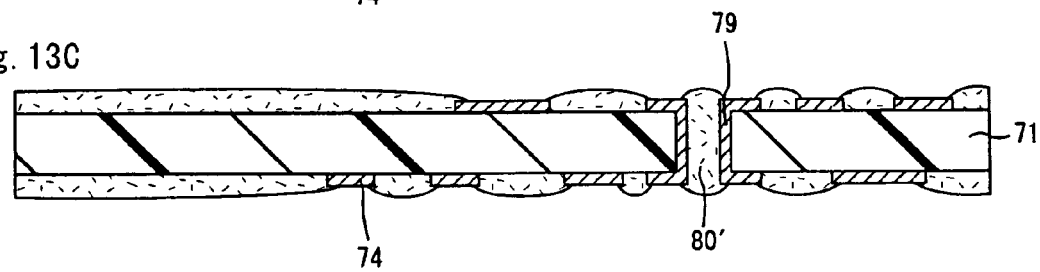

That is to say, first, the resin filler was pushed into the through holes using a squeegee, and afterward, was dried under the condition of 100° C. for 20 minutes. Next, a mask having openings in portions corresponding to the conductor circuit non-forming portion was placed on the substrate and the conductor circuit non-forming portion in recess form was filled in with a resin filler using a squeegee and were dried under the condition of 100° C. for 20 minutes, and thereby, a layer of the resin filler 80' was formed (see FIG. 13C).

(4) One side of the substrate after the above described process (3) was finished was polished through belt sander polishing using belt polishing paper of #600 (made by Sankyo Rikagaku Co., Ltd.), so that no resin filler 80' was left on the surface of the conductor circuits 74 or the land surface of the through hole 79, and then, buff polishing was carried out in order to remove scratches created as a result of the above described belt sander polishing. This polishing sequence was carried out in the same manner on the other side of the substrate.

Next, heat treatment was carried out for one hour at 100° C., three hours at 120° C., one hour at 150° C. and seven hours at 180° C., and thereby, a resin filler layer 80 was formed.

Figure 13D:
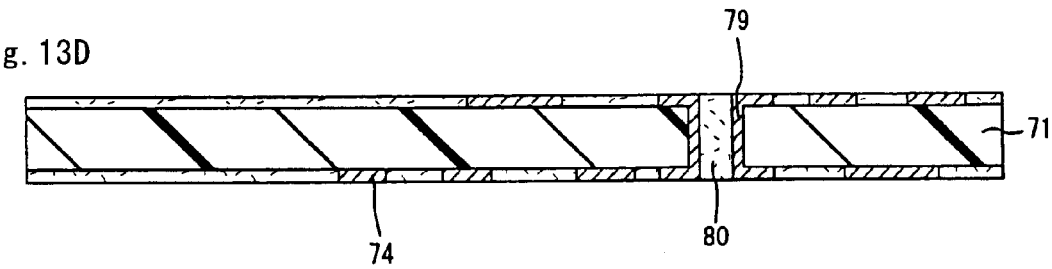

In this manner, an insulating substrate was gained, where the surface layer portion of the resin filler layer 80 formed in the through hole 79 and in conductor circuit non-forming portions, and the surface of the conductor circuits 74 are flattened, the resin filler layer 80 and the sides of the conductor circuits 74 adhered firmly to each other via the coarse surface (not shown), and the inner wall surface of the through hole 79 and the resin filler layer 80 adhered firmly to each other via the coarse surface (not shown) (see FIG. 13D). In this process, the surface of the resin filler layer 80 and the surface of the conductor circuits 74 were made in the same plane.

(5) The above described substrate was washed with water and the fat was removed with acid, and afterward, soft etching was carried out, and then, an etchant was sprayed onto both sides of the substrate so that the surface of the conductor circuit 74, and the land surface and inner wall of the through hole 79 were etched, and thereby, a coarse surface (not shown) was formed on the entirety of the surface of the conductor circuit 74. As the etchant, an etchant including 10 parts by weight of a imidazole copper (II) complex, 7 parts by weight of glycolic acid and 5 parts by weight of potassium chloride (MECetchBOND, made by MEC Co., Ltd.).

Figure 13E:
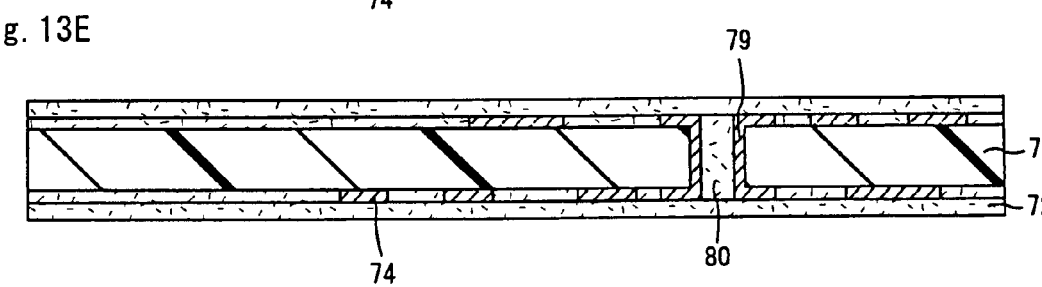

(6) Next, resin films for an insulating layer which are a little larger than the substrate prepared in the above described A were placed on the substrate and temporarily bonded thereto under pressure under such conditions that the pressure was 0.4 MPa, the temperature was 80° C. and the time for pressing was 10 seconds, and the edges were trimmed, and afterward, two other films were pasted using a vacuum laminating apparatus in accordance with the following method, and thereby, insulating layers 72 were formed (see FIG. 13E).

That is to say, resin films for an insulating layer were permanently bonded to the substrate under pressure under such conditions that the degree of vacuum was 65 Pa, the pressure was 0.4 MPa, the temperature was 80° C. and the time for pressing was 60 seconds, and afterward, thermosetting was carried out at 170° C. for 30 minutes.

Figure 13F:
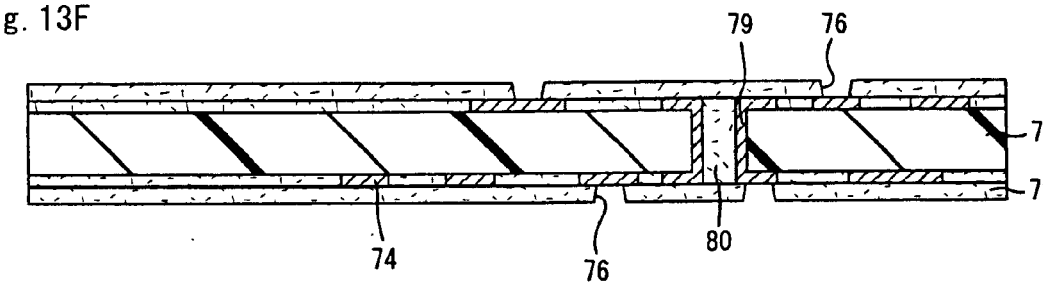

(7) Next, openings for via holes 76 having a diameter of 80 μm were created in the insulating layers 72 using a $CO_2$ gas laser having a wavelength of 10.4 μm through a mask which was placed on the insulating layers 72, had a thickness of 1.2 mm of through holes formed therein, under such conditions that the beam had a diameter of 4.0 mm, was in a top hat mode, had a pulse width of 8.0 μsecond, and was of a one-shot type, and the diameter of through holes in the mask was 1.0 mm (see FIG. 13F).

(8) The substrate where the openings for via holes 76 were created was immersed in a solution including 60 g/l of a permanganic acid at 80° C. for 10 minutes, so that the epoxy resin particles on the surface of the insulating layers 72 were dissolved and removed, and thereby, a coarse surface (not shown) was formed on the surface of the substrate, including the inner wall surface of the openings for via holes 76.

(9) Next, the substrate after the above described process was immersed in a neutral solution (made by Shipley Company L.L.C.) and then washed with water.

Furthermore, a palladium catalyst was provided on the surface of this substrate on which a process for coarsening the surface (depth of coarseness: 3 μm) was carried out, and thus, catalyst nuclei were attached to the surface of the insulating layers 72 (including the inner wall surface of the openings for via holes 76) (not shown). That is to say, the above described substrate was immersed in a catalyst solution including palladium chloride ($PdCl_2$) and stannous chloride ($SnCl_2$) so that a palladium metal was deposited, and thus, a catalyst was provided.

Figure 14A:
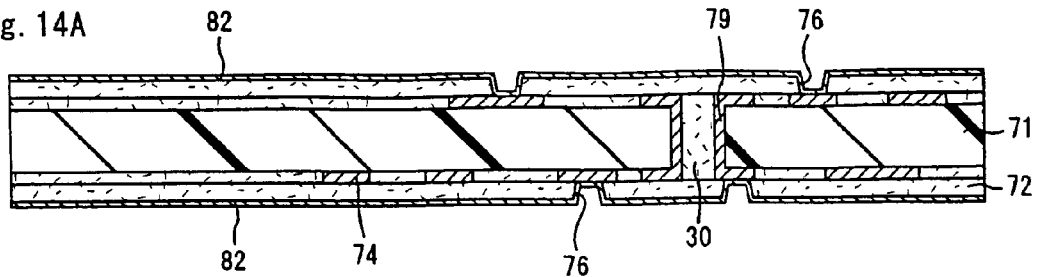
FIGS. 14A to 14D are cross-sectional views schematically illustrating part of a method for manufacturing a multilayer printed circuit board according to one embodiment of the present invention.

(10) Next, the substrate was immersed in an electroless copper plating solution having the following composition, and thin film conductor layers (electroless copper plating films) 82 having a thickness of 0.6 μm to 3.0 μm were formed on the surface of the insulating layers 72 (including the inner wall surface of the openings for via holes 76) (see FIG. 14A).

| [Electroless Plating Solution] | |
|---|---|
| $NiSO_4$ | 0.003 mol/l |
| Tartaric acid | 0.200 mol/l |
| Copper sulfate | 0.030 mol/l |
| HCHO | 0.050 mol/l |
| NaOH | 0.100 mol/l |
| a,a'-bipyridyl | 100 mg/l |
| Polyethylene glycol (PEG) | 0.10 g/l |
| [Conditions for Electroless Plating] | |
| Solution temperature of 30° C. for 40 minutes | |

Figure 14B:
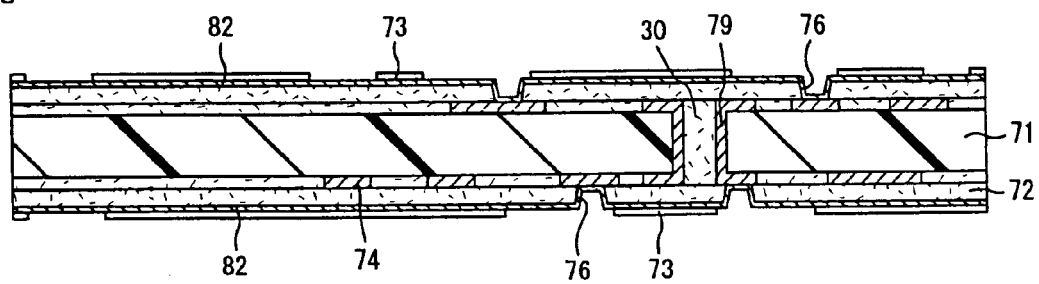

(11) Next, commercially available photosensitive dry films were pasted to the substrate on which thin film conductor layers (electroless copper plating films) 82 were formed, and the substrate was exposed to light of 100 mJ/$cm^2$ with a mask placed thereon, and then, a development process was carried out in a solution of 0.8% sodium carbonate, and thereby, plating resists 73 having a thickness of 20 μm were provided (see FIG. 14B).

Figure 14C:
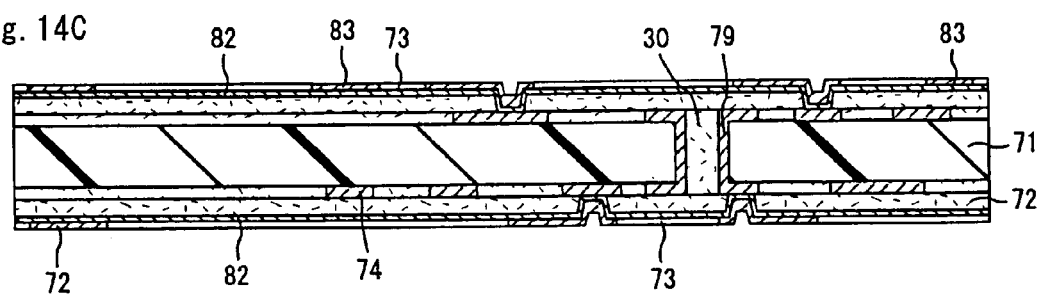

(12) Subsequently, the substrate was washed with water at 50° C., the fat was removed, the substrate was washed with water at 25° C., and afterward, further washed with sulfuric acid, electrolytic plating was carried out under the following conditions, and electrolytic copper plating films 83 having a thickness of 20 μm were formed in plating resist non-forming portions 73 were formed (see FIG. 14C).

| [Electrolytic Plating Solution] | |
|---|---|
| Sulfuric acid | 2.24 mol/l |
| Copper sulfate | 0.26 mol/l |
| Additive | 19.5 ml/l |
| (KAPARACID HL, made by Atotech Japan Co., Ltd.) | |
| [Conditions for Electrolytic Plating] | |
| Current density | 1 A/$dm^2$ |
| Time | 65 minutes |
| Temperature | 22 ± 2° C. |

Figure 14D:
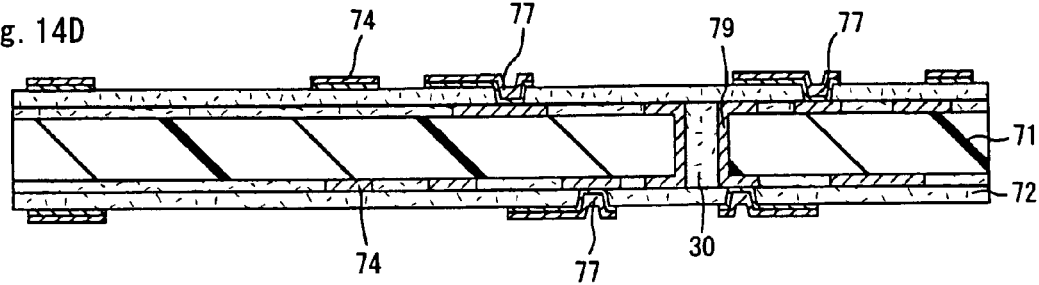

(13) Furthermore, the plating resists 73 were removed through separations (peeling) with 5% NaOH, and afterward, the thin film conductor layers beneath these plating resists 73 were dissolved and removed through an etching process using a mixed solution of sulfuric acid and hydrogen peroxide, and thus, conductor circuits 74 (including via holes 77) having a thickness of 18 μm were formed of thin film conductor layers (electroless copper plating films) 82 and electrolytic copper plating films 83 (see FIG. 14D).

(14) Furthermore, the same kind of etchant as the etchant used in the above described process (5) was used to form a coarse surface (not shown) on the surface of the conductor circuits 74, and then, insulating layers 72 having openings for via holes 76 where a coarse surface (not shown) was formed on the surface were formed and layered in the same manner as in the above described processes (6) to (8).

Figure 15A:
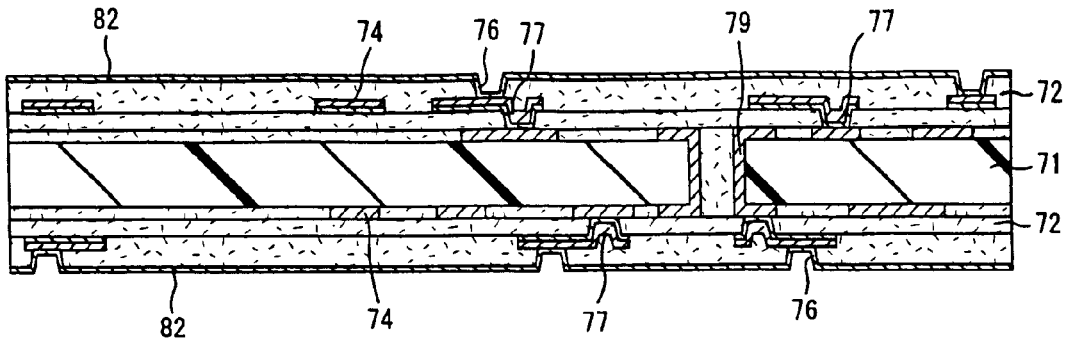
FIGS. 15A to 15D are cross-sectional views schematically illustrating part of a method for manufacturing a multilayer printed circuit board according to one embodiment of the present invention.

(15) Next, a catalyst was added to the surface of the insulating layers 72 (including the inner wall surface of the openings for via holes 76) in accordance with the same method as used in the above described process (9), and furthermore, the substrate was immersed in the same electroless copper plating solution as the electroless plating liquid used in the above described process (10), so that thin film conductor layers (electroless copper plating films) 82 were formed on the surface of the insulating layers 72 (including the inner wall surface of the openings for via holes 76) (see FIG. 15A).

(16) Next, plating resists 73 were provided in accordance with the same method as used in the above described process (11), and furthermore, electrolytic copper plating films 83 having a thickness of 20 μm were formed in plating resist non-forming portions 73 in accordance with the same method as used in the above described process (12).

Figure 15B:
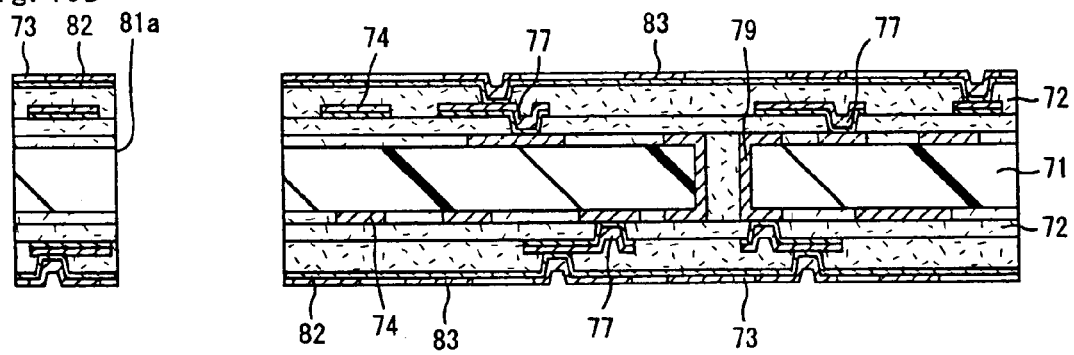

After that, through a drilling process, a through hole for an optical path 81a which penetrates through the substrate 71, the insulating layers 72, the thin film conductor layers 82, and the electrolytic copper plating films 83 were penetrated through, a through hole for an optical path 81a was formed, whose cross-sectional shape is a rectangle with a longitude of 320 μm×a latitude of 1000 μm with semicircles with a radius of 160 μm on both sides thereof, and furthermore, a desmear process was carried out on the wall surface of the through hole for an optical path 81a (see FIG. 15B). In this case, the through hole for an optical path 81a having a collective through hole structure was formed.

Figure 15C:
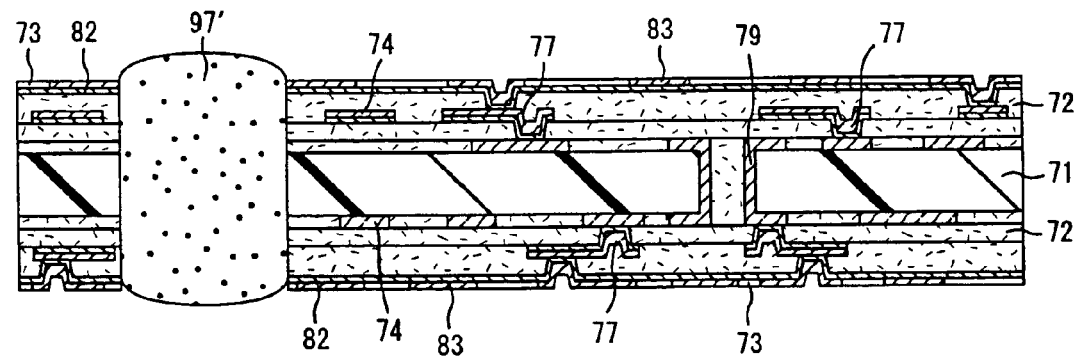
Figure 15D:
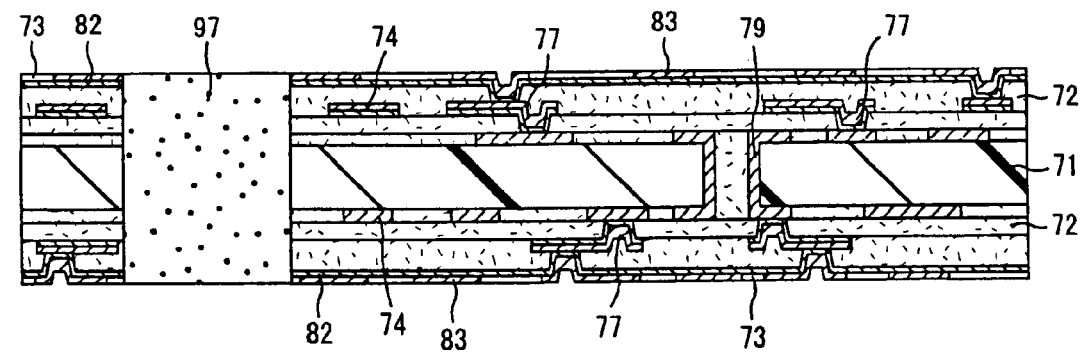

(17) Next, a resin was placed on a mask for filling a hole in a printer, and screen printing was carried out, and thereby, the through hole for an optical path 81a was filled in with the resin composite 97', and afterward (see FIG. 15C), a hardening process was carried out under conditions of 120° C. for one hour and 150° C. for one hour, and subsequently, the resin that protruded from the through hole for an optical path 81a was polished using polishing paper #3000, and furthermore, the surface was polished using alumina particles having a diameter of 0.05 μm so as to be flattened, and thus, an optical path for transmitting an optical signal comprising a resin composite 97 was formed (see FIG. 15D). Here, a polishing process was carried out so that an end portion of an optical path for transmitting an optical signal comprising the resin composite 97 and electrolytic copper plating films 83 are made in the same plane.

As the resin composite in this process, an epoxy resin (transmittance: 91%, CTE: 82 ppm) to which 40% by weight of crushed silica having a distribution in particle size from 0.1 μm to 0.8 μm was added so that the transmittance became 82%, the CTE became 42 ppm and the viscosity became 200000 cps was used.

Figure 16A:
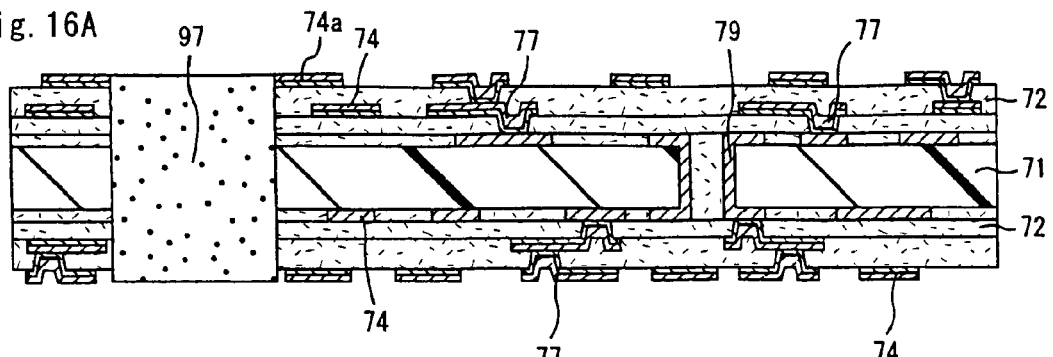
FIGS. 16A to 16D are cross-sectional views schematically illustrating part of a method for manufacturing a multilayer printed circuit board according to one embodiment of the present invention.

(18) Next, in the same manner as in the process (13), a plating resist 73 was peeled off, a thin film conductor layer beneath the plating resist 73 was removed, and an outermost conductor circuit 74a was formed (see FIG. 16A). Here, on one side of an outermost insulating layer (the side on which a package substrate is mounted), an outermost conductor circuit was formed in such a position so as to make contact with the portion which protrudes from a resin composite comprising an optical path for transmitting an optical signal. In addition, on the other side of the outermost insulating layer (the side on which an optical waveguide is mounted), an outermost conductor circuit was formed in the vicinity of the portion which protrudes from the resin composite comprising the optical path for transmitting an optical signal.

Furthermore, in the same manner as in the process (2), an oxidation-reduction process was carried out, and the surface of the conductor circuit 74 was roughened (not shown).

(19) Next, an optical waveguide 50 where four cores 51a to 51d were provided in parallel was formed in accordance with the following method on one end portion of the optical path for transmitting an optical (lower in the figure).

First, an acryl based resin (index of refraction: 1.52, transmittance: 94%, CTE: 72 ppm) was prepared as a resin for forming a core and an acryl based resin (index of refraction: 1.51, transmittance: 93%, CTE: 70 ppm) to which 25% by weight of crushed silica having a distribution in particle size from 0.1 μm to 0.8 μm was added so that the transmittance became 81%, the CTE became 53 ppm and the viscosity became 1000 cps was prepared as a resin for forming a clad.

Figure 16B:
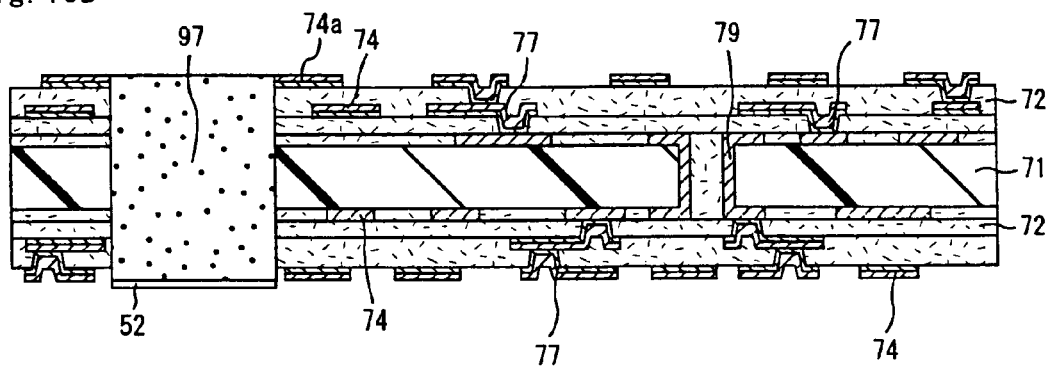

Next, the resin for forming a clad was applied to the insulating layer comprising an end portion of the through hole for an optical path using a spin coater (1000 pm/10 sec), pre-baking at 80° C. for 10 minutes, a process for exposing the resin to light of 2000 mJ and post-baking at 150° C. for one hour were carried out, and thus, a lower clad having a thickness of 50 μm was formed (see FIG. 16B). Here, a thickness of the formed lower clad formed herein is larger than a height in portions which protrude from an optical path for transmitting an optical signal, and a thickness of the lower clad means a thickness of the thickest portion.

Figure 16C:
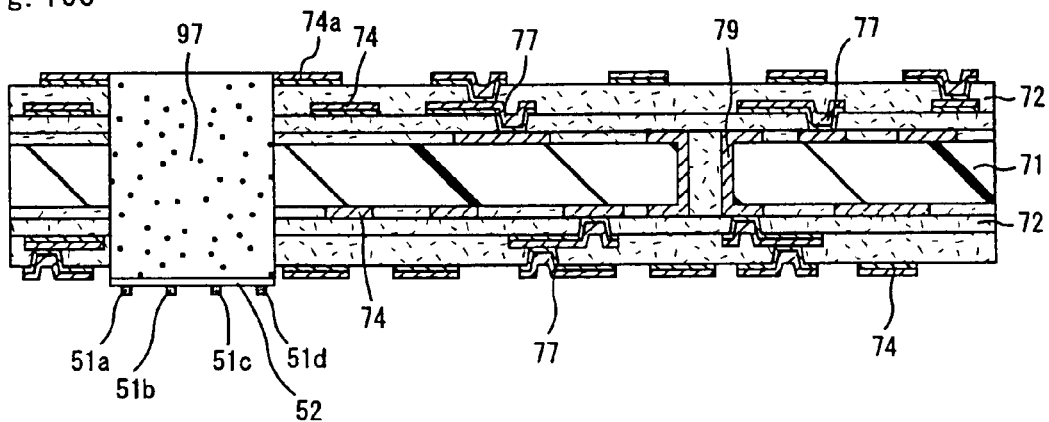

Next, the resin for forming a core was applied to the top of the lower clad 52 using a spin coater (1200 pm/10 sec) and pre-baking at 80° C. for 10 minutes, a process for exposing the resin to light of 1000 mJ and a development process for 2 minutes through dipping using 1% of TMH and post-baking at 150° C. for one hour were carried out, and thus, cores 51a to 51d with a width of 50 μm×a thickness of 50 μm were formed (see FIG. 16C).

Next, the resin for forming a clad was applied using a spin coater (1000 pm/10 sec) and pre-baking at 80° C. for 10 minutes, a process for exposing the resin to light of 2000 mJ and post-baking at 150° C. for one hour were carried out so that an upper clad having a thickness of 50 μm was formed on the cores, and thus, a optical waveguide 50 made up of the cores 51a to 51d and the clad 52 was provided.

After that, a dicing process using a blade of #3000 at 90 degrees was carried out on the two end portions of the optical waveguide 50, and thus, optical path conversion mirrors by 90 degrees were formed. Here, the transmission loss at the optical path conversion mirrors formed in this manner was 1.2 dB.

Figure 16D:
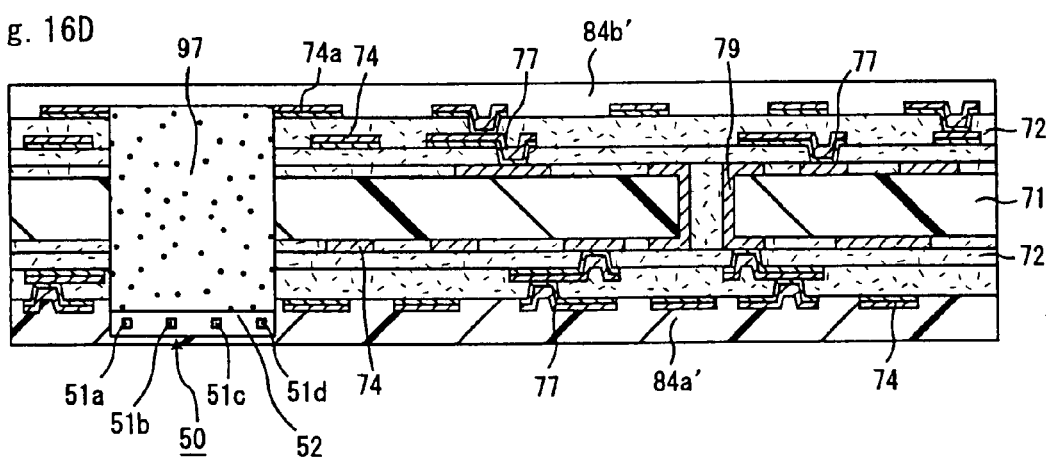

(20) Next, in the same manner as in the process (19) of Example 1, a solder resist composition layer 84a' whose transmittance is not high was formed as an outermost layer on the side where an optical waveguide was formed, and afterward, a transparent solder resist composition 84b' was formed on the end portion of the side opposite to the side where the optical waveguide was formed (see FIG. 16D).

(21) Next, a photomask having a thickness of 2.9 mm (0.11 inches) where patterns for openings for optical paths and openings for forming solder bumps were drawn was made to make contact with the layer of a transparent solder resist composition 84b' on the side opposite to the side where the optical waveguide 50 was formed and the pattern was exposed to ultraviolet rays of 1000 mJ/cm², and a development process was carried out in a DMTG solution, and thus, openings for optical paths and openings for forming and solder bumps 98 were formed.

Figure 17A:
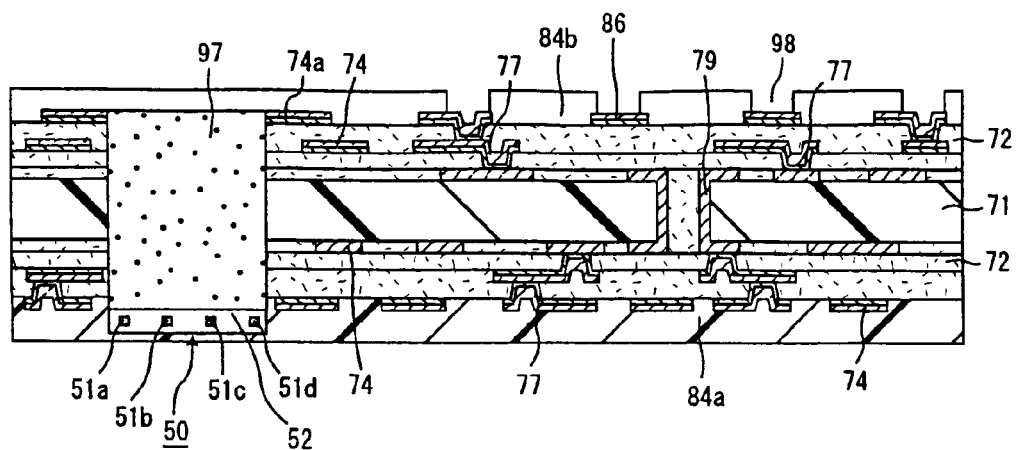
FIGS. 17A and 17B are cross-sectional views schematically illustrating part of a method for manufacturing a multilayer printed circuit board according to one embodiment of the present invention.

Furthermore, heat treatment was carried out under the conditions of 80° C. for one hour, 100° C. for one hour, 120° C. for one hour and 150° C. for three hours so that, the layer of a solder resist composition was hardened, and thus, solder resist layers 84a and 84b having openings for optical paths and openings for forming solder bumps 98 was formed (see FIG. 17A).

(22) Next, solder pads 86 were formed on the substrate on which the solder resist layer 84 was formed in accordance with the same method as in the process (21) of Example 1.

Figure 17B:
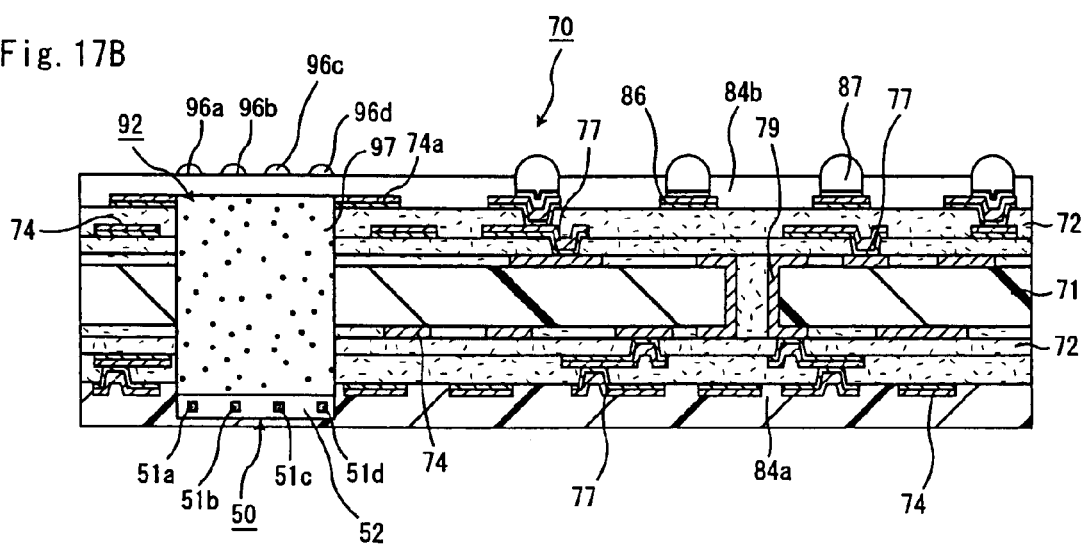

(23) Next, a solder paste was printed in the openings for forming solder bumps 98 which were created in the solder resist layer 84 so that solder bumps 87 were formed (see FIG. 17B).

Example 20

A multilayer printed circuit board was manufactured in the same manner as in Example 1, except that in the process (21) of Example 19 openings for optical paths were not formed, and furthermore, after the process (22) was carried out, a micro lens was provided on top of the solder resist layer on the side opposite to the side where the optical waveguide was formed with the same method as in the process (22) of Example 1.

Comparative Example 5

A multilayer printed circuit board was manufactured in the same manner as in Example 19, except that the processes (1) to (3) were carried out instead of the processes (15) to (18) of Example 19.

(1) After an outermost insulating layer is formed after carrying out up to the process (14) of Example 19, a through hole for an optical path which penetrates through a substrate and insulating layers is formed with the same method as used in the process (16) of Example 19.

(2) Next, the through hole for an optical path was filled in with a resin composite with the same method as used in the process (17) of Example 19, and furthermore, a hardening process and a polishing process were carried out, and the optical path for transmitting an optical signal comprising the resin composite was formed.

Here, a polishing process was carried out so that an end portion of the optical path for transmitting an optical signal and the surface of an outermost insulating layer are made in the same plane.

(3) Next, a thin film conductor layer was formed in the same manner as in the process (15) of Example 19, and furthermore, a plating resist and electrolytic copper plating films were formed in the same manner as in the process (16) of Example 19.

After that, with the same method as used in the process (18) of Example 19, the plating resist was peeled off, the thin film conductor layer beneath the plating resist was removed, and an outermost conductor circuit was formed.

Here, in this process, the outermost conductor circuit (including a dummy conductor circuit) was not formed in the vicinity of an optical path for transmitting an optical signal.

A multilayer printed circuit was evaluated in accordance with the following method according to Examples and Comparative Examples.

(1) Evaluation of Transmission Performance of Optical Signal

A multilayer printed circuit board (package substrate) according to Examples 1 and 10 was mounted on a multilayer printed circuit board (substrate for a motherboard) according to Example 19. Next, an electrical signal of 2.5 Gbps was input with a pulse generator into the test connector of the multilayer printed circuit board (Example 1) mounted with the VCSEL, light was emitted in the VCSEL via a driver IC, an optical signal was transmitted via an optical waveguide (having a length of 5 cm) which was formed in a multilayer printed circuit board (substrate for a motherboard) according to Example 20, and furthermore, this optical signal was received by the PD of the multilayer printed circuit board (Example 9) mounted with the PD, and converted into an electrical signal, an electrical signal was taken out of the test connector via an amplifying IC, it was evaluated with an oscilloscope based on openings of the I-pattern whether an optical signal was transmitted properly.

In the following, in the same manner, a multilayer printed circuit board (package substrate) according to Examples 2 and 11 was mounted on a multilayer printed circuit board (substrate for a motherboard) according to Example 20, a multilayer printed circuit board according to Examples 3 and 12 was mounted on a multilayer printed circuit board according to Example 19, a multilayer printed circuit board according to Examples 4 and 13 was mounted on a multilayer printed circuit board according to Example 19, a multilayer printed circuit board according to Examples 5 and 14 was mounted on a multilayer printed circuit board according to Example 19, a multilayer printed circuit board according to Examples 6 and 15 was mounted on a multilayer printed circuit board according to Example 19, a multilayer printed circuit board according to Examples 7 and 16 was mounted on a multilayer printed circuit board according to Example 19, a multilayer printed circuit board according to Examples 8 and 17 was mounted on a multilayer printed circuit board according to Example 19, a multilayer printed circuit board according to Examples 9 and 18 was mounted on a multilayer printed circuit board according to Example 19, a multilayer printed circuit board according to Comparative Examples 1 and 3 was mounted on a multilayer printed circuit board according to Comparative Example 5, a multilayer printed circuit board according to Comparative Examples 2 and 4 was mounted on a multilayer printed circuit board according to Comparative Example 5, and it was evaluated whether or not transmission of an optical signal between the VCSEL and the PD which were mounted on a multilayer printed circuit board (package substrate) could be carried out properly.

The results are shown in Table 1. Here, the number of evaluation samples of the transmission performance of an optical signal is 5 pieces each.

(2) Evaluation of Shape

The above described evaluation samples of the transmission performance of an optical signal was cut crosswise (to observe the cross section), and the below described (i) observation of the presence of resin residue, (ii) observation of the shape of electrodes, and (iii) evaluation of the flatness of an optical path for transmitting an optical signal were carried out. Here, these evaluations were carried out on each of the portions of a package substrate mounted with the VCSEL; of a package substrate mounted with the PD; and of a package substrate mounting side mounted with the VCSEL in a substrate for a motherboard and a package substrate mounting side mounted with the VCSEL in a substrate for a motherboard. Here, these evaluations were made such that the number of samples of the evaluation target is 20 pieces.

(i) Observation of Presence of Resin Residue

It was observed whether or not resin residue occurred in the vicinity of an end portion of an optical path for transmitting an optical signal and on a conductor circuit and a dummy conductor circuit on which an electrode pad was formed, and the occurrence rate thereof was evaluated. The results are shown in Table 1.

(ii) Observation of Shape of Electrodes

It was observed whether or not part of the conductor circuit on which an electrode pad was formed was polished, and the occurrence rate thereof was evaluated. The results are shown in Table 1.

(iii) Evaluation of Flatness of Optical Path for Transmitting Optical Signal

Figure 20A:
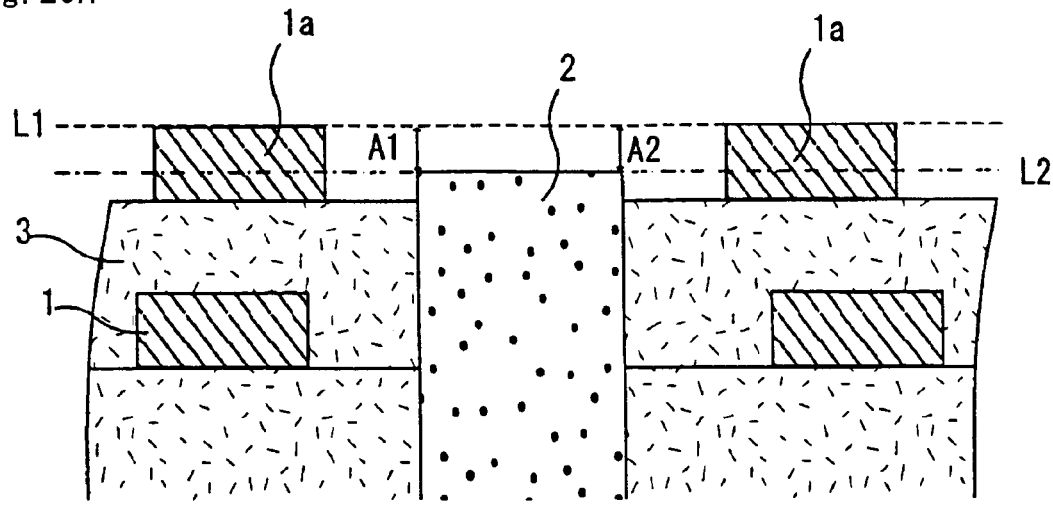
FIGS. 20A to 20B are schematic views to describe a method for evaluating a multilayer printed circuit board according to one embodiment.
Figure 20B:
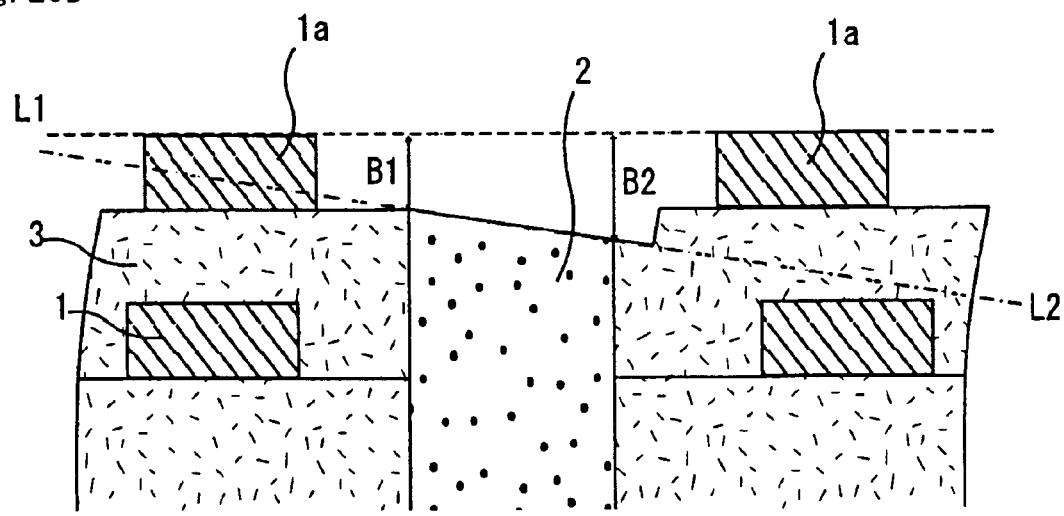

The specific evaluation method is described in reference to FIGS. 20A and 20B.

That is to say, with regard to the end face of the multilayer printed circuit board which was cut crosswise (to observe the cross section), first, the line L1 is drawn which connects the surface of an outermost conductor circuit 1a, which has been formed so that an optical path for transmitting an optical signal 2 is sandwiched, and furthermore, the line L2 is drawn which passes through the end face of the optical path for transmitting an optical signal 2.

In addition, the distance between the line L1 and the line L2 (A1 and A2 in FIG. 20A, and B1 and B2 in FIG. 20B) in both end portions of end faces of the optical path for transmitting an optical signal 2 is calculated.

After that, the absolute figure of the difference of the distance (A2−A1 and B2−B1) between both end portions is calculated.

In addition, the absolute figure of the difference of the distance (A2−A1 and B2−B1) between both end portions exceeding 2 μm is judged to be a failure to secure flatness, and the occurrence rate thereof was evaluated. The results are shown in Table 1.

Here, in the figure, 1 is a conductor circuit, and 3 is an insulating layer.

(3) Reliability Evaluation

In the same manner as in the above described (1) the evaluated transmission performance of an optical signal, a package substrate was mounted on the substrate for a motherboard, a liquid phase temperature cycle test was carried out with regard to these, and the reliability thereof was evaluated.

Specifically, one cycle consists of three minutes at −55° C. and three minutes at 125° C. were carried out in 1000 cycles. After that, on each portion of a package substrate mounted with the VCSEL, a package substrate mounted with the PD, and a package substrate mounting side mounted with the VCSEL in the substrate for a motherboard and a package substrate mounting side mounted with the PD, both the surface of a solder resist layer and the surface which was cut crosswise (to observe the cross section) were observed under a microscope, and separations (peeling) of the conductor circuit and the occurrence rate in the portions where cracks occur were evaluated, in the vicinity of an end portion of an optical path for transmitting an optical signal, in the vicinity of the conductor circuit where an electrode pad was formed, and in the vicinity of a dummy conductor circuit. The results are shown in Table 1. Here, the number of evaluation samples is 20 pieces.

part of the vicinity of the end face of the optical path for transmitting an optical signal is polished using a polishing apparatus, the parallelism of the polishing apparatus to the insulating layer cannot be adjusted sufficiently, and the polishing member was touched diagonally while polishing, sometimes resulting in inferior flatness.

Due to the above described reasons, with regard to the multilayer printed circuit board according to Comparative Examples, in the reliability test, some solder resist layers where resin residue occurred were peeled off, its flatness is bad, and cracks sometimes occurred from the portion which was polished diagonally.

In addition, the reason why an optical signal could not be transmitted normally in the evaluation of the transmission performance of an optical signal is presumably for an increase in transmission loss in the portion in the case where

TABLE 1

| Package Substrate Mounted with VCSEL | Package Substrate Mounted with PD | Substrate for Motherboard | Evaluation of Shape (%) | | | Reliability Test (%) | | Rate of Normally Transmitted Optical Signals (%) |
|---|---|---|---|---|---|---|---|---|
| | | | (i) Resin Residue | (ii) Shape of Electrodes | (iii) Flatness | Separations | Cracks | |
| Example 1 | Example 10 | Example 19 | 0 | 0 | 0 | 0 | 0 | 100 |
| Example 2 | Example 11 | Example 20 | 0 | 0 | 0 | 0 | 0 | 100 |
| Example 3 | Example 12 | Example 19 | 0 | 0 | 0 | 0 | 0 | 100 |
| Example 4 | Example 13 | Example 19 | 0 | 0 | 0 | 0 | 0 | 100 |
| Example 5 | Example 14 | Example 19 | 0 | 0 | 0 | 0 | 0 | 100 |
| Example 6 | Example 15 | Example 19 | 0 | 0 | 0 | 0 | 0 | 100 |
| Example 7 | Example 16 | Example 19 | 0 | 0 | 0 | 0 | 0 | 100 |
| Example 8 | Example 17 | Example 19 | 0 | 0 | 0 | 0 | 0 | 100 |
| Example 9 | Example 18 | Example 19 | 0 | 0 | 0 | 0 | 0 | 100 |
| Comparative Example 1 | Comparative Example 3 | Comparative Example 5 | 75 | 40 | 60 | 25 | 15 | 40 |
| Comparative Example 2 | Comparative Example 4 | Comparative Example 5 | 10 | 0 | 35 | 10 | 20 | 60 |

As is clear from the results shown in Table 1, in the case where a multilayer printed circuit board according to examples was used, a defective shape was not observed in evaluation of the shape, and no separations (peeling) and cracks occur in the reliability evaluation. In addition, an optical signal was transmitted normally, and the evaluation results thereof were good.

Meanwhile, with regard to a multilayer printed circuit board according to Comparative Examples, in a multilayer printed circuit board on which a flip chip type optical element according to Comparative Examples 1 and 2 was mounted, since the distance between conductor circuits on which an electrode pad was formed is short, when a through hole for an optical path was filled in with a resin composite, this resin composite often flows into the conductor circuit on which the electrode pad was formed. As a result, a resin residue occurs, and part of the conductor circuit was polished.

In addition, in a multilayer printed circuit board on which a wire bonding type optical element according to Comparative Examples 3 and 4 was mounted, since the distance between the conductor circuits on which an electrode pad was formed was long, although no part of the conductor circuit was polished, the polishing member was touched diagonally while polishing, and resin residue sometimes occurred.

In addition, in a multilayer printed circuit board according to Comparative Examples 1 to 5, after a through hole for an optical path was filled in with a resin composite so as to form an optical path for transmitting an optical signal, since only the end face of the optical path for transmitting an optical signal was polished diagonally.

What is claimed as new and desired to be secured by Letters Patent of the United States is:

1. A multilayer printed circuit board, comprising:
   a plurality of insulating layers including an outermost insulating layer;
   a conductor circuit layer formed on said outermost insulating layer; and
   an optical path for transmitting an optical signal and comprising a resin composite,
   wherein said optical path penetrates through said plurality of insulating layers and has an end portion protruding from a surface of the outermost insulating layer such that said end portion of said optical path has a height which is equal to or less than a height of the conductor circuit layer from the surface of the outermost insulating layer, and said end portion of said optical path and said conductor circuit layer do not make contact with each other.

2. The multilayer printed circuit board according to claim 1, wherein the conductor circuit layer has a circuit portion which is formed in a vicinity of said end portion of said optical path.

3. The multilayer printed circuit board according to claim 1, wherein a distance between said optical path and said conductor circuit layer is at least about 25 μm and at most about 50 μm.

4. The multilayer printed circuit board according to claim 1, wherein said conductor circuit layer has the height which is equal to the height of the end portion of said optical path from the surface of said outermost insulating layer.

5. The multilayer printed circuit board according to claim 1, wherein said conductor circuit layer comprises two metal layers comprising an upper metal layer and a lower metal layer.

6. The multilayer printed circuit board according to claim 5, wherein the lower layer of said two metal layers has a height equal to the height of the end portion of said optical path from the surface of said outermost insulating layer.

7. The multilayer printed circuit board according to claim 2, wherein said conductor circuit layer includes a conductor circuit formed in a vicinity of said optical path, and said conductor circuit is a part of a power supply pattern or a ground pattern.

8. The multilayer printed circuit board according to claim 1, further comprising a solder resist layer formed over the outermost insulating layer.

9. The multilayer printed circuit board according to claim 8, wherein solder resist layer with a thickness of 30 μm has about 60% or more of a transmittance of light having a wavelength for communication.

10. The multilayer printed circuit board according to claim 8, wherein said solder resist layer has an index of refraction of approximately a same as index of refraction of said resin composite.

11. The multilayer printed circuit board according to claim 8, wherein said solder resist layer has a thickness of at least about 10 μm and at most 40 μm.

12. The multilayer printed circuit board according to claim 8, wherein said conductive circuit layer includes a conductor circuit made of a dummy conductor circuit formed in a vicinity of said optical path.

13. The multilayer printed circuit board according to claim 8, wherein said conductive circuit layer has a conductive circuit formed in a vicinity of said optical path, and said conductive circuit has an electrode pad for mounting an optical element formed on said conductive circuit.

14. The multilayer printed circuit board according to claim 8, wherein said optical path has a collective through hole structure or an individual through hole structure.

15. A package substrate comprising the multilayer printed circuit board according to claim 8.

16. A substrate for a motherboard comprising the multilayer printed circuit board according to claim 8.

17. The multilayer printed circuit board according to claim 8, further comprising a micro lens provided on said solder resist layer.

18. The multilayer printed circuit board according to claim 1, further comprising a substrate upon which said plurality of insulating layer is formed and through which said optical path penetrates.

19. The multilayer printed circuit board according to claim 17, wherein said solder resist layer has an opening exposing said end portion of said optical path, and said micro lens is provided inside said opening of said solder resist layer.

20. The multilayer printed circuit board according to claim 17, wherein said micro lens with a thickness of 1 mm has about 70% or more of a transmittance of light having a wavelength for communication.

21. The multilayer printed circuit board according to claim 17, wherein said micro lens has a plurality of particles mixed into.

22. The multilayer printed circuit board according to claim 21, wherein the plurality of particles has a particle diameter which is at least about 0.01 μm and at most about 0.8 μm.

23. The multilayer printed circuit board according to claim 21, wherein the plurality of particles is mixed into said micro lens in an amount at least about 5% by weight and at most about 60% by weight.

24. The multilayer printed circuit board according to claim 17, wherein said micro lens is provided directly or by interposing an optical adhesive on said solder resist layer.

25. The multilayer printed circuit board according to claim 17, wherein said solder resist layer has a region subjected to a surface treatment where said micro lens is provided.

26. The multilayer printed circuit board according to claim 17, wherein said micro lens is provided by using a lens marker.

27. A substrate for a motherboard comprising the multilayer printed circuit board according to claim 1, and an optical waveguide formed on said end portion of said optical path.

28. The substrate for a motherboard according to claim 27, wherein said optical waveguide is an organic-based optical waveguide.

29. The substrate for a motherboard according to claim 28, wherein said organic-based optical waveguide includes a plurality of particles mixed in.

30. The substrate for a motherboard according to claim 29, wherein the plurality of particles has a particle diameter which is shorter than a communication wavelength.

31. The substrate for a motherboard according to claim 29, wherein the plurality of particles has a particle diameter which is at least about 0.01 μm and at most about 0.8 μm.

32. The substrate for a motherboard according to claim 29, wherein said plurality of particles is mixed into said organic-based optical waveguide in an amount of at least about 10% by weight and at most about 80% by weight.

33. The substrate for a motherboard according to claim 27, wherein said optical waveguide has a core portion and a clad portion, and said clad portion has a plurality of particles mixed into.

34. The substrate for a motherboard according to claim 27, further comprising an optical conversion mirror formed in said optical waveguide.

35. The substrate for a motherboard according to claim 27, wherein said optical waveguide is formed on at least a part of said outermost insulating layer.

36. The substrate for a motherboard according to claim 27, further comprising a solder resist layer formed over said outermost insulating layer, and said optical waveguide is formed on at least a part of said solder resist layer.

* * * * *